(12) United States Patent
Park et al.

(10) Patent No.: US 8,399,992 B2
(45) Date of Patent: Mar. 19, 2013

(54) PACKAGE-ON-PACKAGE TYPE SEMICONDUCTOR PACKAGE

(75) Inventors: Sung-Kyu Park, Hwaseong-si (KR); Tae-Sung Park, Cheonan-si (KR); Kyung-Man Kim, Hwaseong-si (KR); Hye-Jin Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 214 days.

(21) Appl. No.: 12/872,448

(22) Filed: Aug. 31, 2010

(65) Prior Publication Data

US 2011/0068481 A1 Mar. 24, 2011

(30) Foreign Application Priority Data

Sep. 23, 2009 (KR) ........................ 10-2009-0090058

(51) Int. Cl.
*H01L 23/48* (2006.01)
(52) U.S. Cl. ........... 257/777; 257/E23.01; 257/E23.011; 257/E23.126; 257/E25.027; 257/E21.512; 257/684; 257/698; 257/778; 257/686; 257/723; 257/724; 257/728; 257/690; 257/692; 257/696; 257/687; 257/678
(58) Field of Classification Search .................. 257/777, 257/E23.01, 684, 698, 778, E21.512, E23.011, 257/E23.126, E21.614, E25.027, 686, 685, 257/723, 724, 728, 692, 690, 691, 696, 687, 257/678
See application file for complete search history.

(56) References Cited

U.S. PATENT DOCUMENTS

| | | | |
|---|---|---|---|
| 7,067,911 B1 | 6/2006 | Lin et al. | |
| 7,345,361 B2 | 3/2008 | Mallik et al. | |
| 7,368,821 B2* | 5/2008 | Kim et al. | 257/738 |
| 7,435,619 B2 | 10/2008 | Shim et al. | |
| 7,741,707 B2* | 6/2010 | Chow et al. | 257/686 |
| 7,847,382 B2* | 12/2010 | Pagaila et al. | 257/684 |
| 7,855,443 B2* | 12/2010 | Tsai et al. | 257/686 |
| 7,932,605 B2* | 4/2011 | Imoto et al. | 257/774 |
| 7,939,924 B2* | 5/2011 | Yoo | 257/686 |
| 8,026,584 B2* | 9/2011 | Kim | 257/686 |
| 8,106,500 B2* | 1/2012 | Chow et al. | 257/686 |
| 2008/0105962 A1* | 5/2008 | Lee et al. | 257/686 |
| 2008/0211079 A1* | 9/2008 | Onodera | 257/686 |
| 2008/0246126 A1* | 10/2008 | Bowles et al. | 257/659 |
| 2009/0045497 A1* | 2/2009 | Kagaya et al. | 257/686 |

(Continued)

FOREIGN PATENT DOCUMENTS

| | | |
|---|---|---|
| JP | 10-200049 | 7/1998 |
| JP | 2003-234435 | 8/2003 |

(Continued)

*Primary Examiner* — A O Williams
(74) *Attorney, Agent, or Firm* — F. Chau & Associates, LLC

(57) ABSTRACT

Provided are a semiconductor package and a method for fabricating the same. The semiconductor package includes a lower package comprising a lower substrate, a lower semiconductor chip mounted on the lower substrate and comprising a redistribution, and a molding layer molding the lower semiconductor chip, an upper package comprising an upper substrate and an upper semiconductor chip mounted on the upper substrate, with the upper package being stacked on the lower package. The semiconductor package further includes an electrical interconnector extending from the upper substrate into the molding layer and connected to the redistribution to electrically connect the upper and lower packages to each other, and a dummy interconnector extending from the upper substrate into the molding layer to physically couple the upper and lower packages to each other.

9 Claims, 42 Drawing Sheets

U.S. PATENT DOCUMENTS

| | | | |
|---|---|---|---|
| 2009/0102037 A1* | 4/2009 | Kim | 257/686 |
| 2009/0224402 A1* | 9/2009 | Do et al. | 257/738 |
| 2010/0133704 A1* | 6/2010 | Marimuthu et al. | 257/778 |
| 2010/0213593 A1* | 8/2010 | Lee et al. | 257/686 |
| 2010/0237485 A1* | 9/2010 | Kim et al. | 257/686 |
| 2010/0283140 A1* | 11/2010 | Kim et al. | 257/686 |
| 2012/0080806 A1* | 4/2012 | Song et al. | 257/777 |

FOREIGN PATENT DOCUMENTS

| | | |
|---|---|---|
| KR | 1020070120918 | 12/2007 |
| KR | 100842915 | 6/2008 |
| KR | 842915 B1 * | 7/2008 |

* cited by examiner

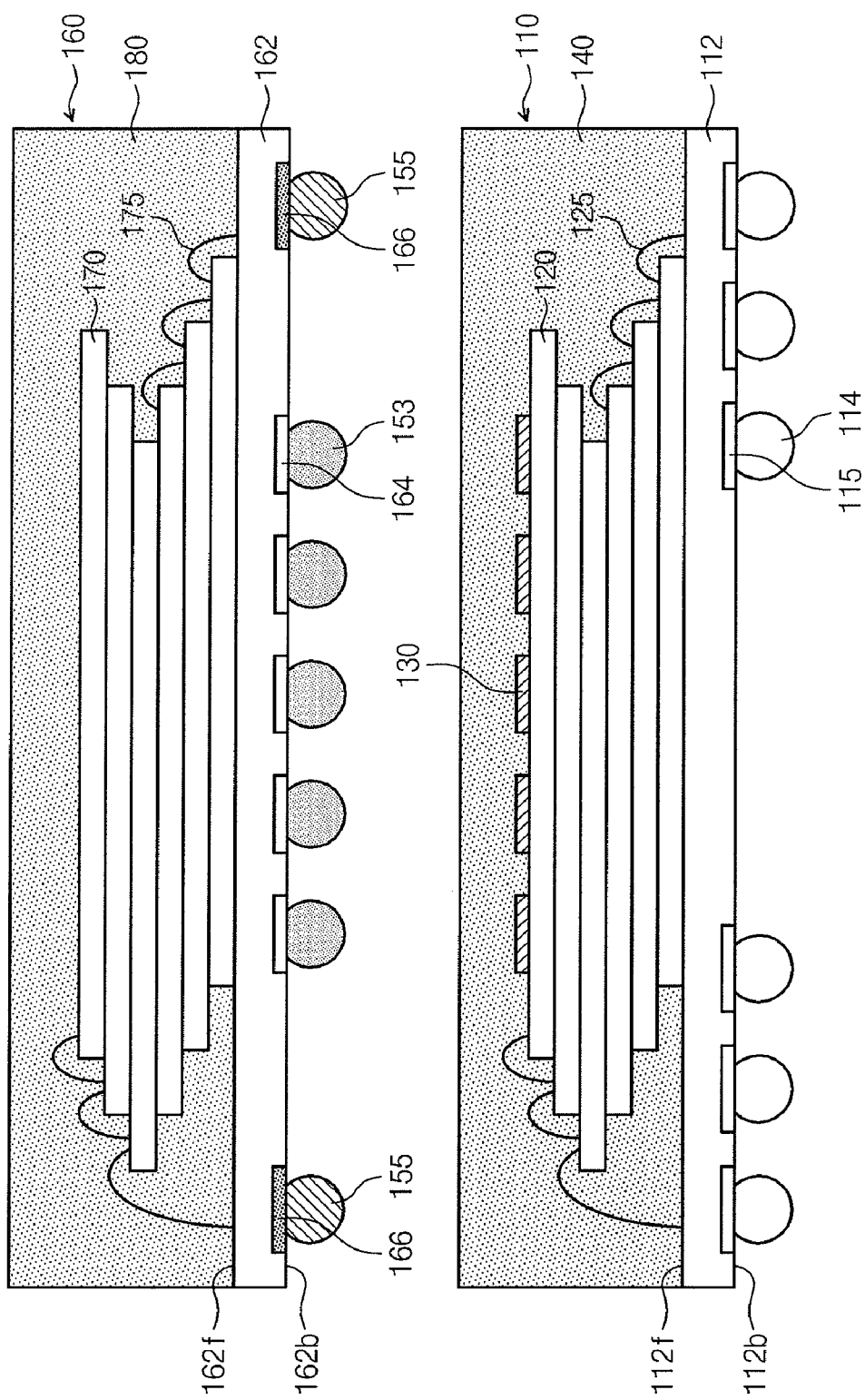

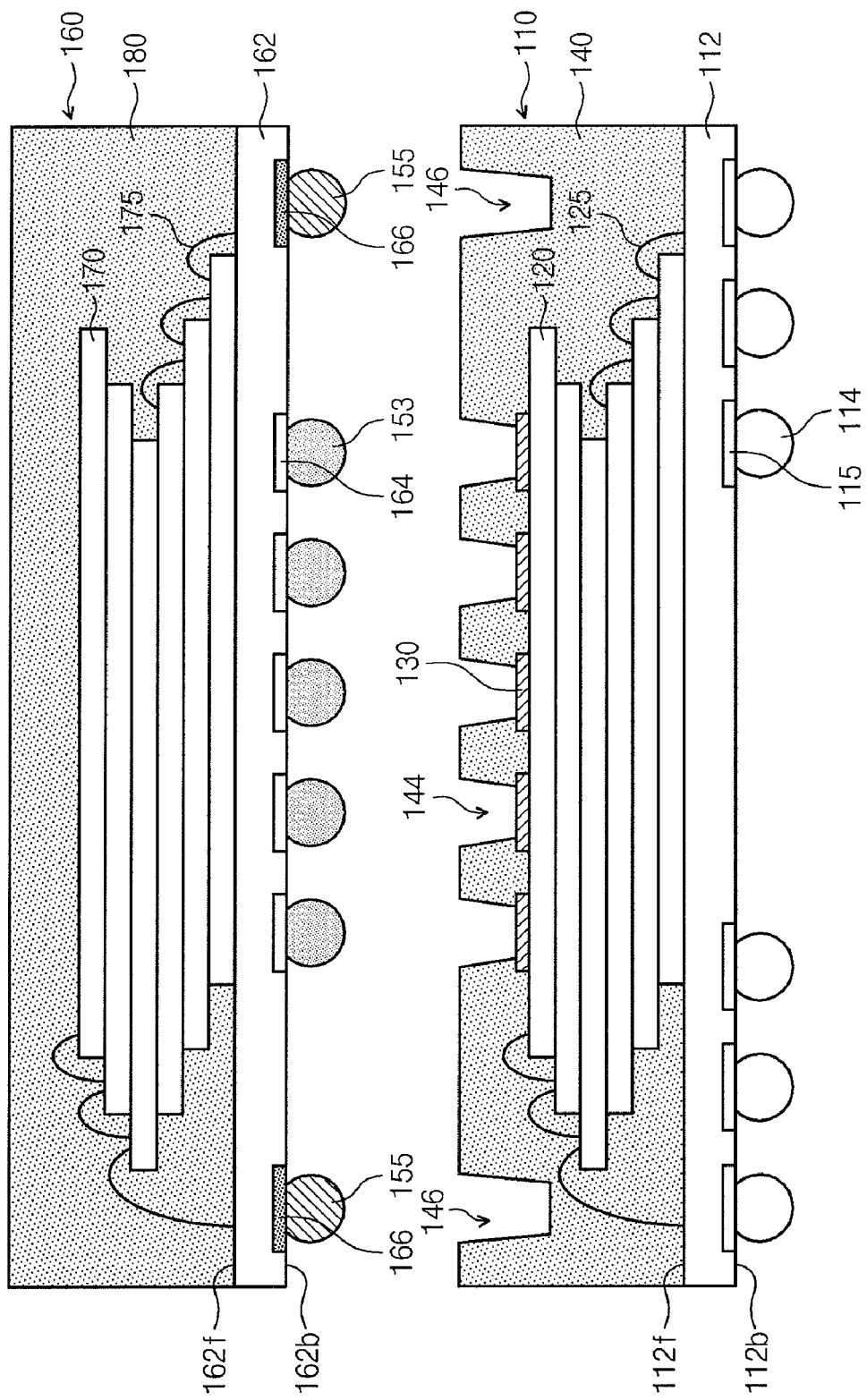

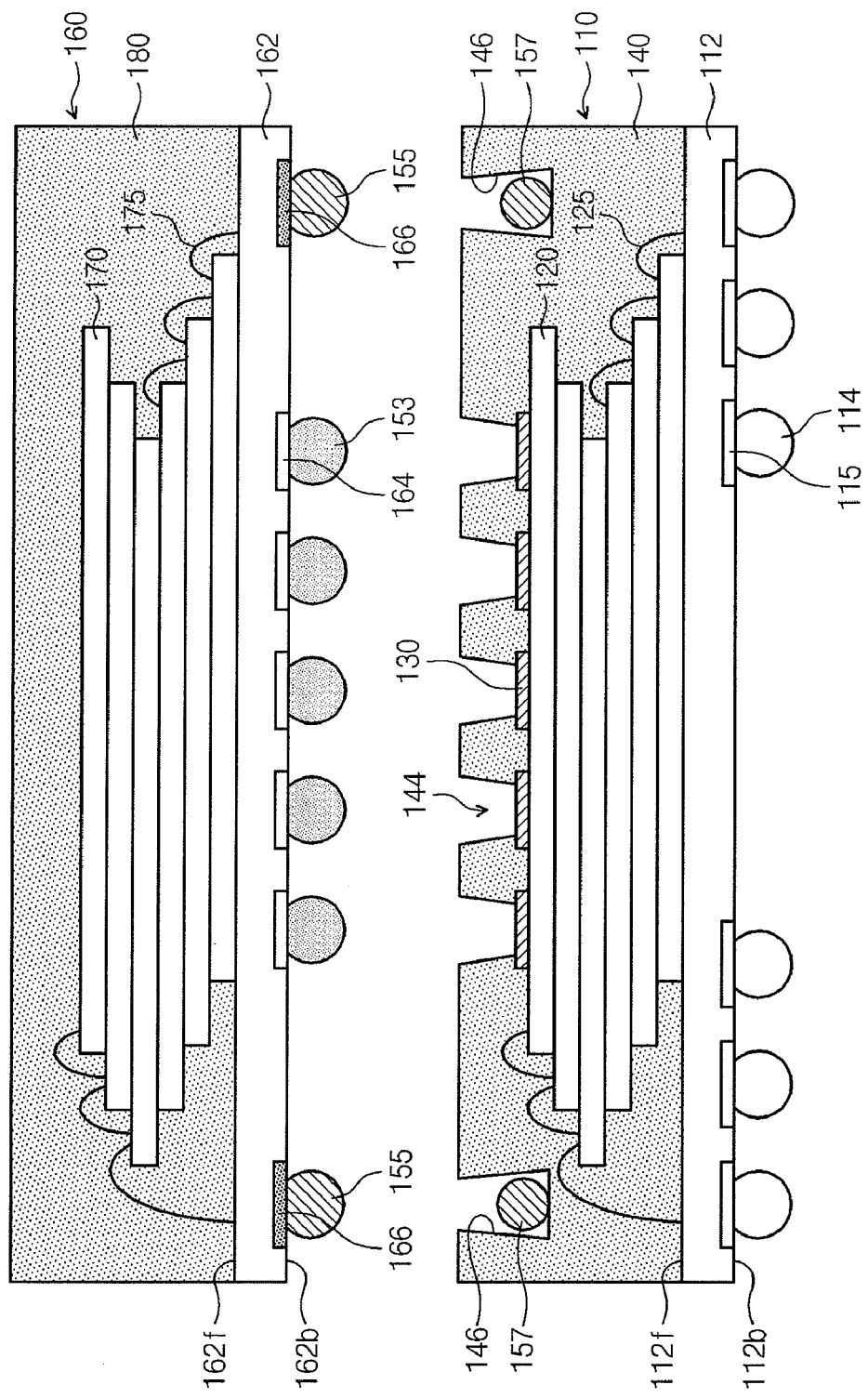

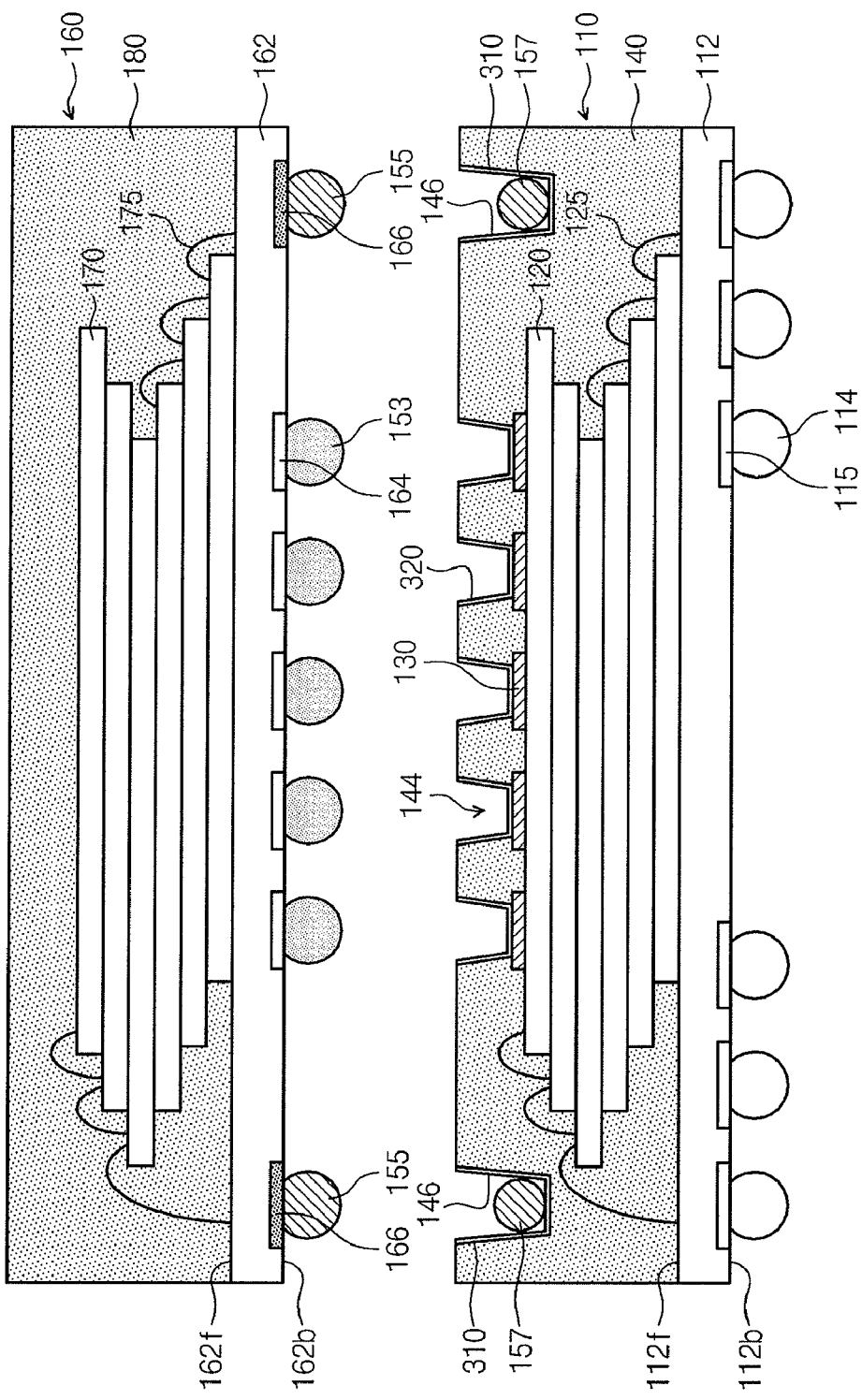

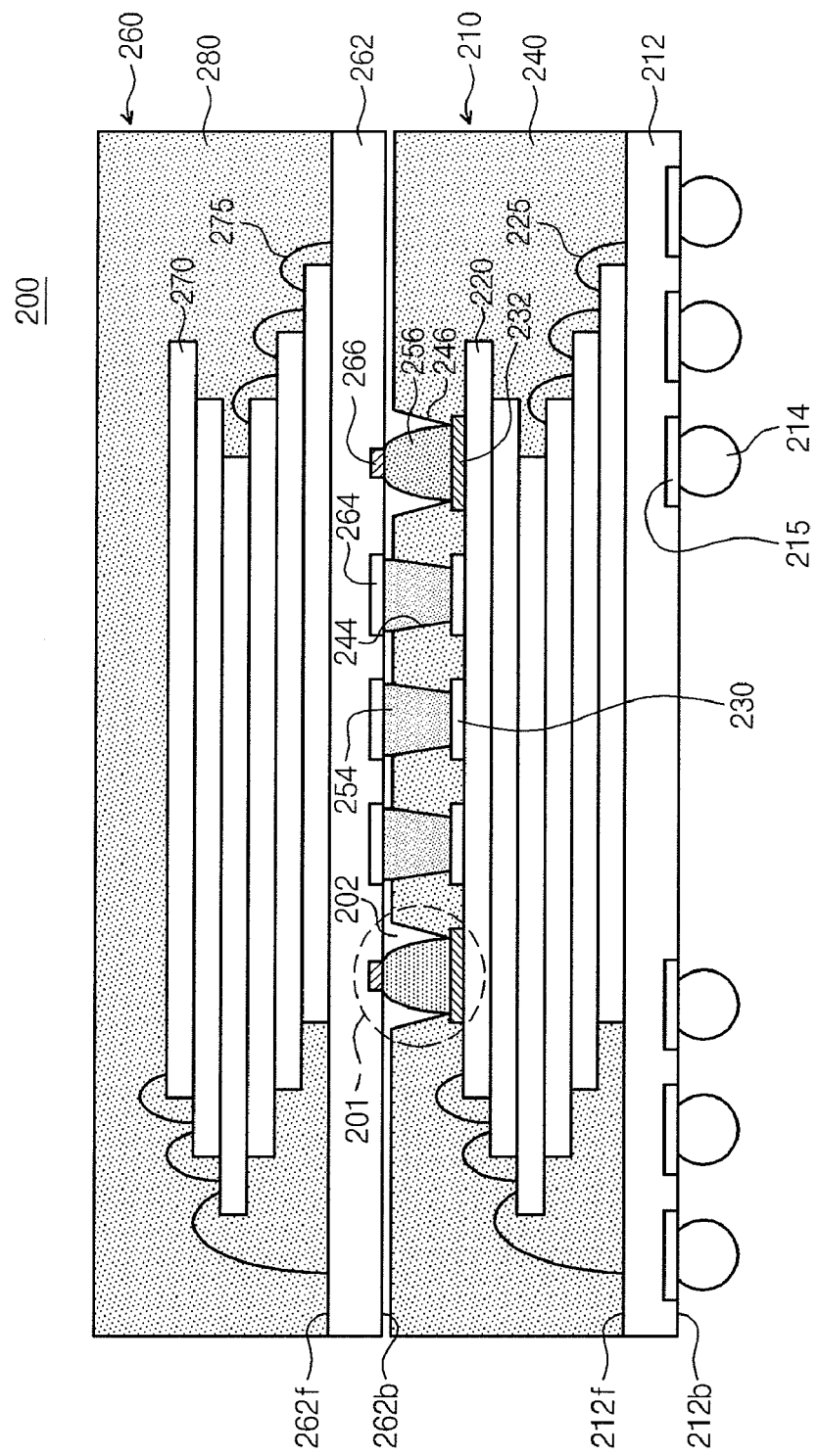

PACKAGE-ON-PACKAGE TYPE SEMICONDUCTOR PACKAGE

CROSS-REFERENCE TO RELATED APPLICATIONS

This U.S. non-provisional patent application claims priority under 35 U.S.C. §119 to Korean Patent Application No. 10-2009-0090058, filed on Sep. 23, 2009 the disclosure of which is hereby incorporated by reference herein in it's entirety.

BACKGROUND

The present disclosure herein relates to a semiconductor, and more particularly, to a package-on-package type semiconductor package and to a method for fabricating the same.

As semiconductor devices and electronics using the semiconductor devices are increasingly required to have a high capacity, compactness, and a small size, various packaging technologies with respect to the characteristics described above are being developed in the semiconductor industry. An example of these packaging technologies is a technology in which a plurality of semiconductor chips may be vertically stacked to realize a high density chip stacking. According this technology, a plurality of semiconductor chips having various functions may be stacked in a relatively small area when compared to a general package including one semiconductor chip.

However, packaging technologies in which a plurality of semiconductor chips is stacked may have a relatively lower yield than a single chip packaging technologies. Thus, to overcome this yield reduction and realize the high density chip stacking, a package-on-package (POP) technology in which a packaged memory chip is stacked on the other chip package has been proposed. Since the POP technology uses good semiconductor packages in which a test process with respect to each of the semiconductor packages is completed, a defective rate may be reduced in final products. Such POP type semiconductor packages may be used for the miniaturization of electronic portable devices and the functional diversification of mobile products. Many efforts have been tried to further improve the POP type semiconductor packages having the above-described effects.

However, there is still a need in the art for POP type semiconductor packages which have improved mechanical and/or electrical characteristics.

SUMMARY

The present disclosure may provide a package-on-package (POP) type semiconductor package that can improve mechanical and/or electrical characteristics and a method for fabricating the same.

In a POP type semiconductor package according to the inventive concept and a method for fabricating the same, upper and lower packages are electrically and physically coupled to each other through a redistribution and a mold via. Also, in a POP type semiconductor package according to the inventive concept and a method for fabricating the same, a dummy interconnector is further provided to improve physical and/or thermal stability.

Embodiments of the inventive concept may provide semiconductor packages including: a lower package including a lower substrate, a lower semiconductor chip mounted on the lower substrate and including a redistribution, and a molding layer molding the lower semiconductor chip, an upper package including an upper substrate and an upper semiconductor chip mounted on the upper substrate, with the upper package being stacked on the lower package. The semiconductor package further includes an electrical interconnector extending from the upper substrate into the molding layer and connected to the redistribution to electrically connect the upper and lower packages to each other; and a dummy interconnector extending from the upper substrate into the molding layer to physically couple the upper and lower packages to each other.

In some embodiments, the electrical interconnector may be disposed at a center portion of a bottom surface of the upper substrate, and the dummy interconnector may be disposed adjacent to an edge portion of the upper substrate when compared to the electrical interconnector.

In other embodiments, the dummy interconnector may be disposed at an edge of the molding layer corresponding to an outer region of the semiconductor chip.

In still other embodiments, the dummy interconnector may include at least one of a first dummy interconnector extending toward the lower semiconductor chip and a second dummy interconnector disposed further adjacent to an edge portion of the upper substrate when compared to the first dummy interconnector to extend toward the lower substrate in an outer region of the lower semiconductor chip.

In even other embodiments, the redistribution may include: a first redistribution connected to the electrical interconnector and electrically connected to the lower substrate and a second redistribution connected to the first dummy interconnector and electrically insulated from the lower substrate.

In yet other embodiments, the molding layer may include at least one of a mold via hole exposing the first redistribution to provide a disposition space for the electrical interconnector, a first dummy mold via hole exposing the second redistribution to provide a disposition space for the first dummy interconnector, and a second dummy mold via hole providing a disposition space for the second dummy interconnector, and the first dummy mold via hole may have an empty space, which is not filled with the first dummy interconnector.

In further embodiments, the upper substrate may include a ball land connected to the electrical interconnector on a center portion thereof and the upper substrate may include a first dummy ball land connected to the first dummy interconnector and having a size less than a size of the ball land on the edge portion thereof.

In still further embodiments, the first dummy interconnector may have a sectional area gradually increasing from an upper side connected to the first ball land to a lower side opposite to the upper side.

In even further embodiments, the upper substrate may further include a second dummy ball land connected to the second dummy interconnector and having a size equal to or less than that of the ball land on the edge portion thereof.

In yet further embodiments, the second dummy interconnector may have the same sectional area from an upper portion of the upper substrate toward a lower portion of the lower substrate or a sectional area gradually changing from the upper portion of the upper substrate toward the lower portion of the lower substrate.

In other embodiments of the inventive concept, methods for fabricating a semiconductor package include: providing a lower package including a molding layer molding a lower semiconductor chip on a lower substrate on which the lower semiconductor chip is mounted, providing an upper package including an upper substrate on which an upper semiconductor chip is mounted on the lower package, forming an electrical interconnector extending from the upper substrate into the molding layer to electrically connect the upper and lower packages and forming a dummy interconnector extending from the upper substrate into the molding layer to physically connect the upper and lower packages.

In some embodiments, the providing of the lower package may include: forming a redistribution on the lower semiconductor chip, forming a via hole exposing the redistribution on a center portion of the molding layer, and forming a dummy mold via hole on an edge portion of the molding layer corresponding to an outer region of the lower semiconductor chip. The providing of the upper package may include: attaching a solder ball vertically aligned with the mold via hole on a center portion of the upper package and attaching a dummy solder ball vertically aligned with the dummy mold via hole on an edge portion of a bottom surface of the upper substrate.

In other embodiments, the forming of the electrical interconnector may include expanding the solder ball into the mold via hole to form a mold via connected to the redistribution and the forming of the dummy interconnector may include expanding the dummy solder ball into the dummy mold via hole to form a dummy mold via.

In still other embodiments, the forming of the dummy interconnector may further include providing a filler coupled to the dummy solder ball to form the dummy mold via into the dummy mold via hole.

In even other embodiments, the providing of the lower package may include: forming a redistribution on the lower semiconductor chip, forming a mold via hole exposing the redistribution at the center portion of the molding layer, forming a dummy mold via hole at the edge portion of the molding layer corresponding to the outer region of the lower semiconductor chip, providing a conductive material in the mold via hole and providing a conductive or non-conductive material in the dummy mold via hole.

In yet other embodiments, the providing of the lower package may include: forming a redistribution and a dummy redistribution on the lower semiconductor chip and forming a mold via hole exposing the redistribution at a center portion of the molding layer and a first dummy mold via hole exposing the dummy redistribution and having a size greater than a size of the mold via hole. The providing of the upper package may include attaching a solder ball vertically aligned with the mold via hole to a center portion of a bottom surface of the upper substrate and a first dummy solder ball vertically aligned with the dummy mold via hole and having the same volume as the solder ball.

In further embodiments, the providing of the upper package may include forming a ball land attached to the solder ball on the bottom surface of the upper substrate and a first dummy ball land attached to the solder ball and having a size less than a size of the ball land.

In still further embodiments, the forming of the electrical interconnector may include expanding the solder ball into the mold via hole to form a mold via connected to the redistribution and the forming of the dummy interconnector may include expanding the first dummy solder ball into the first dummy mold via hole to form a first dummy mold via connected to the dummy redistribution. The first dummy solder ball being not fully fill the first dummy mold via hole.

In even further embodiments, the providing of the lower package may further include forming a second dummy mold via hole at an edge portion of the molding layer corresponding to an outer region of the lower semiconductor chip, and the providing of the upper package may further include attaching a second dummy solder ball vertically aligned with the second dummy mold via hole to an edge portion of the upper substrate.

In yet further embodiments, the forming of the dummy interconnector may further include expanding the second dummy solder ball into the second dummy mold via hole to form a second dummy mold via.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 2A to 2G are sectional views illustrating a method for fabricating a semiconductor package according to an embodiment of the inventive concept;

FIGS. 3A and 3B are sectional views illustrating a method for fabricating a semiconductor package according to a modified embodiment of the inventive concept;

FIGS. 4A and 4B are sectional views illustrating a method for fabricating a semiconductor package according to a modified embodiment of the inventive concept;

FIGS. 11A to 11C are sectional views illustrating a method for fabricating a semiconductor package according to a modified embodiment of the inventive concept;

DETAILED DESCRIPTION OF THE EMBODIMENTS

Figure 1A:
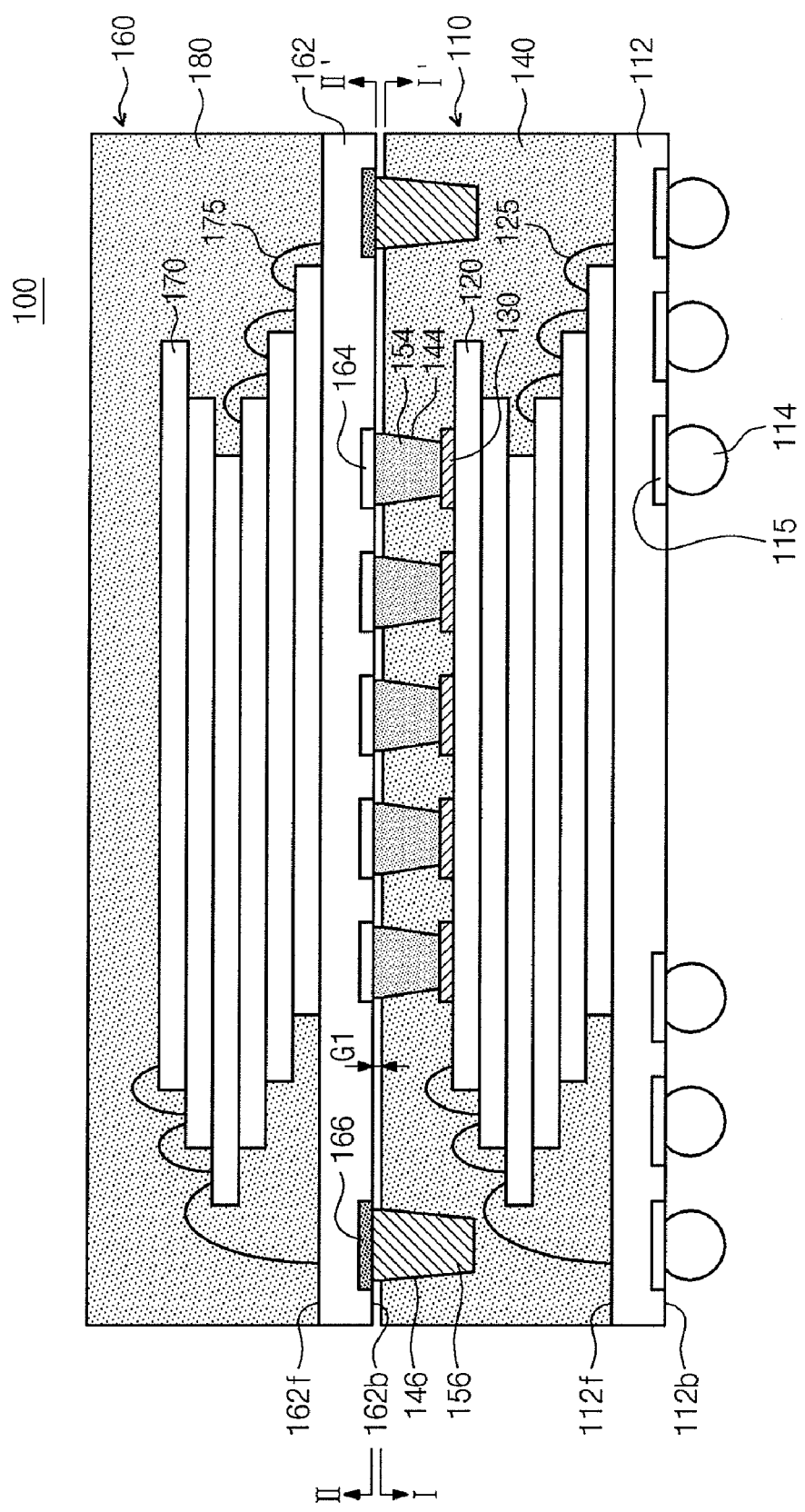
FIG. 1A is a sectional view of a semiconductor package according to an embodiment of the inventive concept.

Hereinafter, a package-on-package type semiconductor package and a method for fabricating the same will be described with reference to accompanying drawings. Benefits of the present invention in comparison with the related art will be clarified through the Detailed Description of Preferred Embodiments and the Claims with reference to the accompanying drawings. In particular, the present invention is well pointed out and clearly claimed in the Claims. The present invention, however, may be best appreciated by referring to the following Detailed Description of Preferred Embodiments with reference to the accompanying drawings. In the drawings, like reference numerals refer to like elements throughout.

(Example of Device)

Figure 1B:
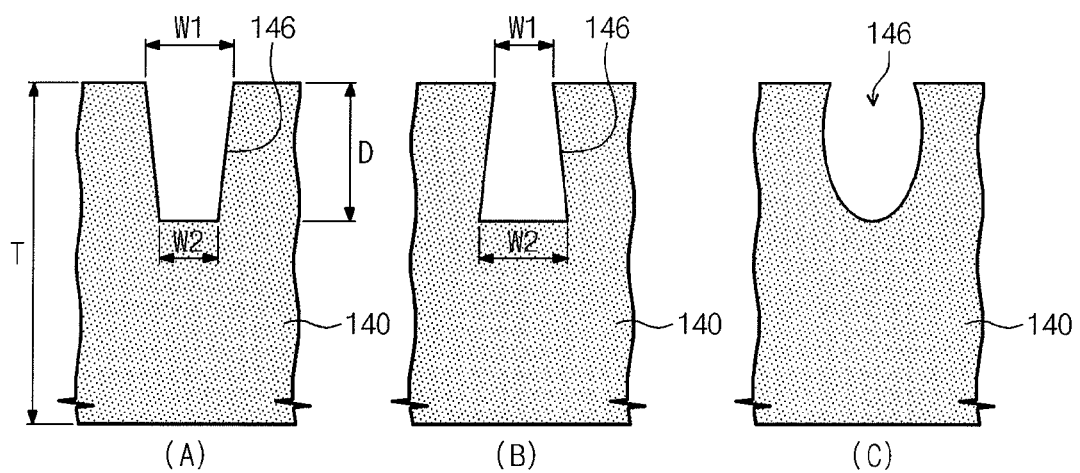
FIG. 1B is an enlarged sectional view illustrating a portion of FIG. 1A.
Figure 1C:
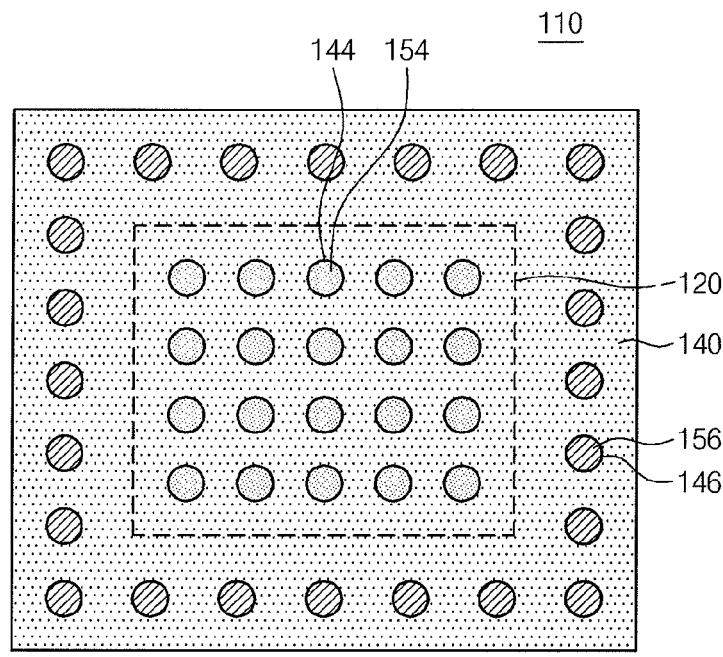
FIG. 1C is a plan view taken along line I-I' of FIG. 1A.
Figure 1D:
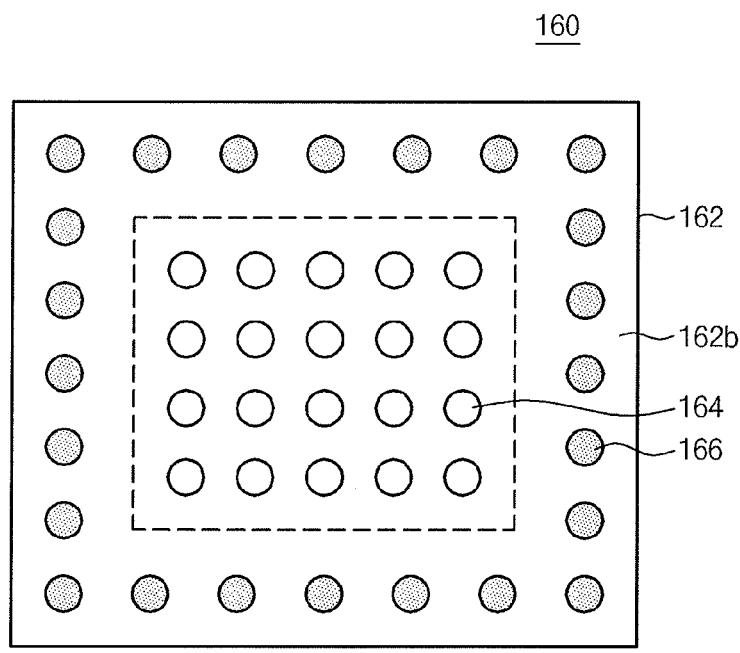
FIG. 1D is a plan view taken along line II-II' of FIG. 1A.

FIG. 1A is a sectional view of a semiconductor package according to an embodiment of the inventive concept, and FIG. 1B is an enlarged sectional view illustrating a portion of FIG. 1A. FIG. 1C is a plan view taken along line I-I' of FIG. 1A, and FIG. 1D is a plan view taken along line II-II' of FIG. 1A.

Referring to FIG. 1A, a semiconductor package 100 according to this embodiment may be a package-on-package (POP) type package in which an upper package 160 is stacked on a lower package 110, and the upper and lower packages 160 and 110 are electrically connected to each other. At least one lower semiconductor chip 120 may be mounted on a lower package substrate 112 to form the lower package 110. Similarly, at least one upper semiconductor chip 170 may be mounted on an upper package substrate 162 to form the upper package 160. The lower package 110 and the upper package 160 may be electrically connected to each other through a redistribution 130 and an electrical interconnector 154. The lower package 110 and the upper package 160 may be spaced a predetermined distance (G1>0) from each other or closely attached (G1=0) to each other. At least one of the lower package substrate 112 and the upper package substrate 162 may be a printed circuit board (PCB).

For example, the lower package 110 may include the lower package substrate 112, the plurality of lower semiconductor chips 120 mounted on a top surface 112f of the lower package substrate 112, and a lower molding layer 140 molding the plurality of lower semiconductor chips 120. Each of the lower semiconductor chips 120 may be one of a memory device and a logic device. Alternatively, some of the lower semiconductor chips 120 may be the memory devices, and the others of the lower semiconductor chips 120 may be the logic devices. The lower semiconductor chips 120 may be stacked with dielectric layers therebetween. The lower semiconductor chips 120 may be vertically stacked with each other in, for example, a zigzag shape or an aligned shape. The lower semiconductor chips 120 may be electrically connected to each other through a plurality of bonding wires 125, and/or the lower semiconductor chips 120 and the lower package substrate 112 may be electrically connected to each other through the plurality of bonding wires 125. For example, a plurality of redistributions 130 may be disposed on the uppermost lower semiconductor chip 120. The redistributions 130 may be electrically connected to the lower semiconductor chips 120 and/or the lower package substrate 112 through the bonding wires 125. The lower molding layer 140 may be disposed on the top surface 112f of the lower package substrate 112 to cover the lower semiconductor chips 120. The lower molding layer 140 may include a plurality of mold via holes 144 exposing the redistributions 130. A plurality of external terminals 114 such as, for example, solder balls electrically connecting the semiconductor package 100 to an external device may be further attached to a bottom surface 112b of the lower package substrate 112. A plurality of ball lands 115 connected to the external terminals 114 may be disposed on the bottom surface 112b of the lower package substrate 112. Although not shown, bonding pads connected to the bonding wires 125 may be disposed on the top surface 112f of the lower package substrate 112 and the lower semiconductor chips 120.

Similarly, the upper package 160 may include the upper package substrate 162 and the plurality of upper semiconductor chips 170 mounted on a top surface 162f of the upper package substrate 162. The upper package 160 may further include an upper molding layer 180 molding the upper semiconductor chips 170. For example, each of the upper semiconductor chips 170 may be one of a memory device and a logic device. Alternatively, some of the upper semiconductor chips 170 may be the memory devices, and the others of the upper semiconductor chips 170 may be the logic devices. The upper semiconductor chips 170 may be vertically stacked with dielectric layers therebetween in, for example, a zigzag shape or an aligned shape. The upper semiconductor chips 170 may be electrically connected to each other through a plurality of bonding wires 175, and/or the upper semiconductor chips 170 and the upper package substrate 162 may be electrically connected to each other through the plurality of bonding wires 175. Although not shown, bonding pads connected to the bonding wires may be disposed on the top surface 162f of the upper package substrate 162 and the upper semiconductor chips 170.

For example, the semiconductor package 100 may include the plurality of electrical interconnectors 154 disposed between the lower package 110 and the upper package 160 to electrically connecting the lower package 110 and the upper package 160 to each other. The electrical interconnectors 154 may be, for example, a plurality of mold vias filling the mold via holds 144 and electrically connected to the redistributions 130. Solder balls attached to a bottom surface 162b of the upper package substrate 162 may reflow and be expanded inside the mold via holes 144 to form the electrical interconnectors 154, respectively. Ball lands 164 may be electrically connected to the upper semiconductor chips 170.

For example, the semiconductor package 100 may further include a plurality of dummy interconnectors 156 disposed between the lower package 110 and the upper package 160 to couple the lower package 110 and the upper package 160 to each other. The dummy interconnectors 156 may fill dummy mold via holes 146 defined in the lower molding layer 140. Dummy solder balls attached to the bottom surface 162b of the upper package substrate 162 may reflow and be expanded inside the dummy mold via holes 146 to form the dummy interconnectors 156. For example, a plurality of dummy ball lands 166 attached to the dummy solder balls may be disposed on the lower surface 162b of the upper package substrate 162. The dummy ball lands 166 may not be electrically connected to the upper semiconductor chips 170. The dummy connectors 156 may not be used as electrical connection media, but may be used as coupling units physically coupling the upper and lower packages 110 and 160 to each other. On the other hand, as described later with reference to FIG. 7B, the dummy interconnectors 156 may be used as electrical connectors electrically the lower package 110 to the upper package 160. As shown in FIG. 1B, the dummy mold via holes 146 may have various shapes.

Referring to FIG. 1B, each of the dummy mold via holes 146 may have a taper shape with an inclined sidewall. For example, the dummy mold via hole 146 may have an upper width W1 greater than a lower width W2 (see FIG. 1B (A)). For another example, the dummy mold via holes 146 may have an upper width W1 less than a lower width W2 (see FIG. 1B (B)). The dummy mold via holes 146 may have a depth D less than a thickness T of the lower molding layer 140 (D<T). On the other hand, as described later with reference to FIG. 7B, the dummy mold via holes 146 may have a depth D equal to a thickness T of the lower molding layer 140 (D=T). For further another example, the dummy mold via holes 146 may have an oval shape (see FIG. 1B (C)). The mold via holes 146 is not limited to the above-described shapes. For example, the dummy mold via holes 146 may have the upper width W1 having the same shape as the lower width W2. Alternatively, the dummy mold via holes 146 may have various shapes such as, for example, a circular shape, a polygonal shape, or a convex shape. The above-described description may be applicable to the mold via holes 144.

Referring to FIG. 1C together with FIG. 1A, in the lower package 110, the mold via holes 144 may be disposed on the uppermost lower semiconductor chip 120. The dummy mold via holes 146 may be disposed outside the uppermost lower semiconductor chip 120, e.g., four lateral surfaces of an edge portion of the lower molding layer 140. Thus, the electrical connectors 154 filled into the mold via holes 144 may be disposed on a central portion of the semiconductor package 100, and the dummy connectors 156 filled into the dummy mold via holes 146 may be disposed on the edge portion of the semiconductor package 100, e.g., the four lateral surfaces. For another example, the dummy mold via holes 146 and the dummy interconnectors 156 may be disposed on two lateral surfaces, e.g., upper and lower lateral surfaces or left and right lateral surfaces, of the lower molding layer 140. For example, the mold via holes 144 and the dummy mold via holes 146 may have a cross section of one of the various shapes illustrated in FIG. 1B and a circular plane illustrated in FIG. 1C, but are not limited thereto.

Referring to FIG. 1D together 1A, in the upper package 160, the ball lands 164 may be disposed on a central portion of the bottom surface 162b of the upper package substrate 162, and the dummy ball lands 166 may be disposed on an edge portion of the bottom surface 162b of the upper package substrate 162, e.g., four lateral surfaces. Thus, the ball lands 164 may be disposed on the central portion of the semiconductor package 100, and the dummy ball lands 166 may be disposed on the edge portion of the semiconductor package 100, e.g., the four lateral surfaces. For another example, the dummy ball lands 166 may be disposed on two lateral surfaces, e.g., upper and lower lateral surfaces or left and right lateral surfaces, of the bottom surface 162b of the upper package substrate 162. The ball lands 164 may be vertically aligned with the mold via holes 144, and the dummy ball lands 166 may be vertically aligned with the dummy mold via holes 146. The ball lands 164 and the dummy ball lands 166 may have a circular plane, but is not limited thereto.

Referring again to FIG. 1A, the lower package 110 and upper package 160 may electrically and physically adhere to the electrical connectors 154 disposed on a center portion of the semiconductor package 100. The semiconductor package 100 may have an edge portion having an adhesion property weaker than that of a central portion thereof. Since this embodiment further includes the dummy connectors 156 on the edge portion of the lower package 110, the weak adhesion property at the edge portion of the semiconductor package 100 may be reinforced. For example, the semiconductor package 100 may be warped due to heat generated by operation of the lower package 110 and/or the upper package 160. The package warpage may relatively largely occur at the edge portion of the semiconductor package 100. In this case, a coupling between the lower package 110 and the upper package 160 may be poor, and a malfunction or defectiveness due to a coupling defect may occur. However, according to the semiconductor package 100 of this embodiment, since the dummy interconnectors 156 are further disposed at the edge portion, the limitations such as the package warpage and the malfunction may be solved. The dummy interconnectors 156 may disperse a stress applied to the electrical interconnectors 154 to improve mechanical durability of the semiconductor package 100. When the dummy interconnectors 156 may be formed of a conductive material, the heat generated in the semiconductor package 100 may be emitted through the dummy interconnectors 156 to improve a thermal characteristic of the semiconductor package 100.

Although one upper package 160 is stacked on one lower package 110 in the semiconductor package 100 of this embodiment, the lower package 110 and the upper package 160 are not limited to this number. That is, at least one of the upper package 160 and the lower package 110 may be provided in plurality. For example, two or more upper packages 160 may be stacked on one lower package 110.

(Modified Example of Device)

Figure 1E:
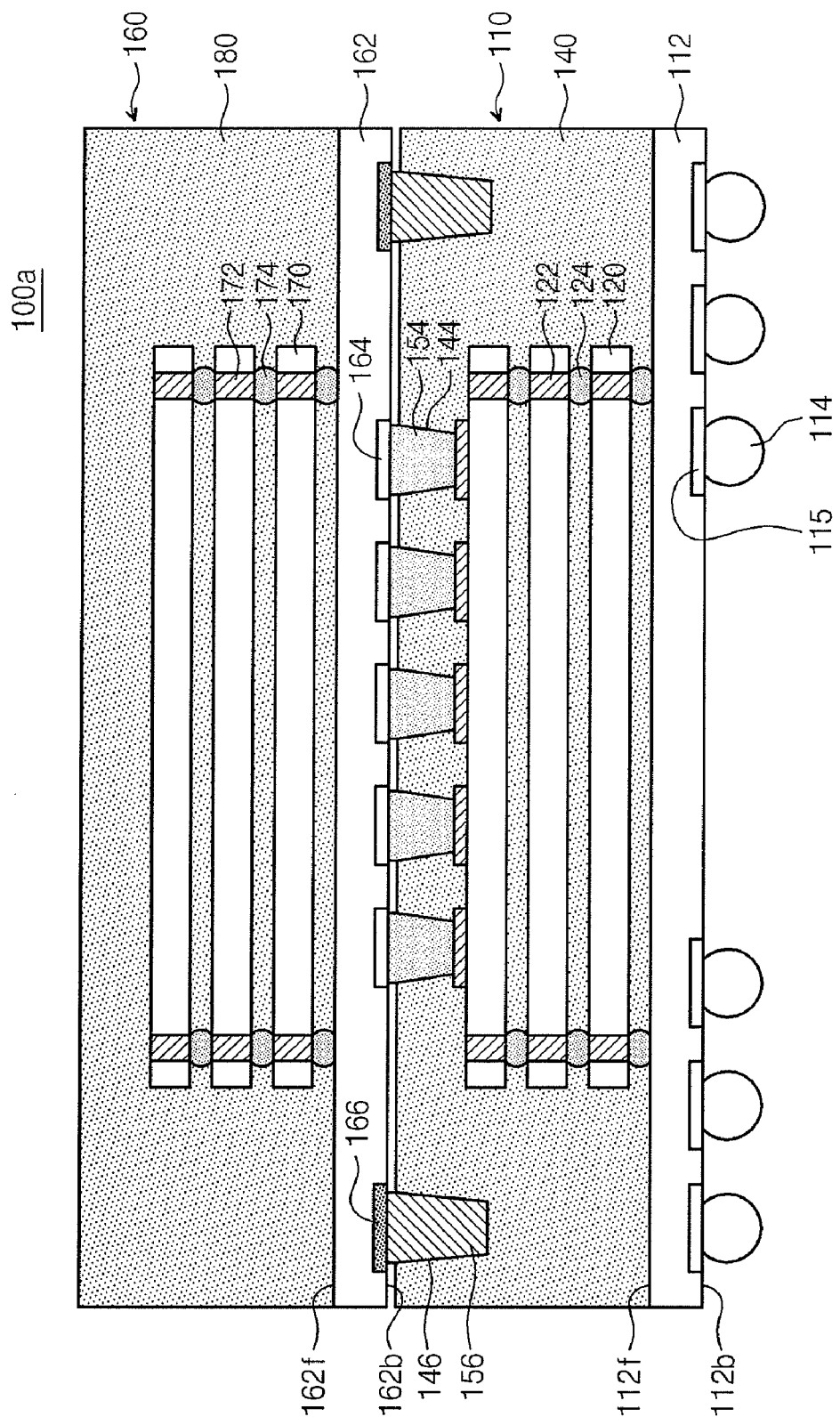
FIG. 1E is a sectional view illustrating a modified example of FIG. 1A.

FIG. 1E is a sectional view illustrating a modified example of FIG. 1A. Since the modified embodiment of the inventive concept is equal or similar to the embodiment described with reference to FIG. 1A, different points thereof will be described below, and description of similar features will be omitted.

Referring to FIG. 1E, a semiconductor package 100a of this modified embodiment may include a lower package 110 in which lower semiconductor chips 120 are electrically connected to each other through through-electrodes 122 and bumps 124, and a lowermost lower semiconductor chip 120 and a lower package substrate 112 are electrically connected to each other. Pads connected to the bumps 124 may be disposed on a top surface 112f of the lower package substrate 112. Similarly, the semiconductor package 100a may include an upper package 160 in which upper semiconductor chips 170 are electrically connected to each other through through-electrodes 172 and bumps 174, and a lowermost upper semiconductor chip 170 and an upper package substrate 162 are electrically connected to each other. Pads connected to the bumps 174 may be disposed on a top surface 162f of the upper package substrate 162. The lower semiconductor chips 120 and the upper semiconductor chips 170 may be stacked with each other in an aligned state, respectively. According to this modified embodiment, there is a much less limitation in design of depths or positions of mold via holes 146 when compared to using bonding wires.

The semiconductor package 100 of FIG. 1A may be variously modified except that of FIG. 1E, and variously modified examples of the semiconductor package 100 may be described below in detail through the following fabrication methods.

(Example of Method for Fabricating Device)

FIGS. 2A to 2G are sectional views illustrating a method for fabricating a semiconductor package according to an embodiment of the inventive concept.

Figure 2A:
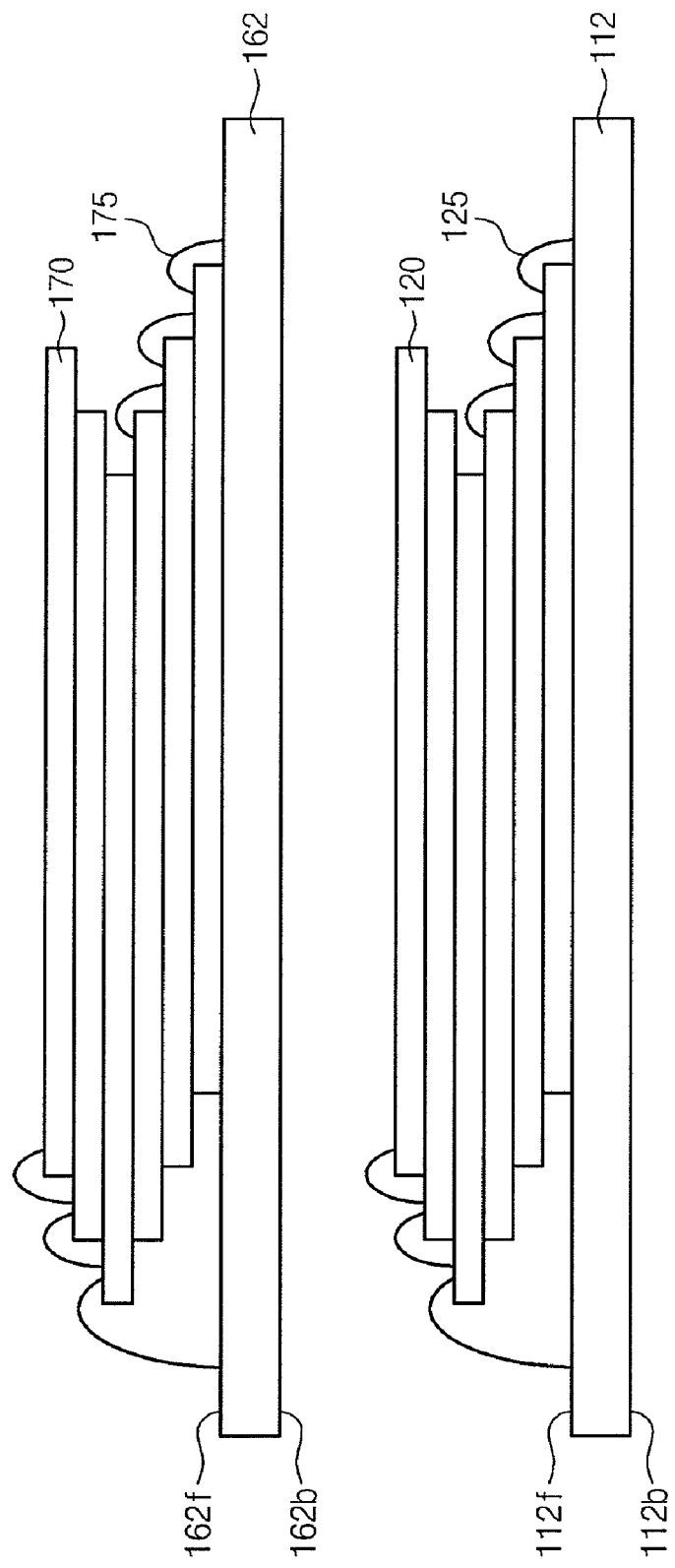

Referring to FIG. 2A, a lower package substrate 112 and an upper package substrate 162 may be provided. A PCB may be adopted for the upper and lower package substrates 162 and 112. At least one lower semiconductor chip, e.g., a plurality of lower semiconductor chips 120 may be stacked on a top surface 112f of the lower package substrate 112. The lower semiconductor chips 120 may be vertically stacked with each other in, for example, a zigzag shape or an aligned shape. A plurality of dielectric layers may be disposed between the lower semiconductor chips 120. The lower semiconductor chips 120, and the lower semiconductor chips 120 and the lower package substrate 112 may be electrically connected to each other using a plurality of bonding wires 125. Although not shown, bonding pads connected to the bonding wires 125 may be formed on the top surface 112f of the lower package substrate 112 and the lower semiconductor chips 120.

Identically or similarly, at least one upper semiconductor chip, e.g., a plurality of upper semiconductor chips 170 may be stacked on a top surface 162f of the upper package substrate 162. The upper semiconductor chips 170 may be vertically stacked with each other in, for example, a zigzag shape or an aligned shape. A plurality of dielectric layers may be disposed between the upper semiconductor chips 170. The upper semiconductor chips 170, and the upper semiconductor chips 170 and the upper package substrate 162 may be electrically connected to each other using a plurality of bonding wires 175. Although not shown, bonding pads connected to the bonding wires 175 may be formed on the top surface 162f of the upper package substrate 162 and the upper semiconductor chips 170.

Figure 2B:
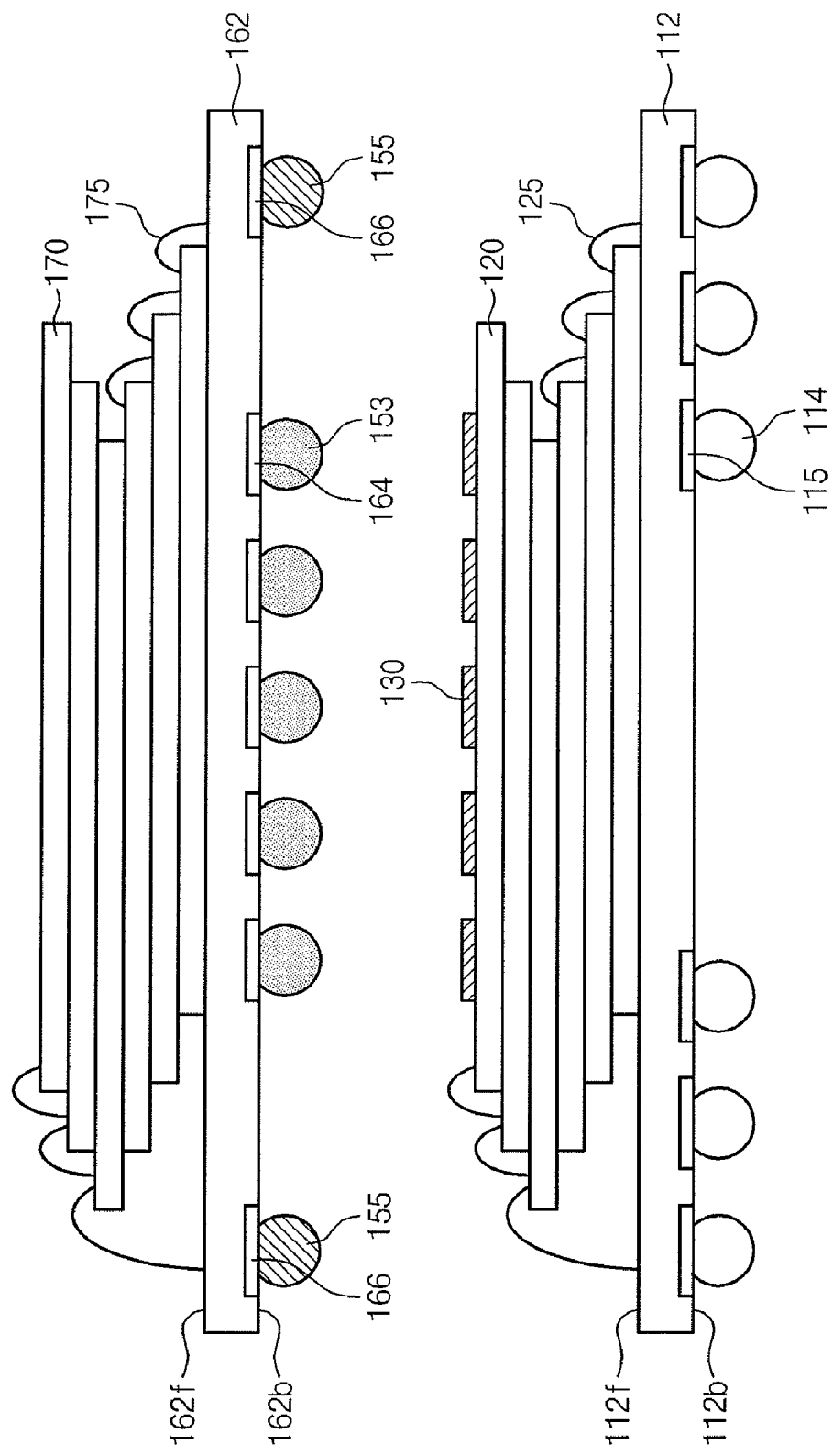

Referring to FIG. 2B, a plurality of redistributions 130 may be formed on the uppermost lower semiconductor chip 120. A conductive material such as, for example, aluminum (Al), copper (Cu), gold (Au), silver (Ag), platinum (Pt), or their alloys may be deposited and patterned, or plated to form the redistributions 130. For another example, a redistribution wafer may be stacked on the uppermost lower semiconductor chip 120 to form the redistributions 130. The redistributions 130 may be disposed at positions corresponding to a central portion of the lower package substrate 112. At least one external terminal 114, e.g., a plurality of external terminals 114 may be attached to a bottom surface 112b of the lower package substrate 112. A plurality of ball lands 115 formed of a conductive material such as, for example, a metal and connected to the external terminals 114 may be formed on the bottom surface 112b of the lower package substrate 112. Alternatively, the lower package substrate 112 including the ball lands 115 may be prepared to attach the external terminals 114 to the ball lands 115. The external terminals 114 may be attached in a concurrent process or a subsequent process.

At least one electrical connection terminal, e.g., a plurality of solder balls 153 may be attached to a bottom surface 162b of the upper package substrate 162. The solder balls 153 may be disposed at positions vertically aligned with the redistributions 130. Thus, the solder balls 153 may be disposed at a central portion of the upper package substrate 162. A plurality of ball lands 164 formed of a conductive material such as, for example, a metal and connected to the solder balls 153 may be formed on the bottom surface 162b of the upper package substrate 162. Alternatively, the upper package substrate 162 including the ball lands 164 may be prepared to attach the solder balls 153 to the ball lands 164. The ball lands 164 may be electrically connected to the upper semiconductor chips 170.

At least one mechanical or physical coupling terminal, e.g., a plurality of dummy solder balls 155 may be further attached to the bottom surface 162b of the upper package substrate 162. The dummy solder balls 155 may be attached to an edge portion of the upper package substrate 162. Thus, the solder balls 153 may be disposed at the central portion of the upper package substrate 162, and the dummy solder balls 155 may be disposed at the edge portion of the upper package substrate 162. The dummy solder balls 155 and the solder balls 153 may be attached at the same time. The dummy solder balls 155 and the solder balls 153 may be formed of the same material. Alternatively, the dummy solder balls 155 may be formed of a conductive material, e.g., a metal except solder. For another example, balls formed of a non-conductive material, e.g., resin balls may be replaced with the dummy solder balls 155. The solder balls 153 and the dummy solder balls 155 may have equal or nearly similar volume.

A plurality of dummy ball lands 166 providing attaching positions of the dummy solder balls 155 may be further formed at the edge portion of the bottom surface 162b of the upper package substrate 162. The dummy ball lands 166 and the ball lands 164 may be formed at the same time. Alternatively, the upper package substrate 162 including the ball lands 164 and the dummy ball lands 166 may be prepared to attach the solder balls 153 to the ball lands 164 and to attach the dummy solder balls 155 to the dummy ball lands 166. For example, the dummy ball lands 166 may be formed of a conductive material such as a metal or a non-conductive material such as a resin. The dummy ball lands 166 may not be electrically connected to the upper semiconductor chips 170. For another example, even through the dummy ball lands 166 are electrically connected to the upper semiconductor chips 170, the dummy ball lands may not be substantially used as paths through which operation signals are transmitted.

Referring to FIG. 2C, a lower molding layer 140 may be formed on the top surface 112f of the lower package substrate 112. The lower molding layer 140 may mold the lower semiconductor chips 120 to protect the lower semiconductor chips 120 against external environment such as, for example, physical impacts or moisture. For example, an epoxy molding compound (EMC) may be hardened to form the lower molding layer 140. Similarly, for example, an upper molding layer 180 may be formed on the top surface 162f of the upper package substrate 162 using the EMC. The upper molding layer 180 may be formed in a concurrent process or a subsequent process.

Referring to FIG. 2D, a portion of the lower molding layer 140 may be removed to form a plurality of mold via holes 144 exposing the redistributions 130. For example, the mold via holes 144 may be formed using a laser drilling process. The laser drilling process does not require a mask manufacturing process or a photolithography process such as an etching process. According to the laser drilling process, a pulse or intensity of a laser may be adequately adjusted to relatively easily set a depth or width (e.g., diameter) of each of the mold via holes 144. Also, an irradiation angle of the laser may be changed such that a sidewall of each of the mold via holes 144 is inclined at a desired angle. Each of the mold via holes 144 may have the same volume as that occupied by each of the solder balls 153 by a subsequent reflow process. The sidewall of the respective mold via holes 144 may be perpendicular or inclined. Thus, as shown in FIG. 1B, the respective mold via holes 144 may have a cylindrical shape having the same vertical and horizontal widths. On the other hand, the respective mold via holes 144 may have a taper shape having a width gradually increasing or decreasing from an upper side toward a lower side.

A plurality of dummy mold via holes 146 may be formed. The dummy mold via holes 146 may be disposed at positions vertically aligned with the dummy solder balls 155 of the lower molding layer 140, e.g., an edge portion of the lower molding layer 140. The dummy mold via holes 146 may be formed using, for example, the laser drilling process. According to this embodiment, the dummy mold via holes 146 and the mold via holes 144 may be formed using, for example, the laser drilling process at the same time or the one after the other. The mold via holes 114 and/or the dummy mold via holes 146 may be controlled in depth by adjusting a power of the laser. For example, the respective dummy mold via holes 146 may have the same depth as that of the respective mold via holes 144 or a depth different from that of the respective mold via holes 144. As shown in FIG. 1B, the mold via holes 144 and/or the dummy mold via holes 146 may have various shapes such as the taper shape or an oval shape by changing the irradiation angle of the laser.

The respective dummy mold via holes 146 may have a shape different from that of the respective mold via holes 144. For example, the respective dummy mold via holes 146 may have a depth, a width, or depth and width greater than that of the respective mold via holes 144. As shown in FIG. 1B (A), the respective mold via holes 144 and/or the respective dummy mold via holes 146 may have an upper width relatively greater than a lower width thereof. According to this embodiment, the respective mold via holes 146 may have a depth greater than that of the respective mold via holes 144. Thus, the respective dummy mold via holes 146 may have a volume greater than that of the respective dummy solder balls 155. In this case, when the subsequent reflow process is performed, the mold via holes 144 may be fully or slightly overflowingly filled with the reflowed solder balls 153, and the dummy mold via holes 146 may not be fully filled with the reflowed dummy solder balls 155.

Figure 2E:
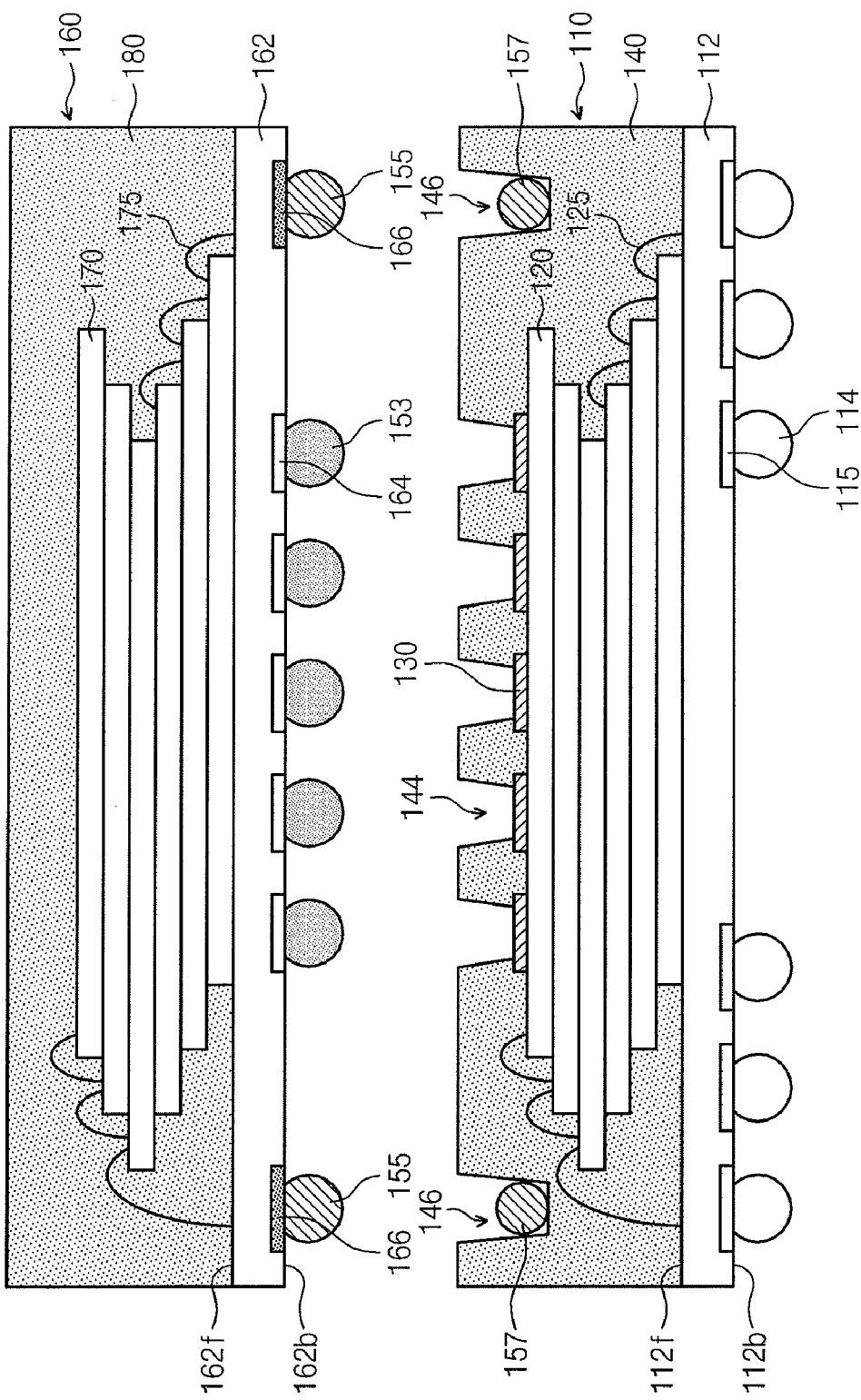

Referring to FIG. 2E, fillers 157 may be provided in the dummy mold via holes 146. The fillers 157 may be a material coupled to the dummy solder balls 155 when the subsequent reflow process is performed. The fillers 157 may be formed of a conductive or non-conductive material. For example, when the dummy solder balls 155 are formed of a solder or metal, the fillers 157 may be formed of a solder paste or metal material, e.g., a metal particle. For another example, resin balls are replaced with the dummy solder balls 155, the fillers 157 may be a homogenous or heterogeneous resin. The dummy mold via holes 146 may not be fully filled with the fillers 157.

Figure 2F:
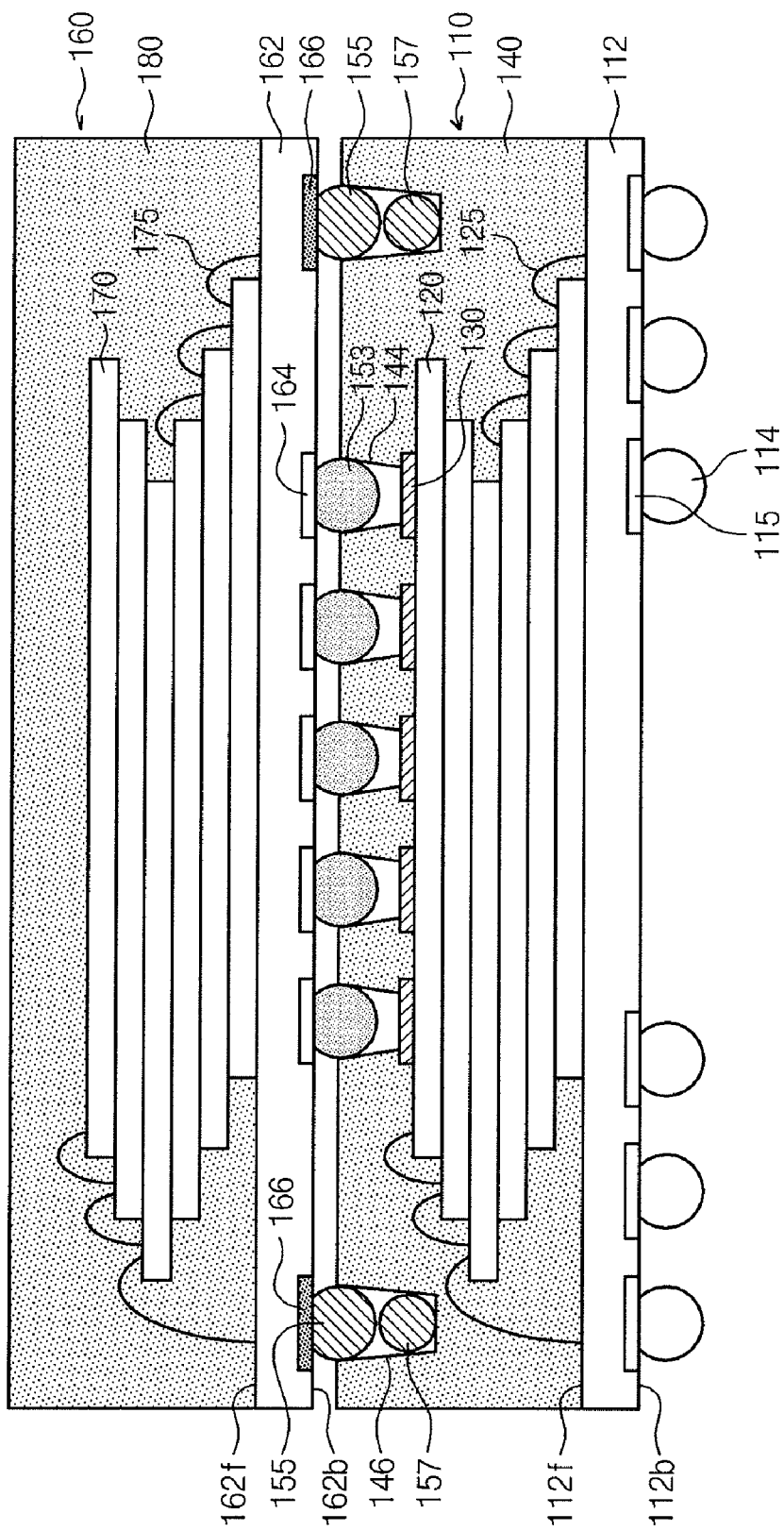

Referring to FIG. 2F, at least one of the lower package 110 and the upper package 160 may be approached to the other one to couple the lower package 110 to the upper package 160. For example, the upper package 160 may be stacked on the lower package 110. Thus, the solder balls 153 may be inserted into the mold via holes 144, and the dummy solder balls 155 may be inserted into the dummy mold via holes 146. The reflow process may be performed to expand the solder balls 153 into the mold via holes 144. When the solder balls 153 are melted by the reflow process, the mold via holes 144 may be fully or slightly overflowingly filled with the reflowed solder balls 153. In this case, the solder balls 153 may be wetted by the redistributions 130. When the reflow process is performed, the dummy solder balls 155 and the fillers 157 may be melted and coupled to each other. According to this embodiment, even through the dummy mold via holes 146 are not fully filled with the reflowed dummy solder balls 155, the dummy mold via holes 146 may be filled somewhat with the fillers 157. Thus, the dummy mold via holes 146 may be fully or slightly overflowingly filled with the dummy solder balls 155 and the fillers 157.

Figure 2G:
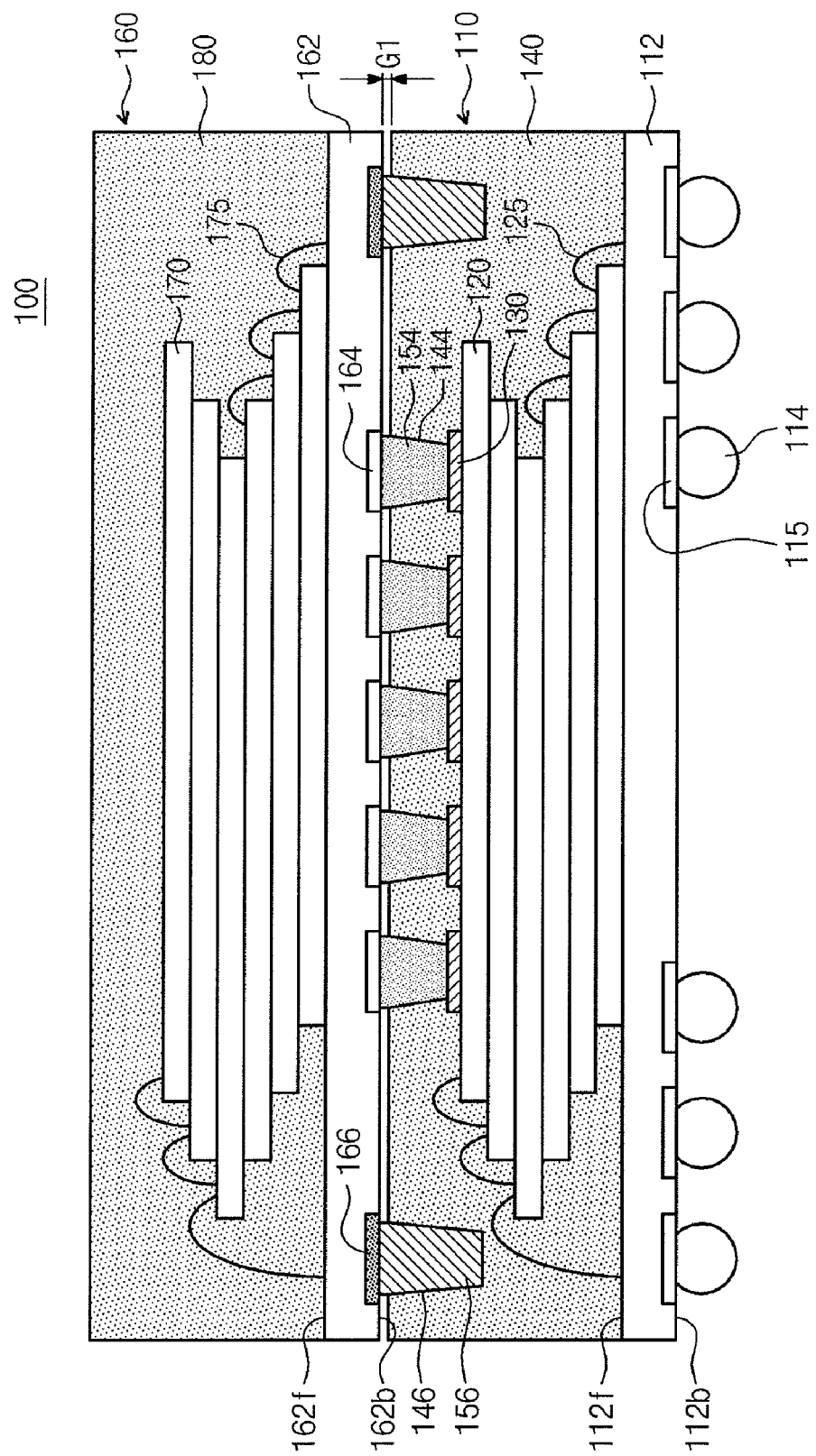

Referring to FIG. 2G, the solder balls 153 may be formed as electrical interconnectors 154, and the dummy solder balls 155 may be formed as dummy interconnectors 156 by the previously described reflow process. Thus, there may be realized a POP type semiconductor package 100 where the electrical interconnectors 154 electrically and physically connect the upper and lower packages 110 and 160 to each other and the dummy interconnectors 156 physically connect the upper and lower packages 110 and 160 to each other. The upper and lower packages 110 and 160 may be spaced a predetermined distance from each other or closely attached to each other (G1≧0). The dummy interconnectors 156 may improve electrical, mechanical, and thermal characteristics of the semiconductor package 100. For example, the dummy interconnectors 156 may complement the physical coupling between the upper and lower packages 110 and 160 and minimize or restrain package warpage. In addition, the dummy interconnectors 156 may disperse a stress. Furthermore, the dummy interconnectors 156 may be utilized as heatsink units.

(Modified Example of Method for Fabricating Device)

Figure 3B:
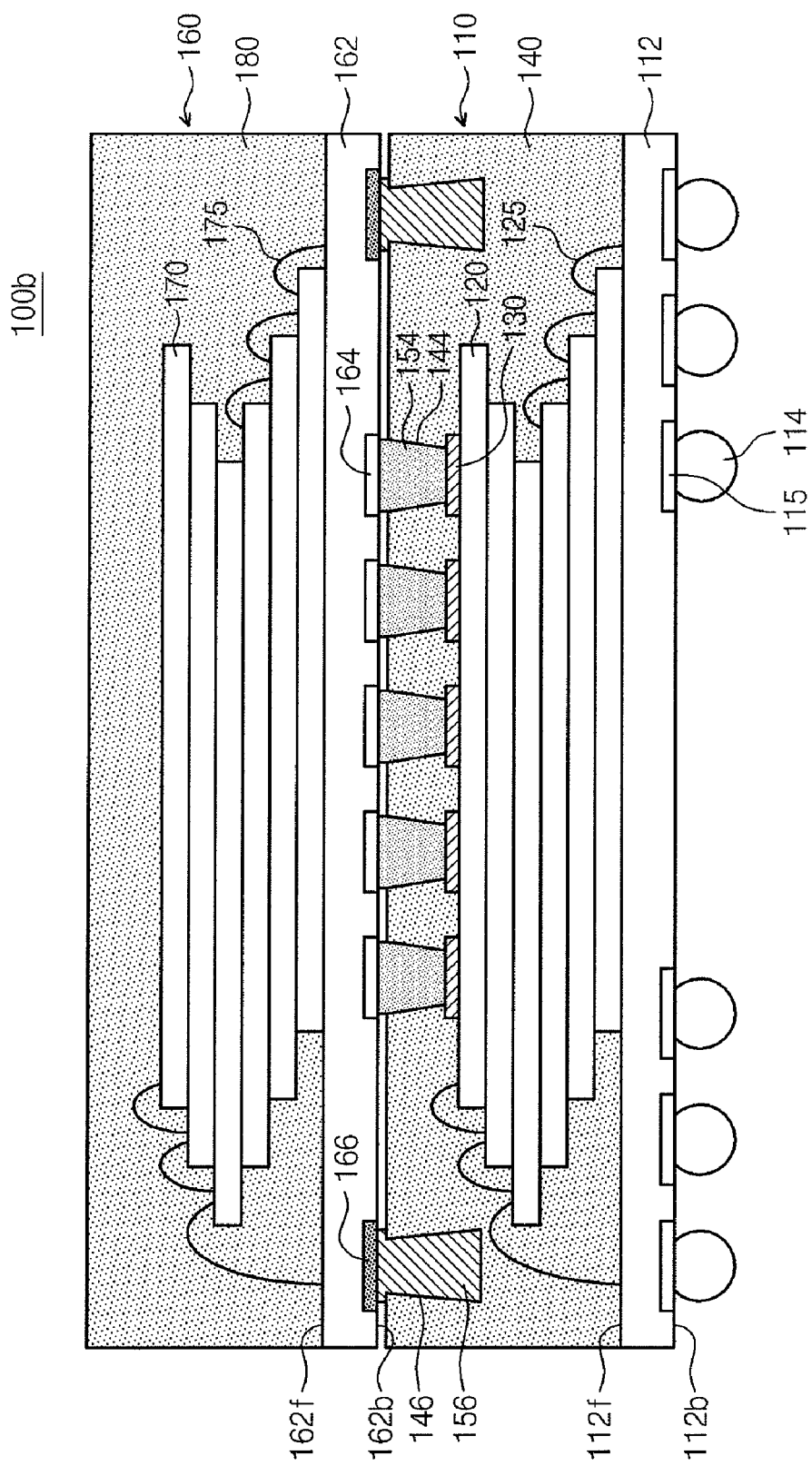

FIGS. 3A and 3B are sectional views illustrating a method for fabricating a semiconductor package according to a modified embodiment of the inventive concept. Since fabricating methods of the modified embodiment are equal or similar to those of the embodiment described with reference to FIGS. 2A to 2G, different points thereof will be described below, and similar features will be schematically described or omitted.

Referring to FIG. 3A, a lower package 110 and an upper package 160 may be formed using methods equal to similar to those described with reference to FIGS. 2A to 2E. For example, in the lower package 110, and lower semiconductor chips 120 may be mounted on a top surface 112f of a lower package substrate 112, and the lower semiconductor chips 120 may be molded by a lower molding layer 140 including mold via holes 144 and dummy mold via holes 146. At least one of the mold via holes 144 and the dummy mold via holes 146, as shown in FIG. 1B, may have various shapes. According to the modified embodiment, as shown in FIG. 1B (B), the respective dummy mold via holes 146 may have an upper width less than a lower width thereof. Fillers 157 may be provided in the dummy mold via holes 146. External terminals 114 connected to ball lands 115 may be attached to a bottom surface 112b of the lower package substrate 112. Redistributions 130 exposed by the mold via holes 144 may be formed on the uppermost lower semiconductor chip 120.

In the upper package 160, upper semiconductor chips 170 may be mounted on a top surface 162f of an upper package substrate 162, and the upper semiconductor chips 170 may be molded by an upper molding layer 180. Solder balls 153 connected to ball lands 164 may be formed at a central portion of a bottom surface 162f of the upper package substrate 162, and dummy solder balls 155 connected to dummy ball lands 166 may be formed at an edge portion of the bottom surface 162f of the upper package substrate 162. The solder balls 153 may be aligned with the mold via holes 144, and the dummy solder balls 155 may be aligned with the dummy mold via holes 146.

Referring to FIG. 3B, the upper package 160 may be stacked on the lower package 110 using processes equal or similar to those described with reference to FIGS. 2F and 2G, and then, a reflow process may be performed to realize a POP type semiconductor package 100b. When the reflow process is performed, the solder balls 153 may be melted and expanded into the mold via holes 144. As a result, the solder balls 153 may be formed as electrical interconnectors 154. Simultaneously, the dummy solder balls 155 may be melted and expanded into the dummy mold via holes 146. Then, the dummy solder balls 155 may be coupled to the melted fillers 157 and formed as dummy interconnectors 156. Since the respective dummy mold via holes 146 may have a lower width greater than an upper width thereof, the respective dummy interconnectors 156 may have a lower width greater than an upper width thereof. Thus, since the respective dummy interconnectors 156 have a structure in which it may be difficult to separate them from the dummy mold via holes 146, the physical coupling between the lower package 110 and the upper package 160 may be further secured. The above-described effect may be realized in a state where the respective dummy mold via holes 146 has an oval or convex shape as shown in FIG. 1B (C).

(Modified Example of Method for Fabricating Device)

Figure 4B:
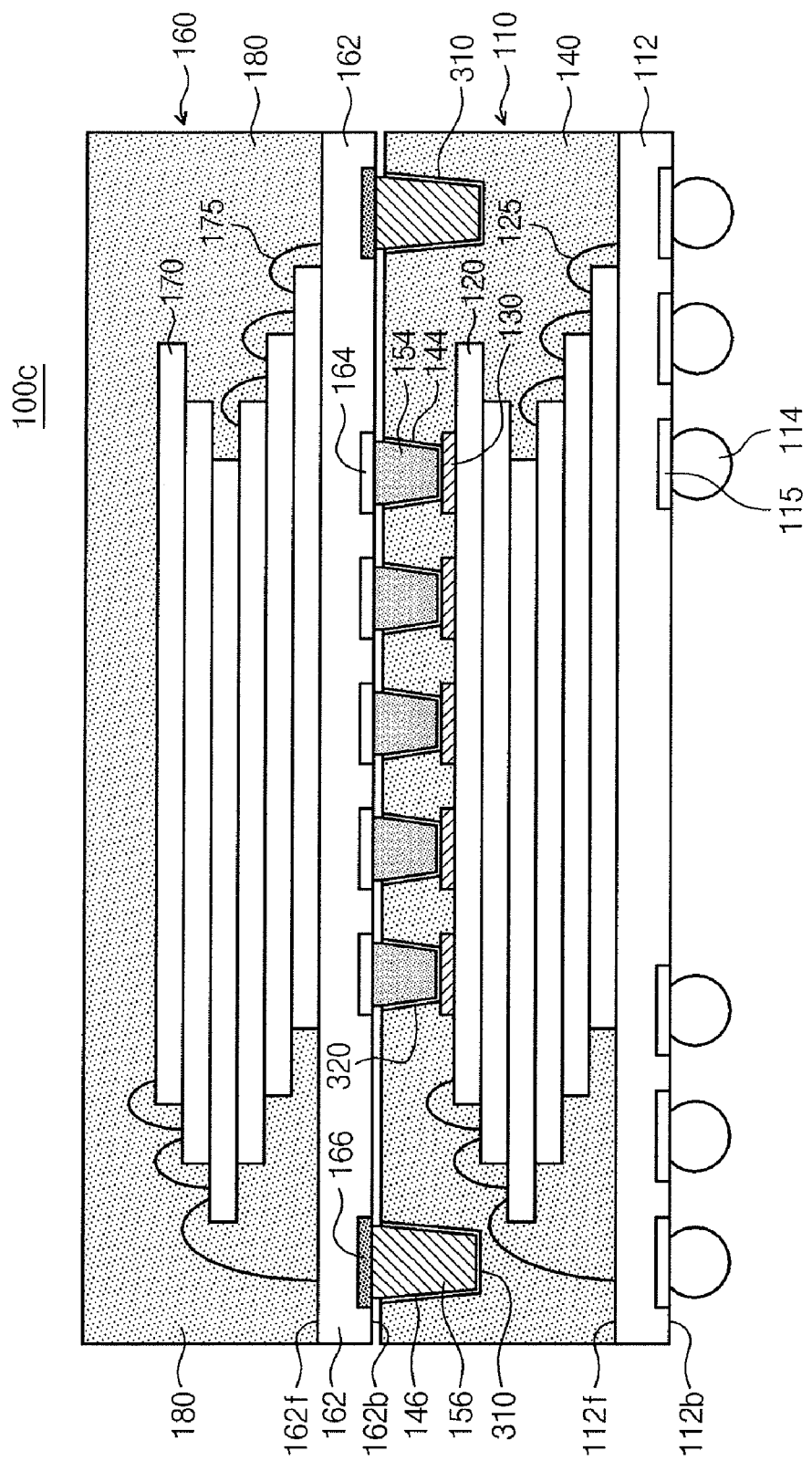

FIGS. 4A and 4B are sectional views illustrating a method for fabricating a semiconductor package according to a modified embodiment of the inventive concept.

Referring to FIG. 4A, a lower package 110 and an upper package 160 may be formed using processes equal or similar to those described with reference to FIGS. 2A to 2E. As shown in FIG. 1B, at least ones of mold via holes 144 and dummy mold via holes 146 may have various shapes. Before fillers 157 may be provided in the dummy mold via holes 146, metal layers 310 may be further formed on inner walls of the dummy mold via holes 146. For example, the metal layers 310 may be formed using a plating process. For another example, conductive materials may be deposited and patterned to form the metal layers 310. Simultaneously, metal layers 320 may be further formed on inner walls of the mold via holes 144. The metal layers 310 and 320 may give further stable wetting environment to solder balls 153 and dummy solder balls 155. The formation of the metal layers 310 and 320 may not be limited to this embodiment, but be applied to the various embodiments disclosed in this specification.

Referring to FIG. 4B, the upper package 160 may be stacked on the lower package 110 using equal or similar to those described with reference to FIGS. 2F and 2G, and then, a reflow process may be performed to realize a POP type semiconductor package 100c. When the reflow process is performed, the solder balls 153 may be filled into the mold via holes 144 to form electrical interconnectors 154, and the dummy solder balls 155 and the fillers 157 may be filled into the dummy mold via holes 146 to form dummy interconnectors 156. When the reflow process is performed, the fillers 157 may be wetted to the metal layers 310. Thus, the physical coupling between the lower package 110 and the upper package 160 may be further secured through the dummy interconnectors 156 when compared to a case in which the metal layers 310 are not provided. The modified embodiment may be further available when the dummy solder balls 155 and the fillers 157 may be formed of a solder paste or a metallic material. The above-described embodiment may be applicable with respect to electrical interconnectors 154.

(Modified Example of Method for Fabricating Device)

Figure 5A:
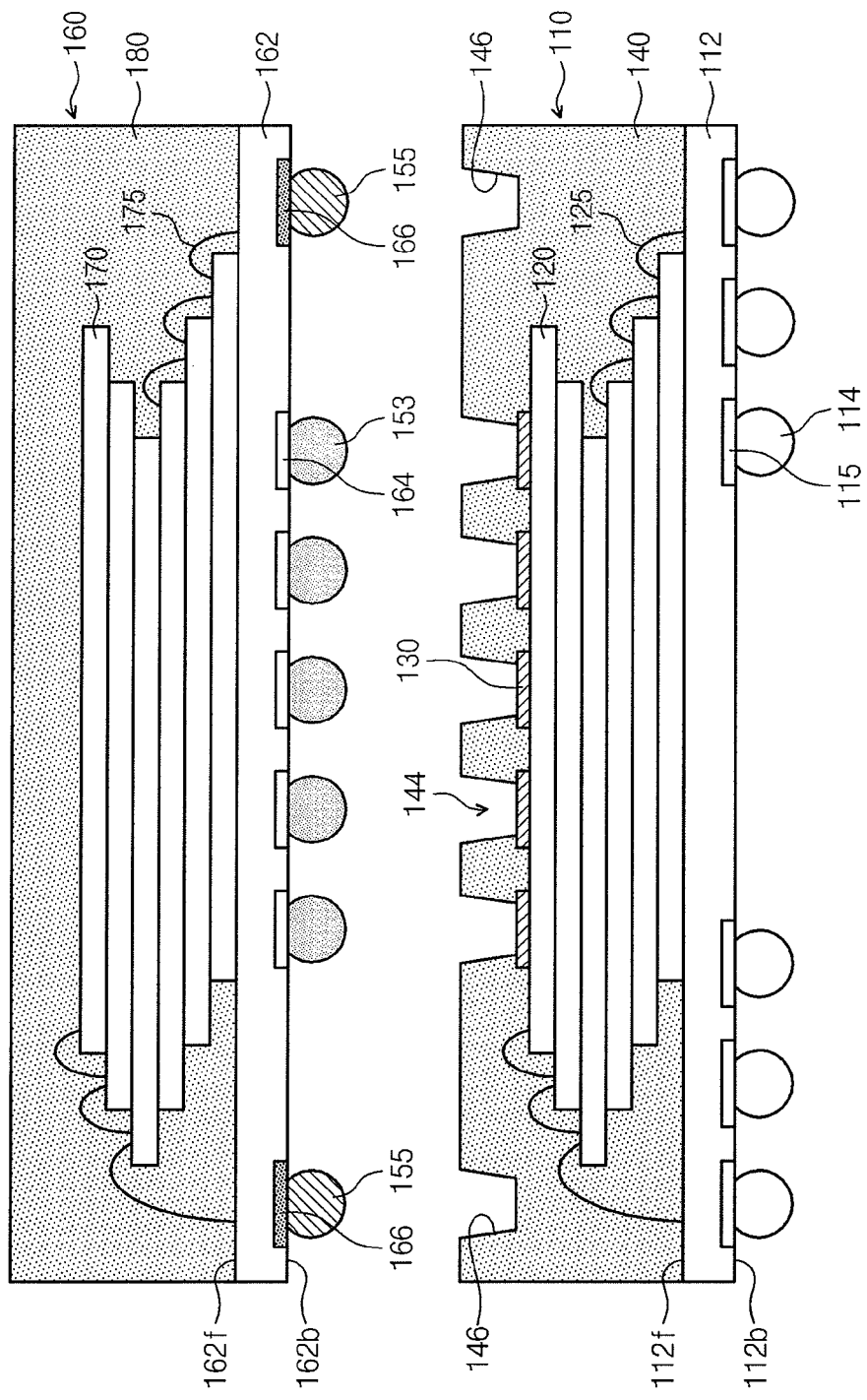
FIGS. 5A and 5B are sectional views illustrating a method for fabricating a semiconductor package according to a modified embodiment of the inventive concept.
Figure 5B:
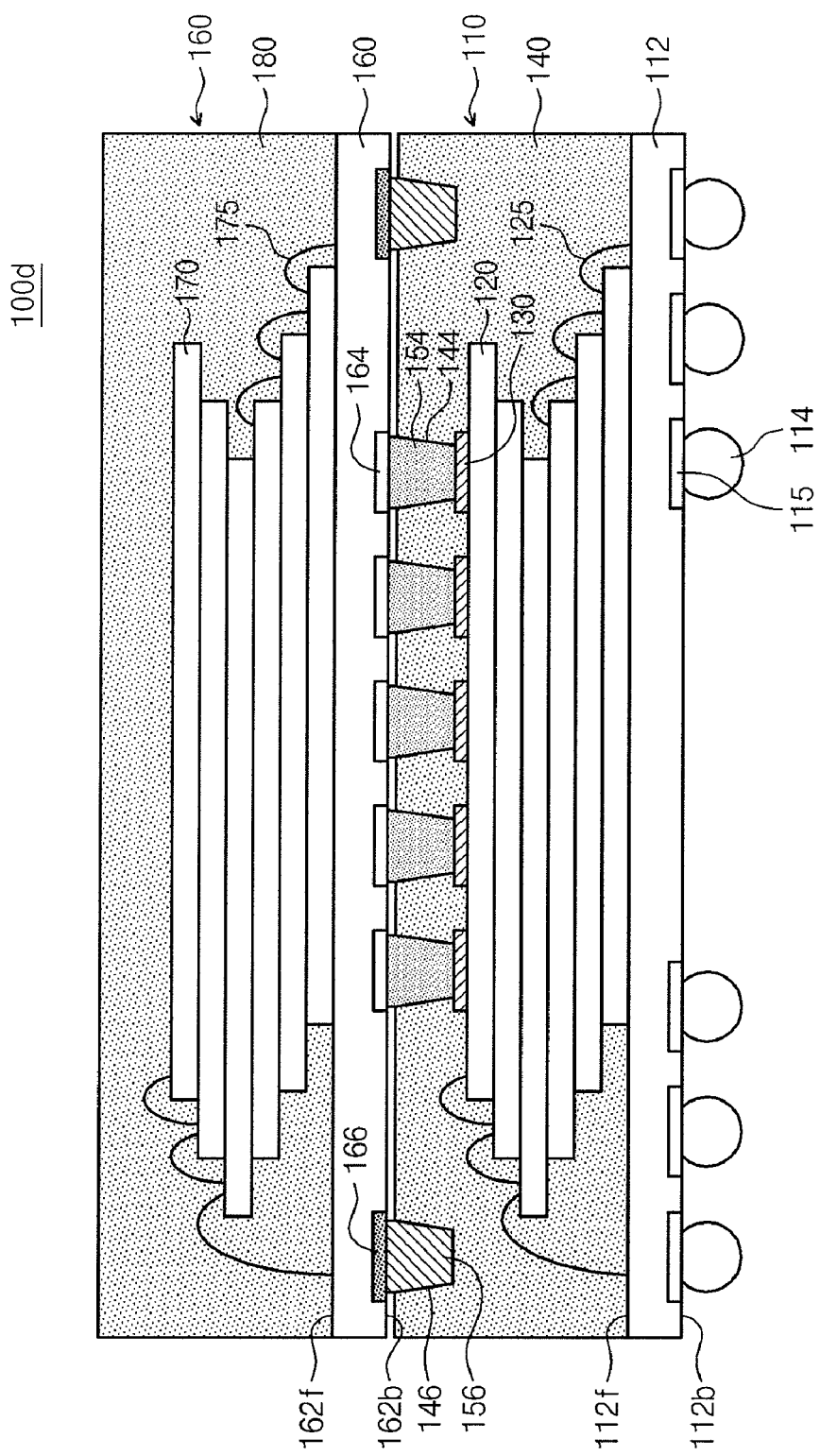

FIGS. 5A and 5B are sectional views illustrating a method for fabricating a semiconductor package according to a modified embodiment of the inventive concept.

Referring to FIG. 5A, a lower package 110 and an upper package 160 may be formed using processes equal or similar to those described with reference to FIGS. 2A to 2E. According to the modified embodiment, mold via holes 144 and dummy mold via holes 146 may have the same shape and depth using the same process (e.g., a laser drilling process). For example, as shown in FIG. 1B (A), the respective dummy hold via holes 146 may have an upper width greater than a lower width thereof and a depth equal or similar to that of the respective mold via holes 144. When the respective dummy mold via holes 146 have a depth, which is not greater than that of the respective mold via holes 144, but nearly equal to that of the respective mold via holes 144, the dummy mold via holes 146 may be fully or slightly overflowingly filled with reflowed dummy solder balls 155. Thus, as the above-described embodiments, providing fillers into the dummy mold via holes 146 may be skipped. For another example, the respective dummy mold via holes 146 may have a depth less than that of the respective mold via holes 146. However, to firmly couple the upper package 160 and the lower package 110 to each other, the respective dummy mold via holes 146 may have a depth equal to or greater than that of the respective mold via holes 144.

Referring to FIG. 5B, the upper package 160 may be stacked on the lower package 110 using equal or similar to those described with reference to FIGS. 2F and 2G, and then, a reflow process may be performed to realize a POP type semiconductor package 100d. When the reflow process is performed, the solder balls 153 may be filled into the mold via holes 144 to form electrical interconnectors 154, and the dummy solder balls 155 may be filled into the dummy mold via holes 146 to form dummy interconnectors 156.

(Modified Example of Method for Fabricating Device)

Figure 6A:
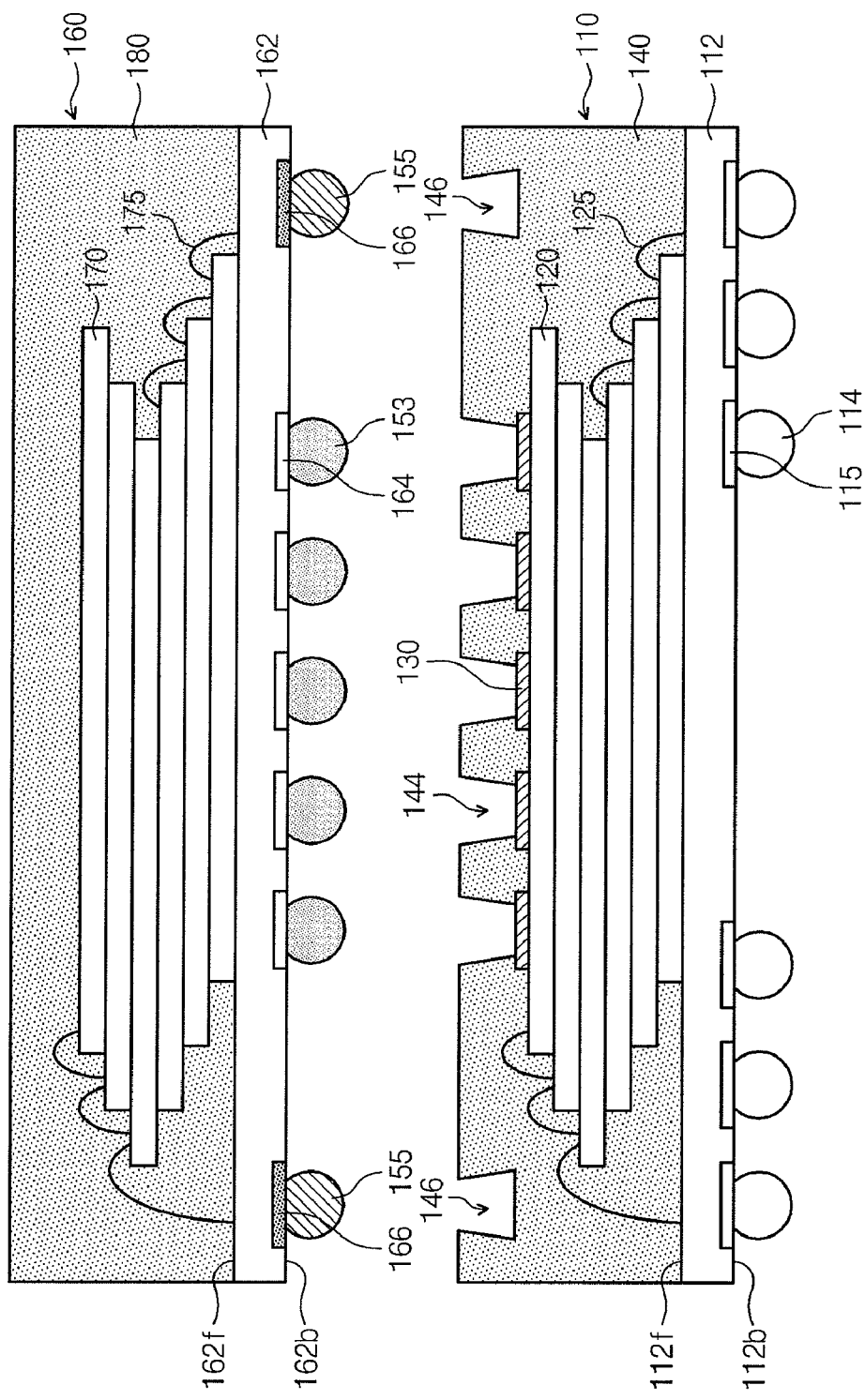
FIGS. 6A and 6B are sectional views illustrating a method for fabricating a semiconductor package according to a modified embodiment of the inventive concept.
Figure 6B:
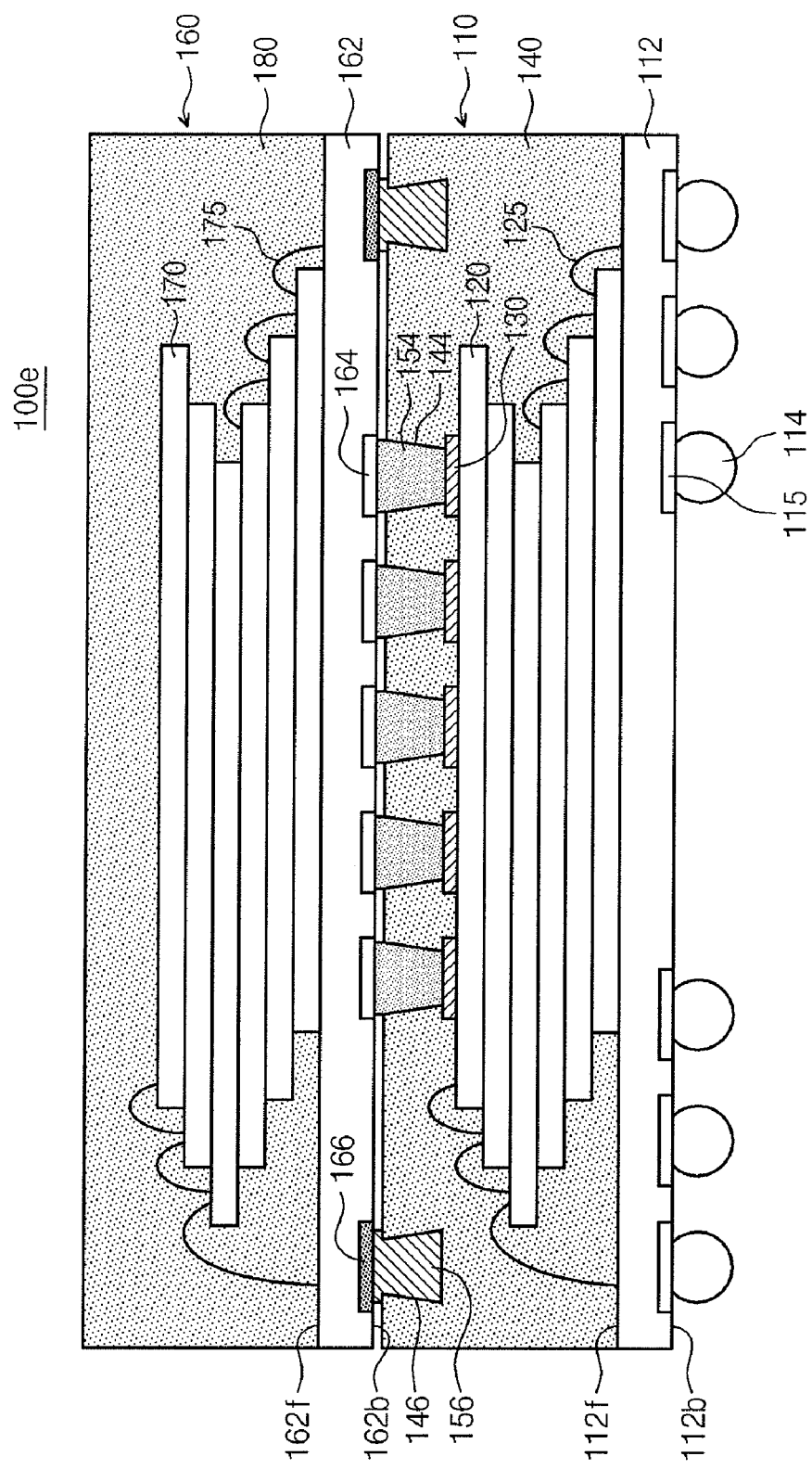

FIGS. 6A and 6B are sectional views illustrating a method for fabricating a semiconductor package according to a modified embodiment of the inventive concept.

Referring to FIG. 6A, a lower package 110 and an upper package 160 may be formed using processes equal or similar to those described with reference to FIGS. 2A to 2E. According to the modified embodiment, mold via holes 144 and dummy mold via holes 146 may have the same shape and depth using the same process (e.g., a laser drilling process). As shown in FIG. 1B (B), the respective dummy hold via holes 146 may have an upper width less than a lower width thereof. Thus, as described in FIG. 5A, providing fillers into the dummy mold via holes 146 may be skipped.

Referring to FIG. 6B, the upper package 160 may be stacked on the lower package 110 using equal or similar to those described with reference to FIGS. 2F and 2G, and then, a reflow process may be performed to realize a POP type semiconductor package 100e. When the reflow process is performed, the solder balls 153 may be filled into the mold via holes 144 to form electrical interconnectors 154, and the dummy solder balls 155 may be filled into the dummy mold via holes 146 to form dummy interconnectors 156. As described with reference to FIG. 3B, since the respective dummy interconnectors 156 have a structure in which it may be difficult to separate them from the dummy mold via holes 146, the physical coupling between the lower package 110 and the upper package 160 may be further secured. For another example, the respective dummy mold via holes 146 may have an oval shape as shown in FIG. 1B (C).

(Modified Example of Method for Fabricating Device)

Figure 7A:
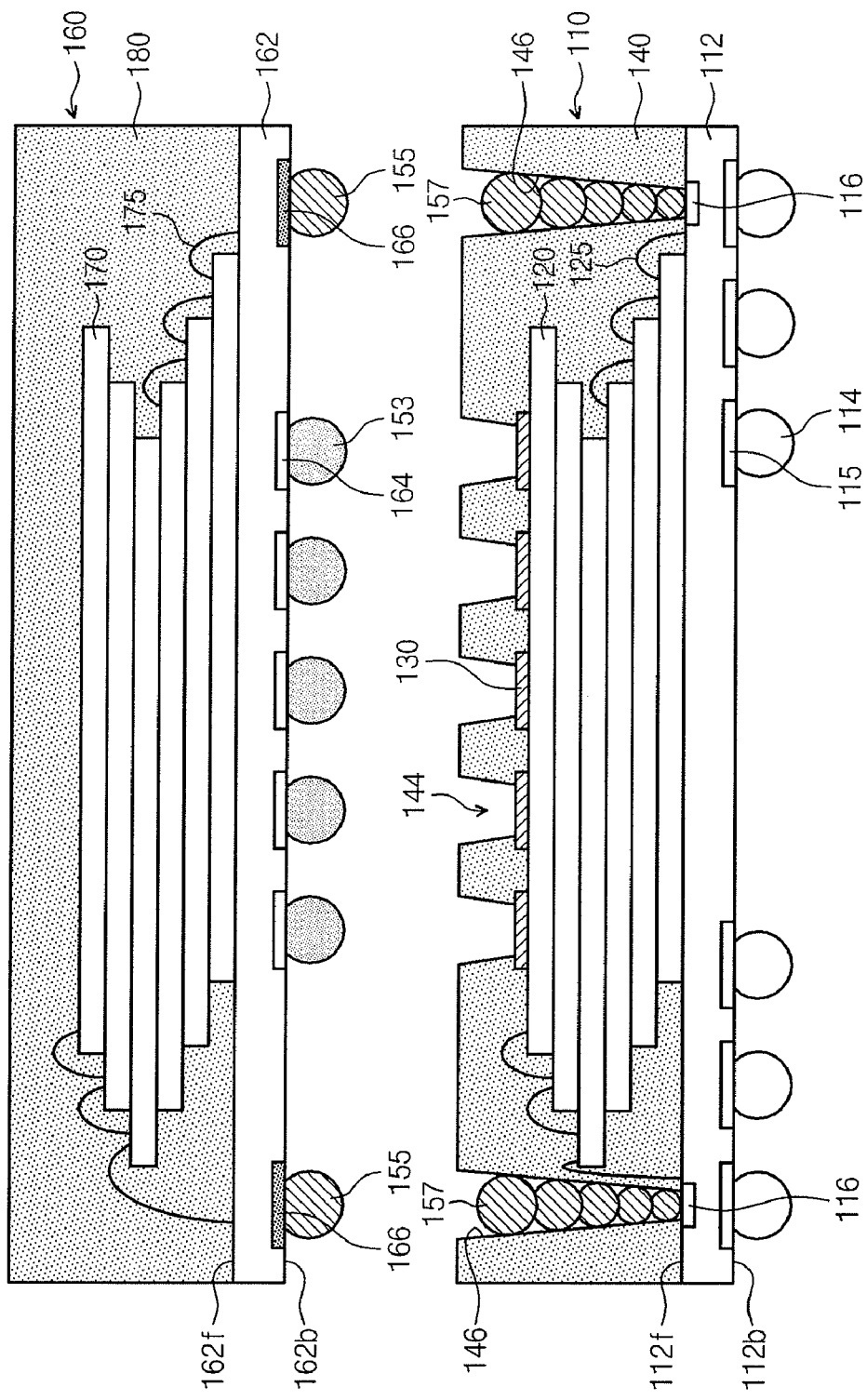
FIGS. 7A and 7B are sectional views illustrating a method for fabricating a semiconductor package according to a modified embodiment of the inventive concept.
Figure 7B:
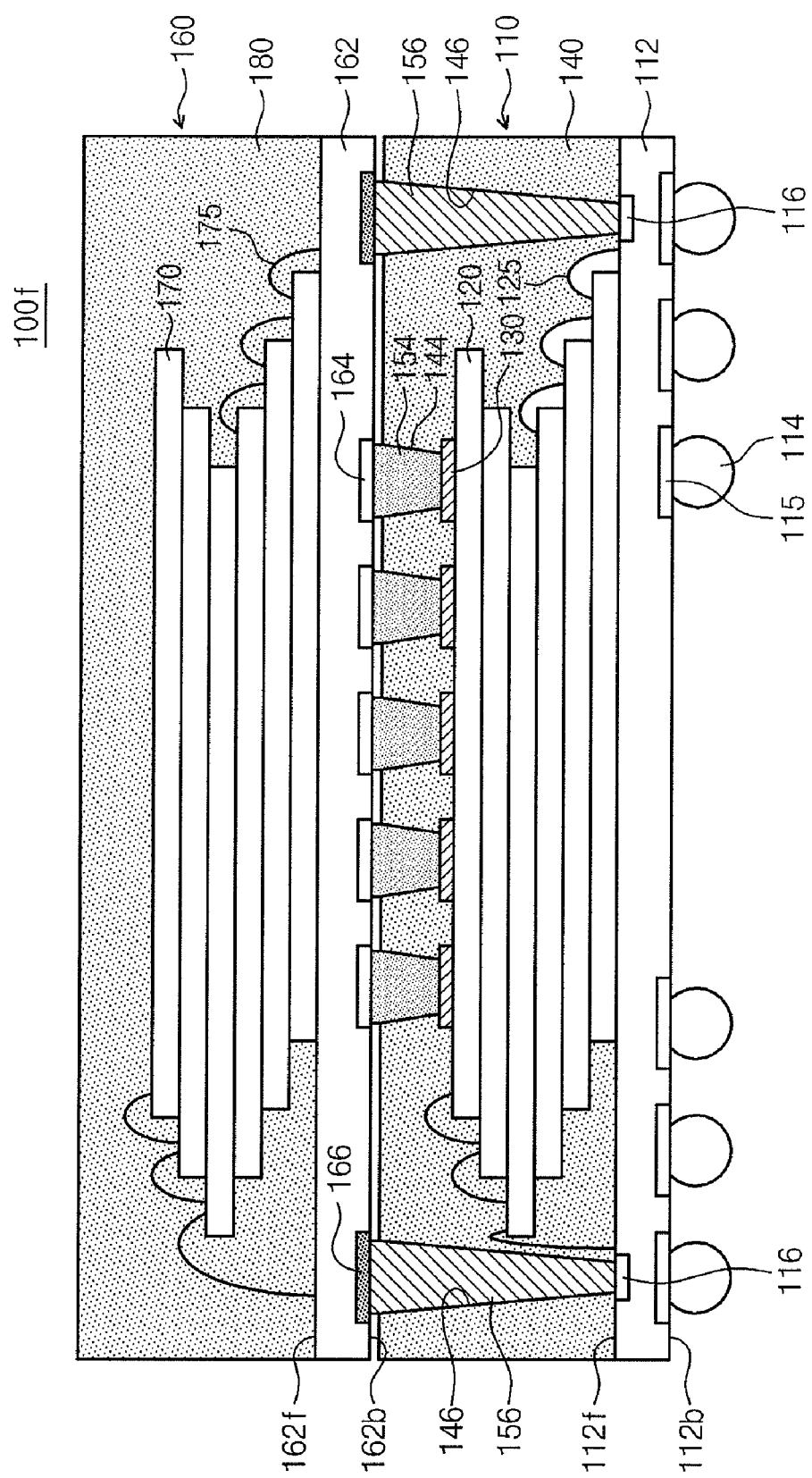

FIGS. 7A and 7B are sectional views illustrating a method for fabricating a semiconductor package according to a modified embodiment of the inventive concept.

Referring to FIG. 7A, a lower package 110 and an upper package 160 may be formed using processes equal or similar to those described with reference to FIGS. 2A to 2E. Unlike the above-described embodiment, dummy mold via holes 146 may be formed to expose a top surface 112f of a lower package substrate 112. Dummy pads 116 exposed by the dummy mold via holes 146 may be formed on the top surface 112f of the lower package substrate 112. For example, the dummy pads 116 may be formed of a conductive material such as a metal or a non-conductive material such as a resin. Fillers 157 may be provided in the dummy mold via holes 146. The fillers 157 may be formed of, for example, a conductive material such as a solder or metal particle or a non-conductive material such as a resin. When the dummy mold via holes 146 are formed using a laser drilling process, the dummy pads 156 may protect the substrate 112 against a laser.

Referring to FIG. 7B, the upper package 160 may be stacked on the lower package 110 using equal or similar to those described with reference to FIGS. 2F and 2G, and then, a reflow process may be performed to realize a POP type semiconductor package 100f. When the reflow process is performed, the solder balls 153 may be filled into the mold via holes 144 to form electrical interconnectors 154, and the dummy solder balls 155 may be filled into the dummy mold via holes 146 to form dummy interconnectors 156. When the reflow process is performed, the fillers 157 may be wetted to the dummy pads 116.

For example, dummy ball lands 166 may not be electrically connected to the upper semiconductor chip 170, and also, the dummy pads 116 may not be electrically connected to the lower semiconductor chip 120. In this case, even through the dummy solder balls 155 and the fillers 157 are formed of conductive materials, the dummy interconnectors 146 may only physically connect the lower package 110 to the upper package 160. For another example, the dummy ball lands 166 may be electrically connected to upper semiconductor chips 170, and the dummy pads 116 may be electrically connected to lower semiconductor chips 120. Also, the dummy solder balls 155 and the fillers 157 may be formed of conductive materials. In this case, the dummy interconnectors 146 may physically and electrically connect the lower package 110 to the upper package 160.

(Modified Example of Method for Fabricating Device)

Figure 8A:
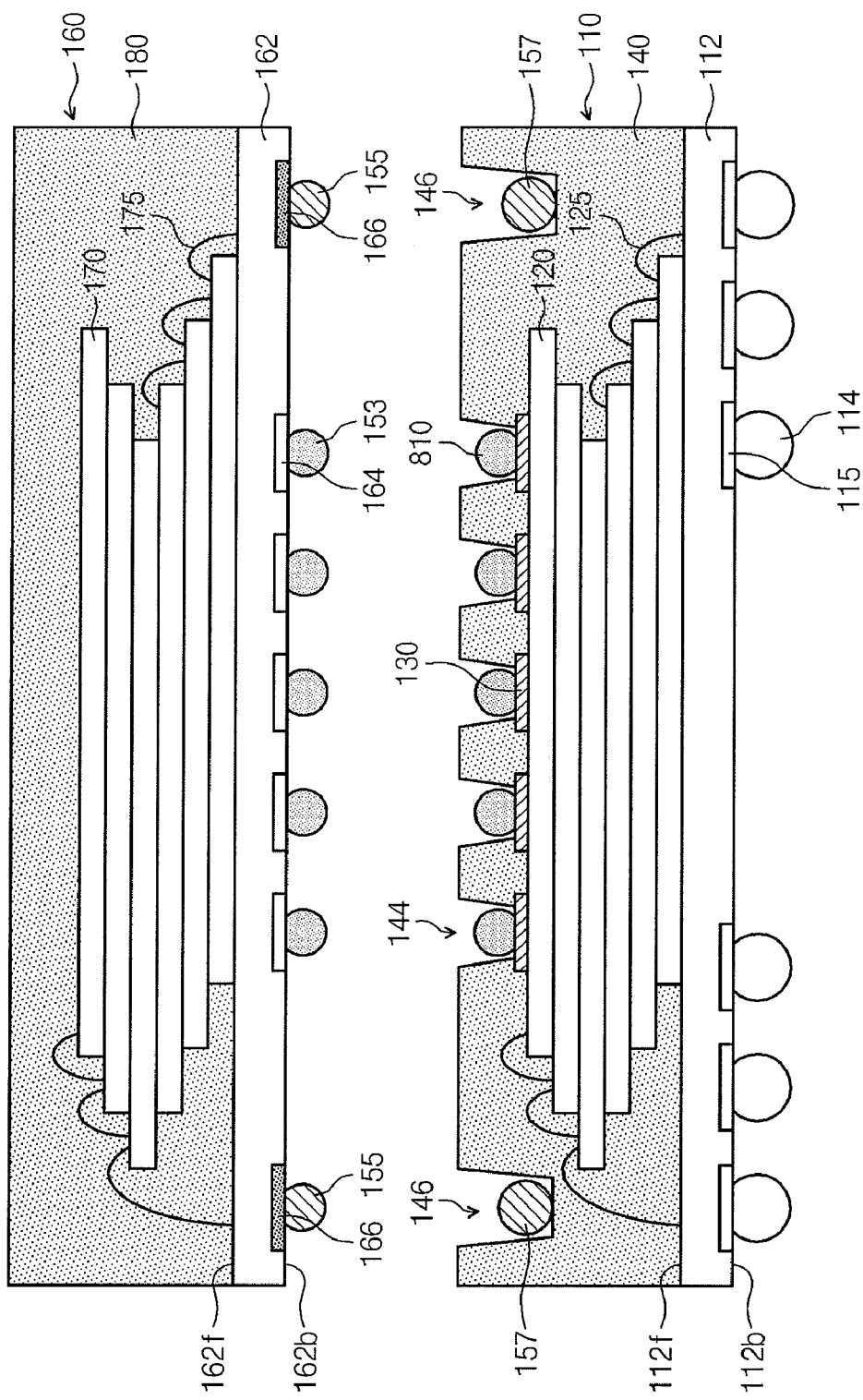
FIGS. 8A and 8B are sectional views illustrating a method for fabricating a semiconductor package according to a modified embodiment of the inventive concept.
Figure 8B:
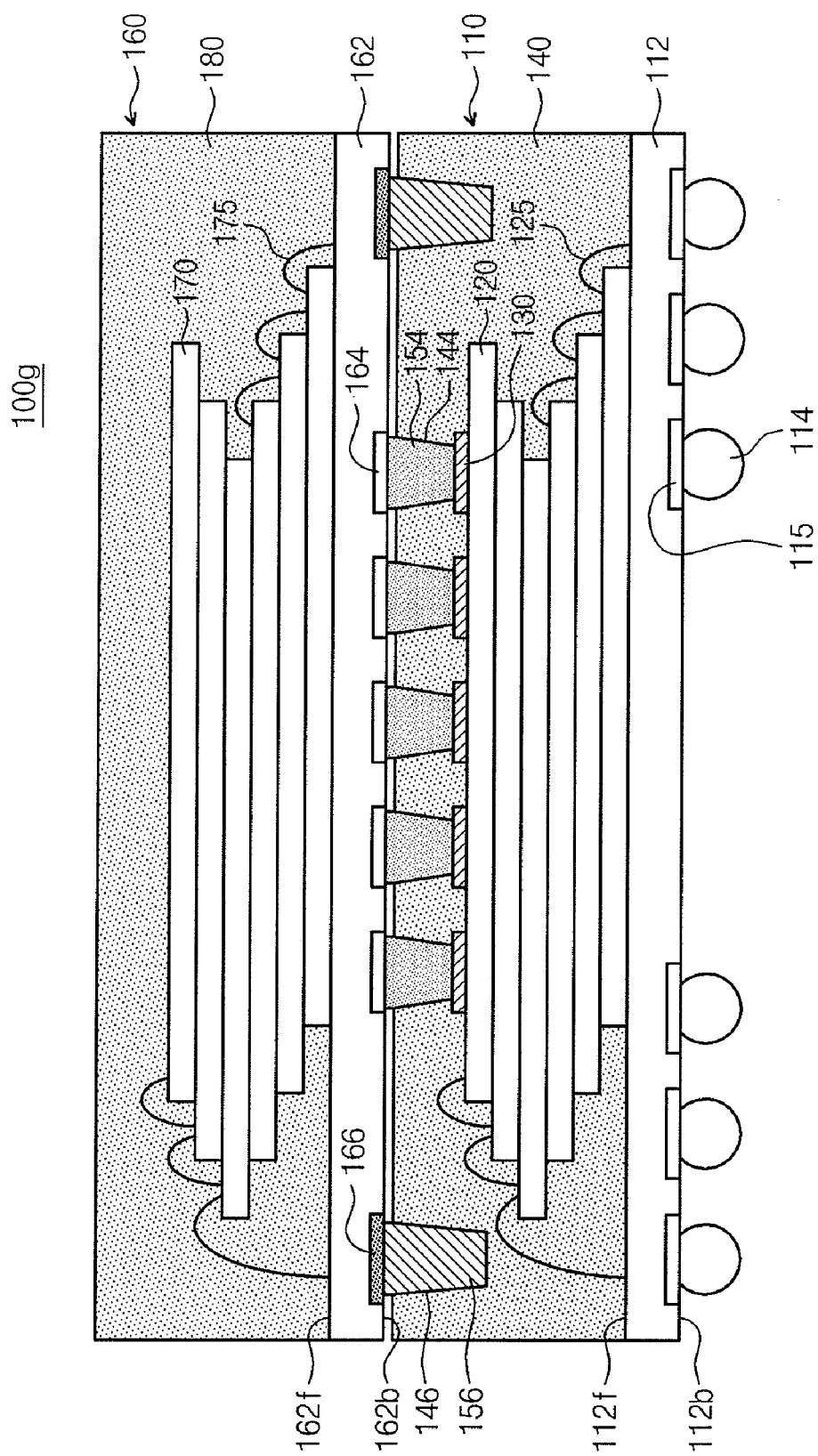

FIGS. 8A and 8B are sectional views illustrating a method for fabricating a semiconductor package according to a modified embodiment of the inventive concept.

Referring to FIG. 8A, a lower package 110 and an upper package 160 may be formed using processes equal or similar to those described with reference to FIGS. 2A to 2E. Since respective solder balls 153 have a small volume, mold via holes 144 may not be fully filled with the solder balls 153. Thus, fillers 810 may be provided in the mold via holes 144. The fillers 810 may be formed of a conductive material, e.g., a solder paste or metal particle.

Referring to FIG. 8B, the upper package 160 may be stacked on the lower package 110 using equal or similar to those described with reference to FIGS. 2F and 2G, and then, a reflow process may be performed to realize a POP type semiconductor package 100g. When the reflow process is performed, the solder balls 153 and the fillers 810 may be melted and filled into the mold via holes 144 to form electrical interconnectors 154, and the dummy solder balls 155 and the fillers 157 may be melted and filled into the dummy mold via holes 146 to form dummy interconnectors 156.

(Modified Example of Method for Fabricating Device)

Figure 9A:
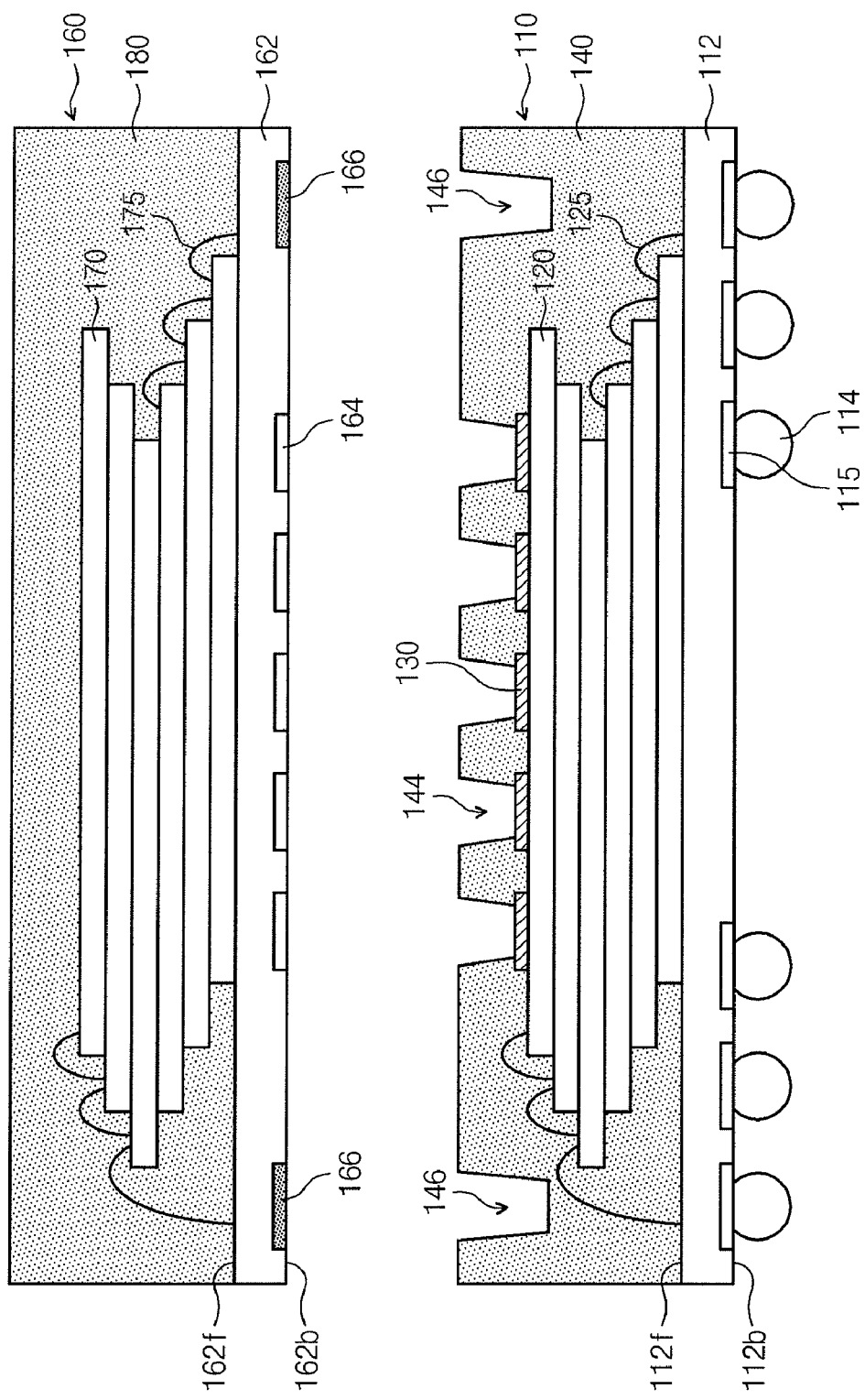
FIGS. 9A to 9C are sectional views illustrating a method for fabricating a semiconductor package according to a modified embodiment of the inventive concept.
Figure 9B:
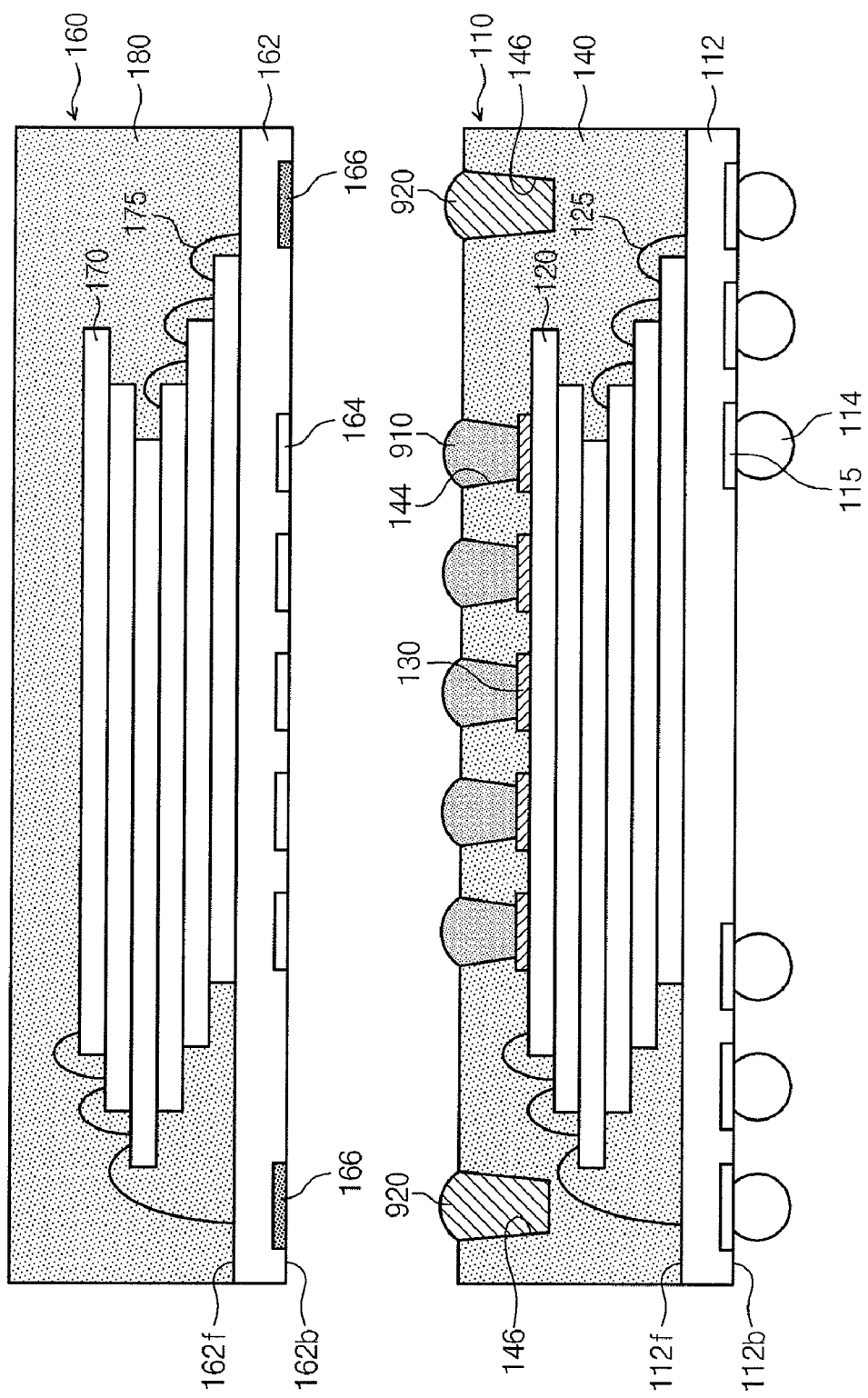

FIGS. 9A and 9B are sectional views illustrating a method for fabricating a semiconductor package according to a modified embodiment of the inventive concept.

Referring to FIG. 9A, a lower package 110 and an upper package 160 may be formed using processes equal or similar to those described with reference to FIGS. 2A to 2D. Unlike the above-described embodiment, solder balls and dummy solder balls may not be attached to a bottom surface 162b of an upper package substrate 162.

Referring to FIG. 9B, like the embodiment described with reference to FIG. 2E, fillers 910 formed of a conductive material such as, for example, a solder paste or metal particle may be provided in mold via holes 144. Simultaneously, fillers 920 formed of the conductive material or a non-conductive material such as, for example, a resin may be provided in dummy mold via holes 146. The mold via holes 144 may be fully or slightly overflowingly filled with the fillers 910. Similarly, the dummy mold via holes 146 may be fully or slightly overflowingly filled with the fillers 920.

Figure 9C:
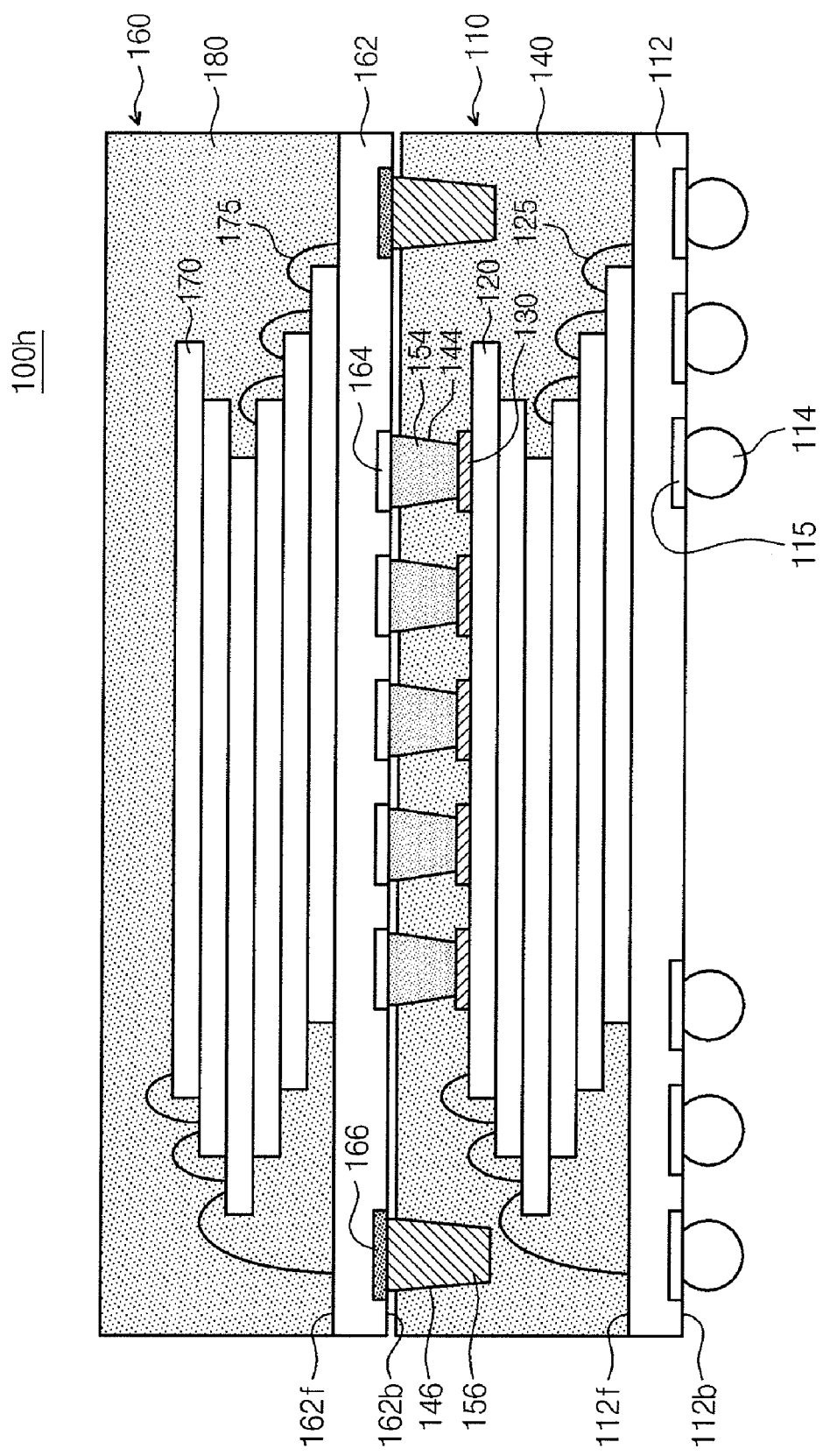

Referring to FIG. 9C, the upper package 160 may be stacked on the lower package 110 using equal or similar to those described with reference to FIGS. 2F and 2G, and then, a reflow process may be performed to realize a POP type semiconductor package 100h. When the reflow process is performed, the fillers 910 may be melted and filled into the mold via holes 144 to form electrical interconnectors 154, and the fillers 920 may be melted and filled into the dummy mold via holes 146 to form dummy interconnectors 156.

(Example of Modified Device)

Figure 10A:
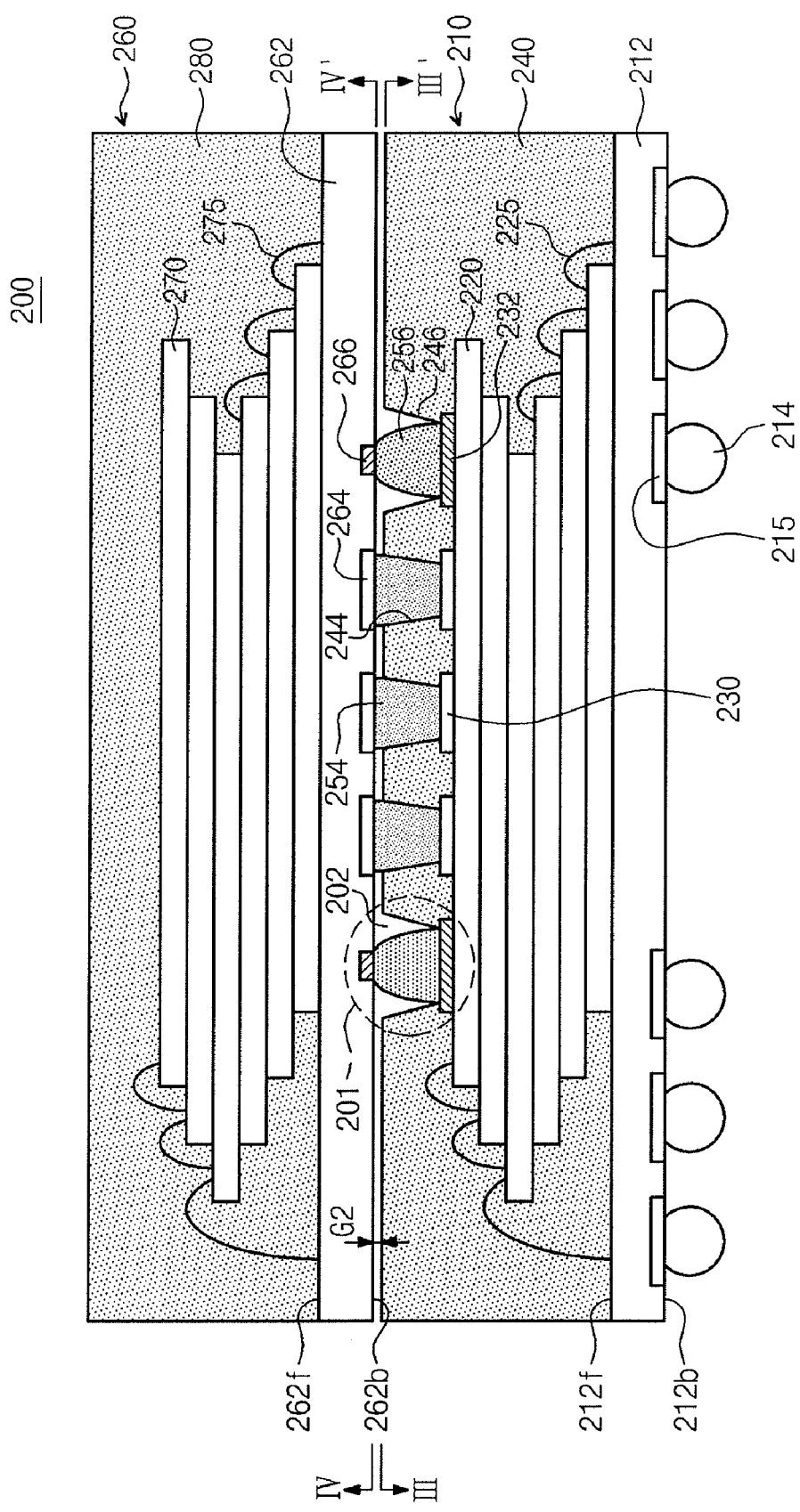
FIG. 10A is a sectional view of a semiconductor package according to a modified embodiment of inventive concept.
Figure 10B:
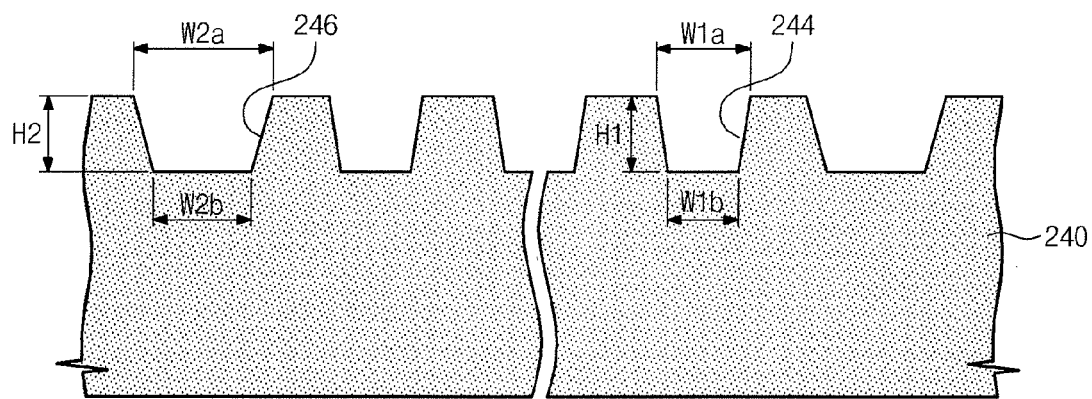
FIG. 10B is an enlarged sectional view illustrating a portion of FIG. 10A.
Figure 10C:
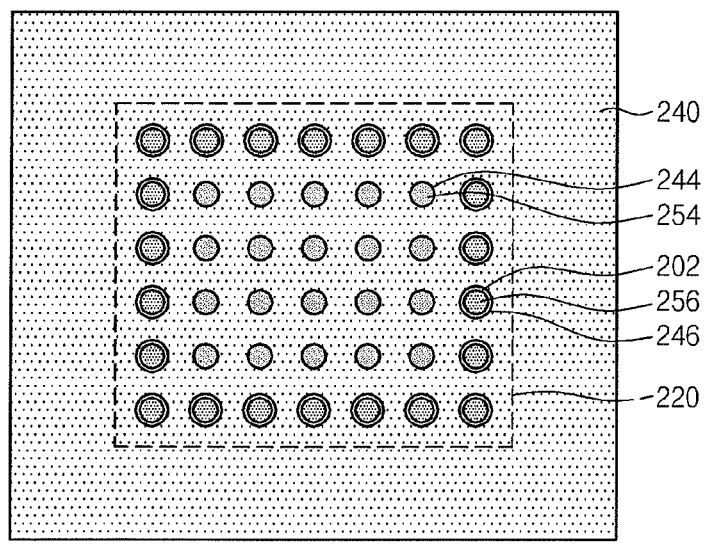
FIG. 10C is a plan view taken along line III-III' of FIG. 10A.
Figure 10D:
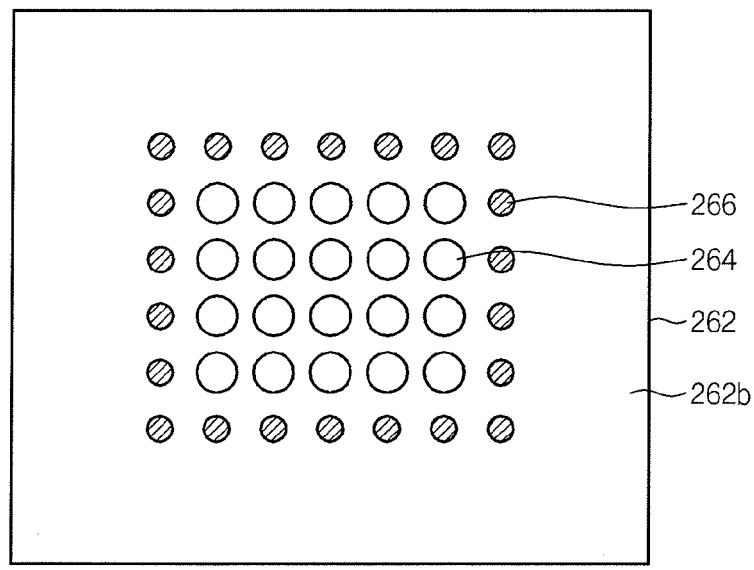
FIG. 10D is a plan view taken along line IV-IV' of FIG. 10A.

FIG. 10A is a sectional view of a semiconductor package according to a modified embodiment of inventive concept, and FIG. 10B is an enlarged sectional view illustrating a portion of FIG. 10A. FIG. 10C is a plan view taken along line III-III' of FIG. 10A, and FIG. 10D is a plan view taken along line IV-IV' of FIG. 10A.

Referring to FIG. 10A, a semiconductor package 200 of the modified embodiment may be a fan-in POP type package in which an upper package 260 is stacked on a lower package 210. The lower package 210 and the upper package 260 may be electrically and physically connected to each other by at least one electrical interconnector 254 and mechanically and physically connected to each other by at least one dummy interconnector 256. The lower package 210 and the upper package 260 may be spaced a predetermined distance from each other or closely attached to each other ($G2 \geq 0$).

At least one, e.g., a plurality of lower semiconductor chips 220 mounted on a top surface 212f of a lower package substrate 212 may be molded by a lower molding layer 240. The lower semiconductor chips 220 may be electrically connected to each other and/or to the lower package substrate 212 through bonding wires 225. For another example, the bonding wires 225 may be replaced with through-electrodes. A plurality of external terminals 214 connected to a plurality of ball lands 215 may be attached to a bottom surface 212b of a lower package substrate 212.

The uppermost lower semiconductor chip 220 may include a plurality of redistributions 230 connected to a plurality of electrical interconnectors 254. The redistributions 230 may be electrically connected to the bonding wires 225, and thus, electrically connected to the lower semiconductor chips 220 and/or the lower semiconductor substrate 212. The lower molding layer 240 may include a plurality of mold via holes 244 providing disposition spaces of the plurality of electrical interconnectors 254. In addition, the uppermost lower semiconductor chip 220 may further include a plurality of dummy redistributions 232 connected to a plurality of dummy interconnectors 256. The dummy redistributions 232 may not be electrically connected to the bonding wires 225. Even through the dummy redistributions 232 are electrically connected to the bonding wires 225, the dummy redistributions 232 may not participate in an electrical operation of the semiconductor package 200. The lower molding layer 240 may further include a plurality of dummy mold via holes 246 providing disposition spaces of the plurality of dummy interconnectors 256.

At least one, e.g., a plurality of upper semiconductor chips 270 mounted on a top surface 262f of the upper package substrate 262 may be molded by an upper molding layer 280. The upper semiconductor chips 260 may be electrically connected to each other and/or to the upper package substrate 262 through bonding wires 275 or its equivalent, e.g., through-electrodes. The upper package substrate 262 may include a plurality of ball lands 264 connected to a plurality of electrical interconnectors 254 on a bottom surface 262b thereof. The upper package substrate 262 may further include a plurality of dummy ball lands 266 connected to a plurality of dummy interconnectors 256 on the bottom surface 262b thereof.

Referring to FIG. 10B together with FIG. 10A, mold via holes 244 may have an upper width W1a greater than a lower width W1b (W1a>W1b), i.e., a taper shape. Similarly, dummy mold via holes 246 may have an upper width W2a greater than a lower width W2b (W2a>W2b), e.g., a taper shape. However, the mold via holes 244 and the dummy mold via holes 246 may have sizes different from each other. For example, the dummy mold via holes 246 may have the upper width W2a greater than the upper width W1a of the mold via holes 244 (W2a>W1a). The dummy mold via holes 246 may have the lower width W2b greater than (W2b>W1b), equal or nearly equal to (W2b=W1b), or less than (W2b<W1b) the lower width W1b of the mold via holes 244. The mold via holes 244 may have a height H1 equal to a height H2 of the dummy mold via holes 246 (H1=H2). When the dummy mold via holes 246 has a size greater than that of the mold via holes 244, an empty space 202 may be defined in the dummy mold via holes 246. For example, when the respective electrical interconnectors 254 and the respective dummy interconnectors 256 have the same volume or volumes nearly equal to each other, the mold via holes 244 may be fully or slightly overflowingly filled with the electrical interconnectors 254, and the dummy mold via holes 246 may not be fully filled with the dummy interconnectors 256 to provide the empty space 202.

Referring to FIG. 10C together with FIG. 10A, in the lower package 210, the mold via holes 244 may be disposed on a central portion of the uppermost lower semiconductor chip 220, and the dummy mold via holes 246 may be disposed on an edge portion of the uppermost lower semiconductor chip 220. For example, the dummy mold via holes 246 may be disposed on four lateral surfaces of the uppermost lower semiconductor chip 220 to surround the mold via holes 244. For another example, the dummy mold via holes 246 may be disposed on upper and lower or left and right lateral surfaces of the uppermost lower semiconductor chip 220. The electrical interconnectors 254 may be disposed depending on the disposition of the mold via holes 244. The dummy interconnectors 256 may be disposed depending on the disposition of the dummy mold via holes 246. The mold via holes 244 and the dummy mold via holes 246 may have sections having the taper shape illustrated in FIG. 10B and circular plans illustrated in FIG. 10C, but are not limited thereto.

Referring to FIG. 10D together with FIG. 10A, in the upper package 260, the ball lands 264 may be arranged on a central portion of the bottom surface 262b of the upper package substrate 262, and the dummy ball lands 266 may be arranged on positions more adjacent to the edge portion of the bottom surface 262b of the upper package substrate 262 when compared to the ball lands 264. Thus, the dummy ball lands 266 may surround the ball lands 264. For example, the dummy ball lands 266 may be arranged on the four lateral surfaces of the bottom surface 262b of the upper package substrate 262. For another example, the dummy ball lands 266 may be arranged on the upper and lower or left and right lateral surfaces. The ball lands 264 may be vertically aligned with the redistributions 230, and the dummy ball lands 266 may be vertically aligned with the dummy redistributions 232.

The ball lands 264 and the dummy ball lands 266 may have a circular plan, but is not limited thereto. The dummy ball lands 266 may have a size less than that of the ball lands 264. For example, when the ball lands 264 and the dummy ball lands 266 have circular shapes, the dummy ball lands 266 may have a diameter R1 less than a diameter R2 of the ball lands 264.

Figure 10E:
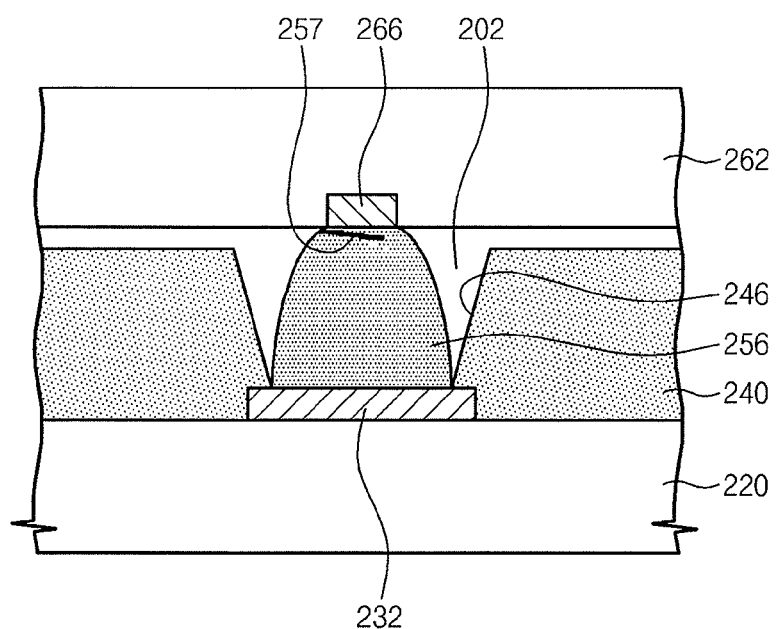
FIG. 10E is an enlarged sectional view illustrating a portion of FIG. 10A.

Referring to FIG. 10E together with FIG. 10A, the dummy interconnector 256 may have a trapezoid shape having a width gradually increasing from an upper portion, e.g., the upper package 260 toward a lower portion, e.g., the lower package 210. For example, the upper portion of the dummy interconnector 256 connected to the dummy ball lands 266 may have a relatively narrow width, and the lower portion of the dummy interconnector 256 connected to the dummy redistribution 232 may have a relatively wide width. Since such a dummy interconnector join structure 201 has a relative narrow width at an upper side, a stress may be concentrated into the upper side to relatively increase the crack occurrence probability. An empty space 202 of the dummy interconnector joint structure 201 may absorb somewhat the expansion of the dummy interconnector 256 due to heat.

For example, the heat stress due to the heat generated in the semiconductor chips 220 and 270 or a mechanical stress due to the external environment may be applied to the semiconductor package 200. In this case, defects (e.g., pattern lift) may be occur in a temperature cycling due to a thermal expansion coefficient (CTE) difference between the components of the semiconductor package 200, or the crack may occur at the edge portion of the semiconductor package 200 due to the mechanical stress. According to this embodiment, since the semiconductor package 200 include the dummy interconnector 256 at a portion adjacent to the edge portion at which the semiconductor package 200 is relatively easily damaged, the crack 257 due to the thermal and/or mechanical stress may firstly or dominantly occur at the dummy interconnector 256. Thus, the crack occurrence may be reduced at the electrical interconnector 254 as well as other portions to secure mechanical and/or thermal reliability of the semiconductor package 200.

(Example of Method for Fabricating Modified Device)

Figure 11A:
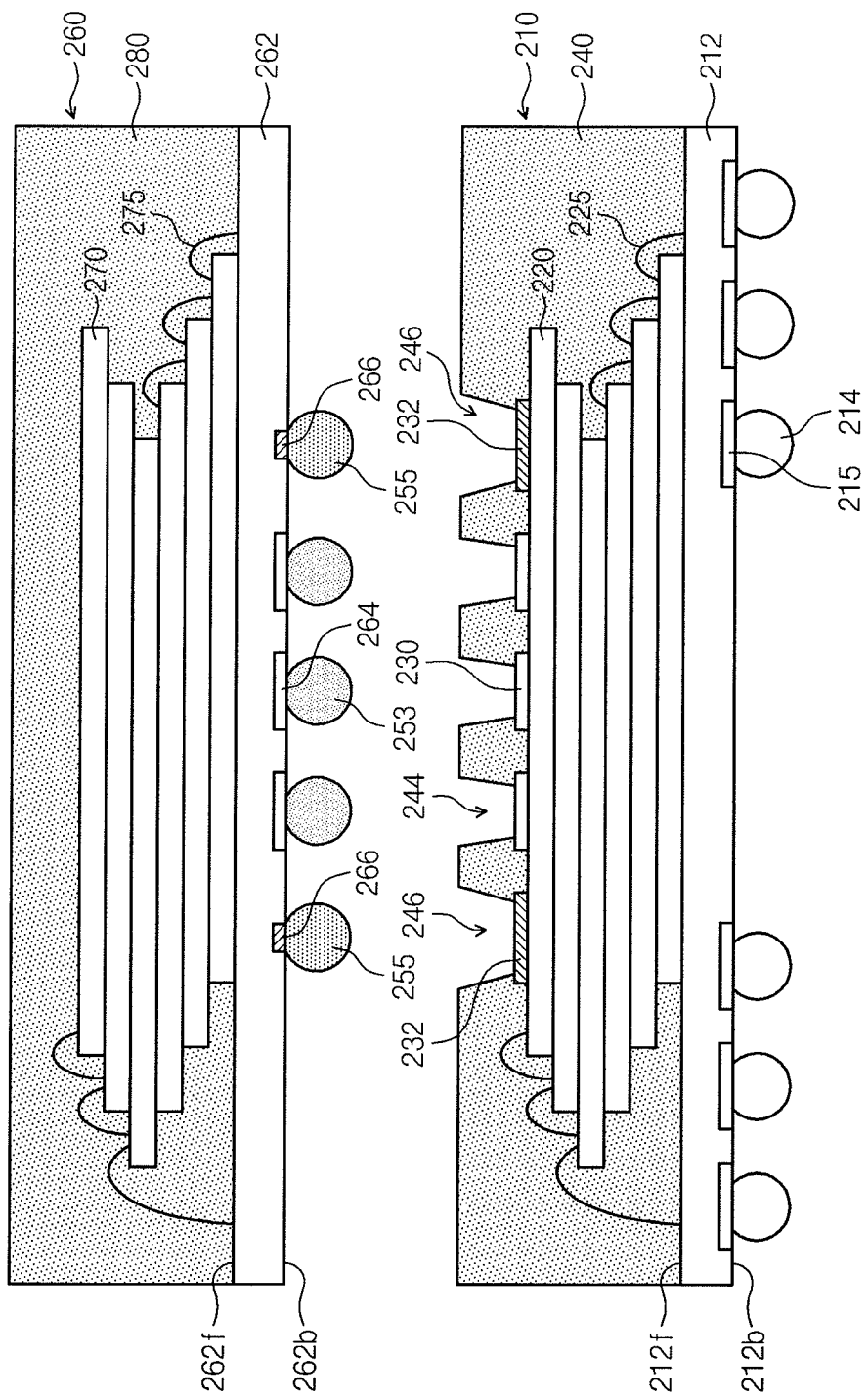
Figure 11B:
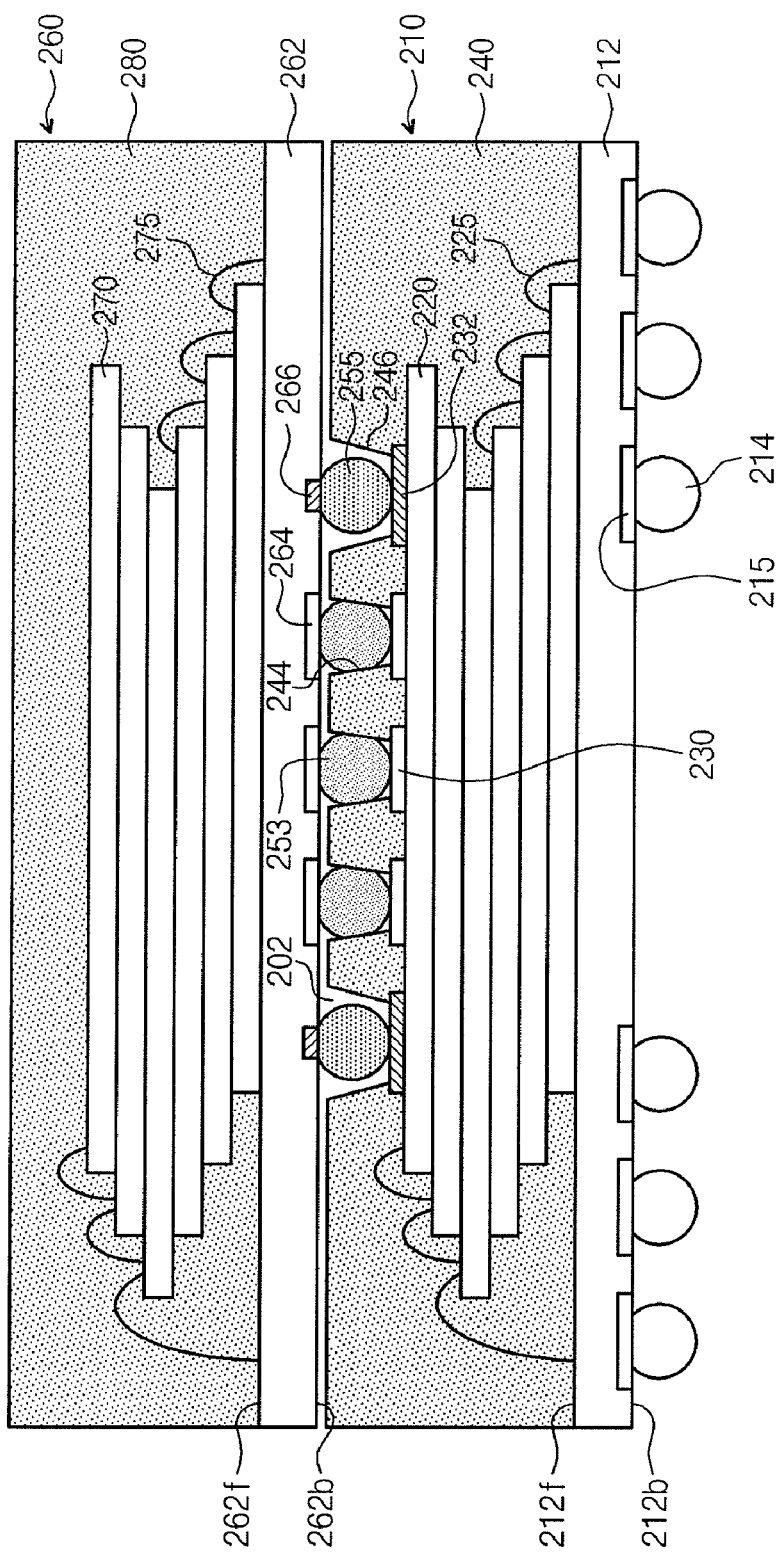

FIGS. 11A to 11C are sectional views illustrating a method for fabricating a semiconductor package according to a modified embodiment of the inventive concept.

Referring to FIG. 11A, a lower package 210 and an upper package 260 may be provided. The providing of the lower package 210 may include mounting a lower semiconductor chip 220 including a redistribution 230 and a dummy redistribution 232 on a lower package substrate 212 to form a lower molding layer 240 including mold via holes 244 and dummy mold via holes 246. The providing of the upper package 260 may include mounting an upper semiconductor chip 270 molded by an upper molding layer 280 on an upper package substrate 262 including ball lands 264 and dummy ball lands 266.

For example, in the lower package 210, a plurality of lower semiconductor chips 220 may be stacked on a top surface 212f of the lower package substrate 212 such as a PCB to form the lower molding layer 240 using an EMC. The lower semiconductor chips 220, and the lower semiconductor chips 220 and the lower package substrate 212 may be electrically connected to each other by bonding wires 225. For another example, through-electrodes may be replaced with the bonding wires 225.

The redistributions 230 and the dummy redistributions 232 may be formed on a top surface of the uppermost lower semiconductor chip 220. The formation of the redistributions 230 and the dummy redistributions 232 may be realized by one of depositing, patterning, and plating a conductor or by providing a redistribution substrate. The redistributions 230 may be formed on a central portion of the uppermost lower semiconductor chip 220, and the dummy redistributions 232 may be formed on an edge portion of the uppermost lower semiconductor chip 220.

A portion of the lower molding layer 240 may be removed using, for example, a laser drilling process, an etching process, or some available process to form mold via holes 244 opening the redistributions 230 and dummy mold via holes 246 opening the dummy redistributions 232. According to this embodiment, the dummy mold via holes 246 may have a size greater than that of the mold via holes 244. Selectively, a plurality of external terminals 124 may be attached to a plurality of ball lands 215 on a bottom surface 212b of the lower package substrate 212.

For example, in the upper package 260, a plurality of upper semiconductor chips 270 may be stacked on a top surface 262f of the upper package substrate 262 such as a PCB to form the upper molding layer 280 using an EMC. The upper semiconductor chips 270, and the upper semiconductor chips 270 and the upper package substrate 262 may be electrically connected to each other by bonding wires 275 or its equivalent, e.g., through-electrodes.

A plurality of ball lands 264 and a plurality of dummy ball lands 266 may be formed on a bottom surface 262b of the upper package substrate 262. The ball lands 264 may be disposed at positions vertically aligned with the redistributions 230, and the dummy ball lands 266 may be disposed at positions vertically aligned with the dummy redistributions 232. For example, the ball lands 264 may be formed at positions corresponding to the central portion of the uppermost lower semiconductor chip 220 on the bottom surface 262b of the upper package substrate 262. The dummy ball lands 266 may be disposed at positions corresponding to the edge portion of the uppermost lower semiconductor chip 220 on the bottom surface 262b of the upper package substrate 262. According to this embodiment, the dummy ball lands 266 may have a size less than that of the ball lands 264.

Terminals formed of a conductor, e.g., solder balls 253 may be attached to the ball lands 264, and dummy solder balls 255 may be attached to the dummy ball lands 266. The solder balls 253 may be melted and solidified to fully or slightly overflowingly fill the mold via holes 244, thereby having a volume realizing electrical connection between the lower package 210 and the upper package 260. The dummy solder balls 255 may have a volume equal or nearly equal to that of the solder balls 254.

Referring to FIG. 11B, at least one of the lower package 210 and the upper package 260 may be approached to the other one to couple the lower package 210 to the upper package 260. For example, the upper package 260 may be stacked on the lower package 210. Thus, the solder balls 253 may be inserted into the mold via holes 244, and the dummy solder balls 255 may be inserted into the dummy mold via holes 246. The reflow process may be performed to respectively expand the solder balls 253 and the dummy solder balls 255 into the mold via holes 244 and the dummy mold via holes 246. The solder balls 253 may be melted by the reflow process to fully or slightly overflowingly fill the mold via holes 244. On the other hand, the dummy solder balls 255 may be melted by the reflow process to fill a portion of the dummy mold via holes 246. This is done because the dummy mold via holes 246 have a size greater than that of the mold via holes 244, and the solder balls 253 and the dummy solder balls 255 each have volumes to fill the mold via hole 244.

Referring to FIG. 11C, the solder balls 253 may be formed as electrical interconnectors 254, and the dummy solder balls 255 may be formed as dummy interconnectors 256 by the previously described reflow process. Thus, a fan-in POP type semiconductor package 200 including the electrical interconnectors 254 electrically and physically connecting the upper and lower packages 210 and 260 to each other and the dummy interconnectors 256 physically connecting the upper and lower packages 210 and 260 to each other may be realized. As described with reference to FIG. 10D, the dummy interconnector 256 may have a trapezoid shape in which the crack due to the thermal and/or mechanical stress may firstly or dominantly occur.

(Another Example of Modified Device)

Figure 12A:
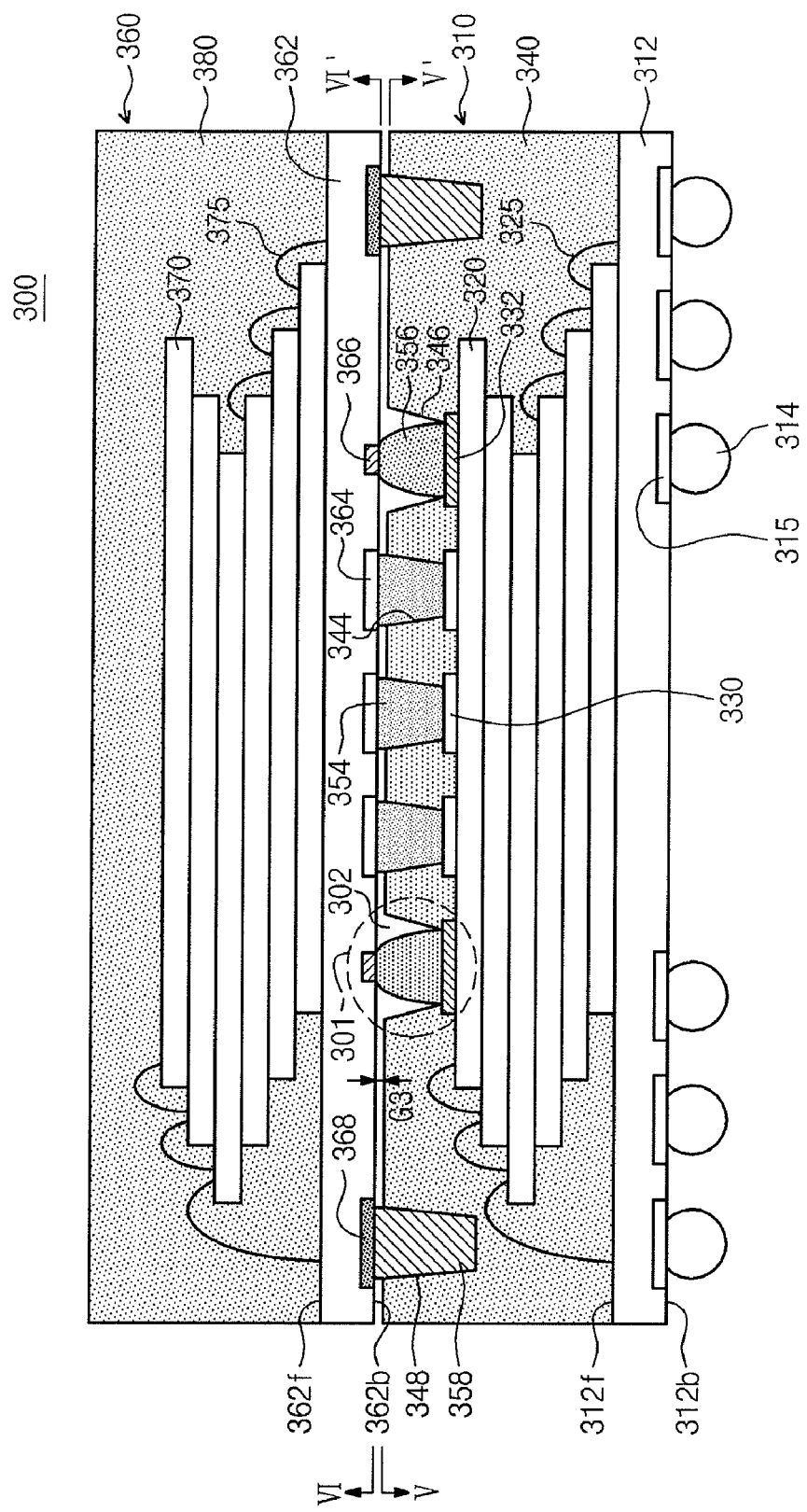
FIG. 12A is a sectional view of a semiconductor package according to a modified embodiment of inventive concept.
Figure 12B:
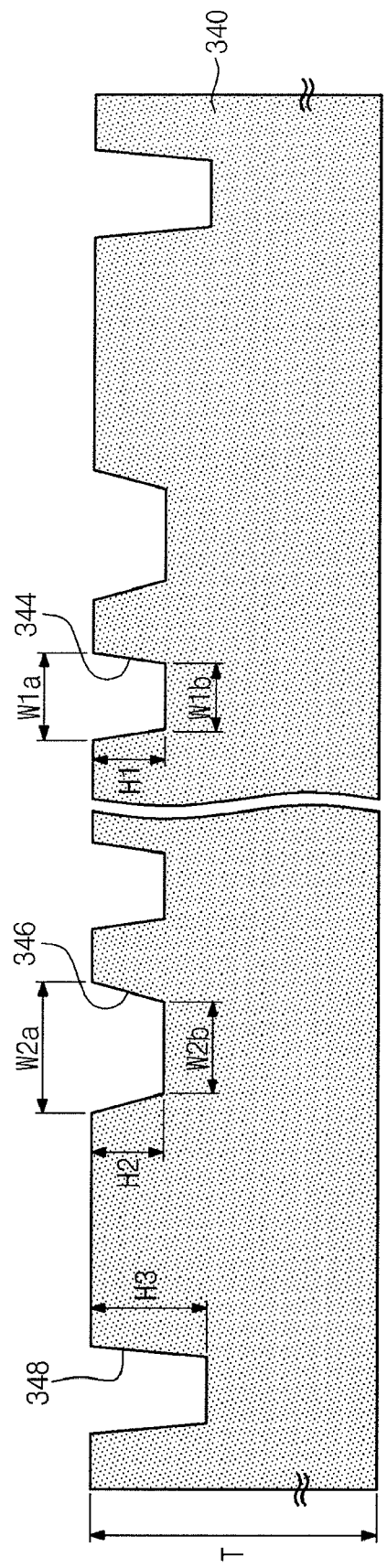
FIG. 12B is an enlarged sectional view illustrating a portion of FIG. 12A.
Figure 12C:
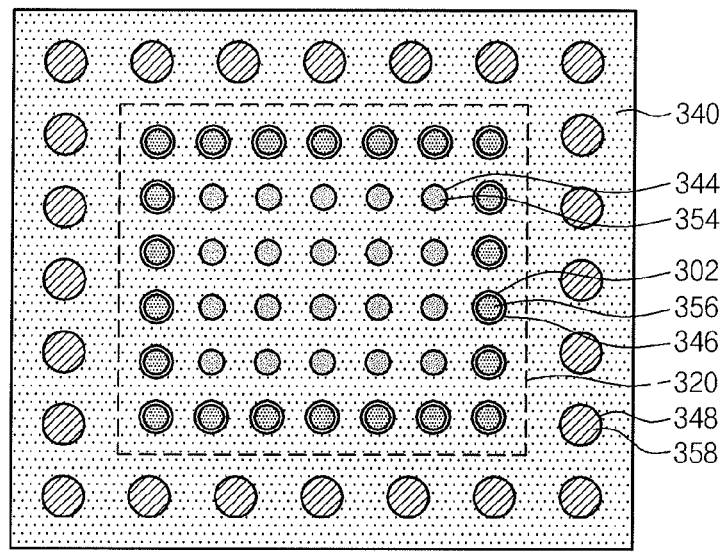
FIG. 12C is a plan view taken along line V-V' of FIG. 12A.
Figure 12D:
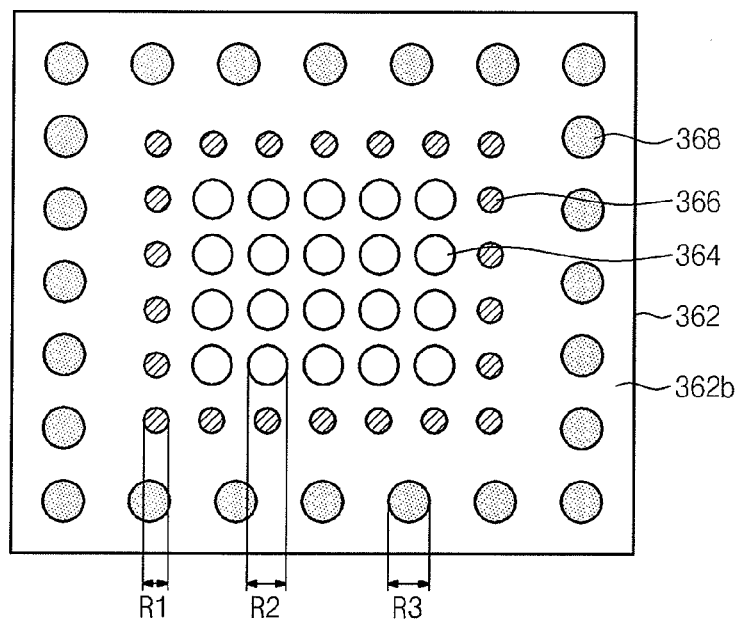
FIG. 12D is a plan view taken along line VI-VI' of FIG. 12A.

FIG. 12A is a sectional view of a semiconductor package according to a modified embodiment of inventive concept, and FIG. 12B is an enlarged sectional view illustrating a portion of FIG. 12A. FIG. 12C is a plan view taken along line V-V' of FIG. 12A, and FIG. 12D is a plan view taken along line VI-VI' of FIG. 12A.

Referring to FIG. 12A, a semiconductor package 300 of the modified embodiment may be a POP type package in which an upper package 360 is stacked on a lower package 310. The lower package 310 and the upper package 360 may be electrically and physically connected to each other by at least one electrical interconnector 354. Also, the lower package 310 and the upper package 360 may be physically connected to each other by at least one first dummy interconnector 356 and at least one second dummy interconnector 358. A distance G3 between the lower package 310 and the upper package 360 may be zero or greater than zero (G3≧0).

In the lower package 310, at least one, e.g., a plurality of lower semiconductor chips 320 may be mounted on a top surface 312f of a lower package substrate 312, and the lower semiconductor chips 320 may be molded by a lower molding layer 340. The lower semiconductor chips 320, and the lower semiconductor chips 320 and the lower package substrate 312 may be electrically connected to each other by bonding wires 325 or its equivalent, e.g., through-electrodes. A plurality of ball lands 315 may be disposed on a bottom surface 312b of the lower package substrate 312, and the ball lands 315 may be attached to a plurality of external terminals 314.

In the upper package 360, at least one, e.g., a plurality of upper semiconductor chips 370 molded by an upper molding layer 380 may be mounted on a top surface 362f of an upper package substrate 362. The upper semiconductor chips 370 and the upper package substrate 362 may be electrically connected to each other by bonding wires 375 or its equivalent, e.g., through-electrodes.

The description of FIG. 10A may be applicable to the electrical interconnector 354 and the first dummy interconnector 356. For example, a plurality of redistributions 330 may be disposed at a central portion on the uppermost lower semiconductor chip 320, and a plurality of dummy redistributions 332 may be disposed at an edge portion. The redistributions 330 may be electrically connected to the plurality of lower semiconductor chips 320 and/or the lower package substrate 312, and the dummy redistributions 332 may not be electrically connected to plurality of lower semiconductor chips 320 and/or the lower package substrate 312. A plurality of mold via holes 344 opening the plurality of redistributions 330 may be disposed on the lower molding layer 340, and a plurality of first dummy mold via holes 346 opening the plurality of dummy redistributions 332 may be disposed on the lower molding layer 340. A plurality of ball lands 364 may be disposed at positions vertically aligned with the redistributions 330 on a bottom surface 362b of the upper package substrate 362, and a plurality of dummy ball lands 366 may be disposed at positions vertically aligned with the dummy redistributions 332 on the bottom surface 362b of the upper package substrate 362. The ball lands 364 may be electrically connected to the plurality of upper semiconductor chips 370 and/or the upper package substrate 362, and the first dummy ball lands 366 may not be electrically connected to the plurality of upper semiconductor chips 370 and/or the upper package substrate 362. The plurality of mold via holes 344 may be filled with the electrical interconnector 354 electrically connecting the upper package 360 to the lower package 310, and the plurality of first dummy mold via holes 346 may be filled with the plurality of first dummy interconnectors 356 mechanically or physically connecting the upper package 360 to the lower package 310.

The description of FIG. 10E may be applicable to a joint structure 301 of the first dummy interconnector 356. For example, since the first dummy interconnector 356 has a shape similar to a trapezoid shape, a stress may be concentrated into an upper side of the first dummy interconnector 356 having a relative narrow width. Thus, when thermal and/or mechanical stress may be applied to the semiconductor package 300, the crack may dominantly occur at the upper side of the first dummy interconnector 356 to improve reliability.

The description of FIG. 1A may be applicable to the second dummy interconnector 358. For example, second dummy mold via holes 348 may be disposed at an edge portion of the lower molding layer 340. Also, second dummy ball lands 368 may be disposed at positions vertically aligned with the second dummy mold via holes 348 on the bottom surface 362b of the upper package substrate 362, e.g, an edge portion of the bottom surface 362b. The second dummy mold via holes 348 may be filled with the second dummy interconnectors 358 mechanically or physically connecting the upper package 360 to the lower package 310.

Referring to FIG. 12B together with FIG. 12A, the mold via holes 344 may have an upper width W1a equal to or greater than a lower width W1b (W1a≧W1b). According to this embodiment, the mold via holes 344 may have a taper shape having a relative large upper width (W1a≧W1b). The first dummy mold via holes 346 may have the same preceding configuration.

The first dummy mold via holes 346 may have a size greater than that of the mold via holes 344. For example, the first dummy mold via holes 346 may have an upper width W2a greater than a lower width W1a of the dummy mold via hole 344 (W2a>W1a). The first dummy mold via holes 346 may have the lower width W2b equal to (W2b=W1b), greater than (W2b>W1b), or less than (W2b<W1b) the lower width W1b of the mold via holes 344. The first dummy mold via holes 346 may have a height H1 equal to a height H2 of the mold via holes 344 (H2=H1).

The second dummy mold via holes 348 may have a configuration independent from those of the first dummy mold via holes 346 and the mold via holes 344. Thus, the second dummy mold via holes 348 may have a configuration equal or similar to that of the mold via holes 344 or the first dummy mold via holes 346. According to this embodiment, the second mold via holes 348 may have the same configuration as the mold via holes 344, e.g., a taper shape having a relatively wide upper portion and a relatively narrow lower portion. For another example, as shown in FIG. 1B, the second dummy mold via holes 348 may have a taper shape having a relatively narrow upper portion, an oval shape, or a shape having a relatively wide middle portion. The second dummy mold via holes 348 may have a depth greater than or equal to that of the mold via holes 344 in a range of a thickness T less than that of the lower molding layer 240 (H3≧H1). Alternatively, the second dummy mold via holes 348 may have the same thickness as the lower molding layer 240 (H3=T), e.g., as shown in FIG. 7B, the second dummy mold via hole 348 may pass through the lower molding layer 340 to extend up to the lower package substrate 312.

Referring to FIG. 12C together with FIG. 12A, in the lower package 310, the mold via holes 344 may be disposed at a central portion of the uppermost lower semiconductor chip 320, and the first dummy mold via holes 346 may be disposed at an edge portion of the uppermost lower semiconductor chip 320, e.g., four lateral surfaces to surround the mold via holes 344. The electrical interconnectors 354 may be disposed depending on the disposition of the mold via holes 344, and the first dummy interconnectors 356 may be disposed depending on the disposition of the first dummy mold via holes 346. An empty hole 302 that is not fully filled with the first dummy interconnectors 356 may exist in the first dummy mold via holes 346. The second dummy mold via holes 348 and the second dummy interconnectors 358 filled in the second dummy mold via holes 348 may be disposed at the edge portion of the lower molding layer 340, e.g., the four outer lateral surfaces of the uppermost lower semiconductor chip 320. The mold via holes 344 may have a section having the taper shape illustrated in FIG. 12B and a circular plan illustrated in FIG. 12C, but are not limited thereto. Also, the first and second dummy mold via holes 346 and 348 may have the same preceding configuration.

Referring to FIG. 12D together with FIG. 12A, in the upper package 360, the ball lands 364 may be arranged on a central potion of the bottom surface 362b of the upper package substrate 362, and the dummy ball lands 366 may be arranged on positions more adjacent to the edge portion of the bottom surface 312b of the lower package substrate 312 when compared to the ball lands 364. Thus, the dummy ball lands 366 may surround the ball lands 364. The second dummy ball lands 368 may be arranged on edge portions of the upper package 360. For example, the second dummy ball lands 360 may be arranged on four lateral bottom surfaces 362b of the upper package substrate 362. The ball lands 364 may have a circular plan, but is not limited thereto. The first and second ball lands 366 and 368 may have the same preceding configuration.

The first dummy ball lands 366 may have a size less than that of the ball lands 364. For example, when the ball lands 364 and the first dummy ball lands 366 have circular shapes, respectively, the dummy ball lands 366 may have a diameter R1 less than a diameter R2 of the ball lands 364 (R1<R2). Also, when the second dummy ball lands 368 have a circular shape, the second dummy ball lands 368 may have a diameter R3 equal or similar to that R2 of the ball lands 364. At least, the diameter R3 of the second dummy ball lands 368 may be greater than that R1 of the first dummy ball lands 366.

(Another Example of Modified Device)

Figure 12E:
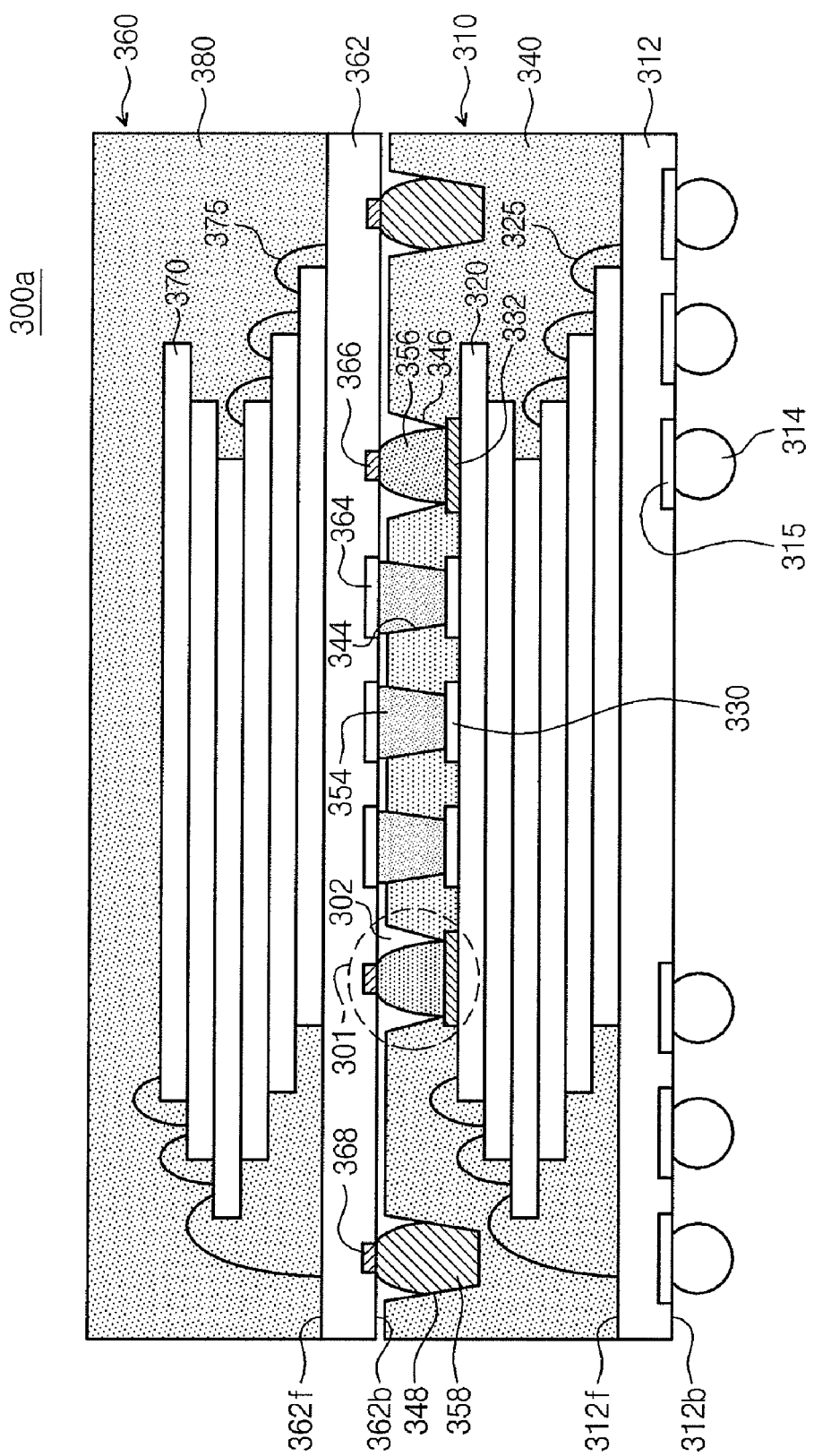
FIG. 12E is a sectional view illustrating a modified example of FIG. 12A.

FIG. 12E is a sectional view illustrating a modified example of FIG. 12A. Since this modified embodiment is equal or similar to that of the embodiment described with reference to FIG. 12A, only different points thereof will be described below, and similar features will be schematically described or omitted.

Referring to FIG. 12E, a semiconductor package 300a of this embodiment may be a POP type package in which a first dummy interconnector joint structure 301 is applied also to the second dummy interconnector 358. For example, respective first dummy ball lands 366 and respective second dummy ball lands 368 may have sizes less than that of respective ball lands 364. Also, respective first dummy mold via holes 346 and respective second dummy mold via holes 348 may have sizes greater than that of respective mold via holes 344. First dummy interconnectors 356 and the second dummy interconnectors 358 may have a trapezoid shape having a relatively narrow upper portion and a relatively wide lower portion.

When thermal and/or mechanical stress is applied to the semiconductor package 300a, warpage of the semiconductor package 300a may occur. In general, the package warpage may relatively excessively occur at an edge portion of the semiconductor package 300a. In this case, the stress may be concentrated into the second dummy interconnectors 358 or the first dummy interconnectors 356, particularly, upper portions of the second dummy interconnectors 358. Thus, a crack may firstly occur at the upper portions of the second dummy interconnectors 358, and simultaneously or later, the crack may occur at upper portions of the first dummy interconnectors 356. Thus, since the dummy interconnectors 356 and 358 absorb the stress applied by the crack occurrence, the crack occurrence at the electrical interconnectors 354 and other portions may be removed or minimized to secure reliability of the semiconductor package 300a.

(Example of Method for Fabricating Modified Device)

Figure 13A:
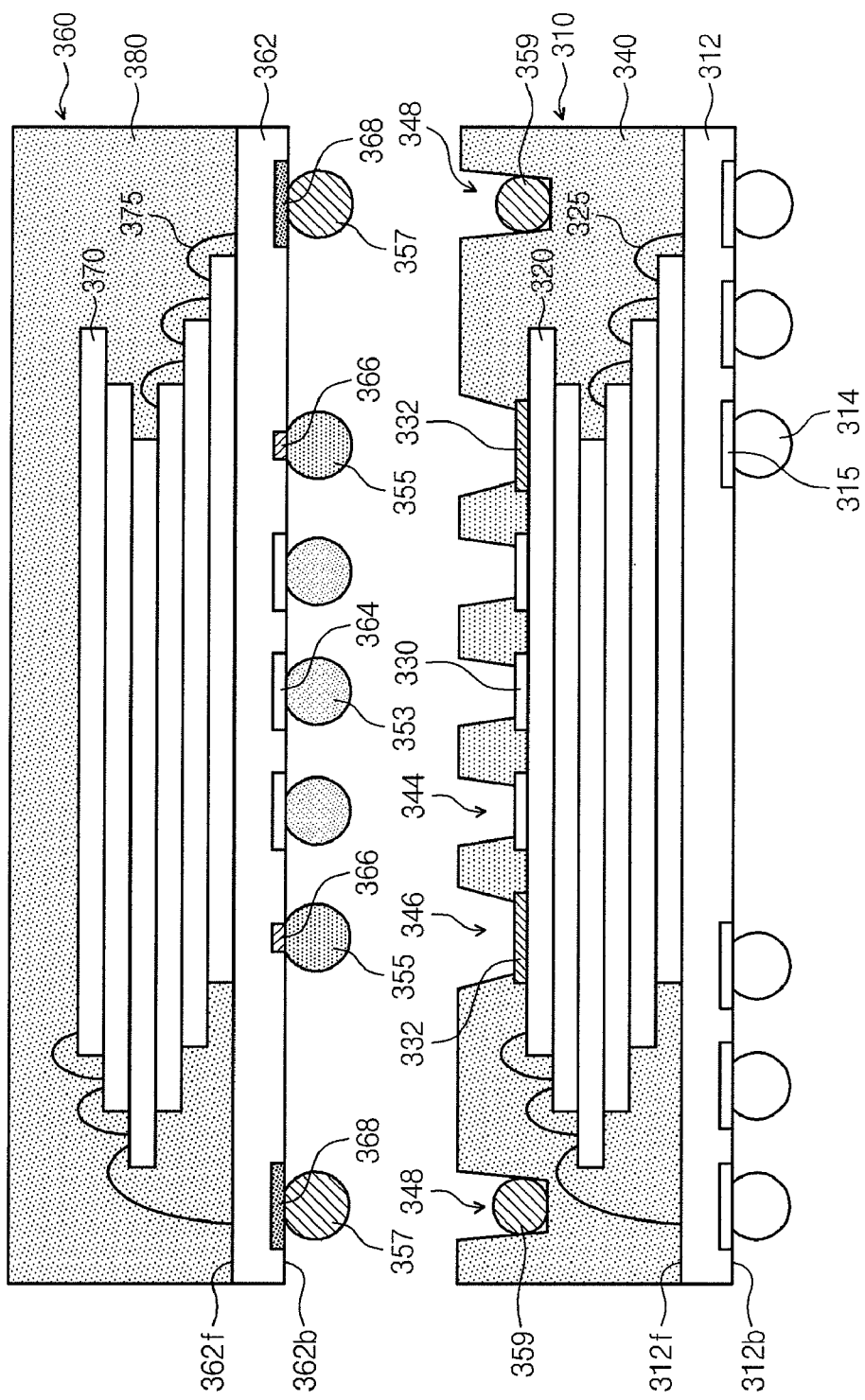
FIGS. 13A to 13C are sectional views illustrating a method for fabricating a semiconductor package according to a modified embodiment of the inventive concept.
Figure 13B:
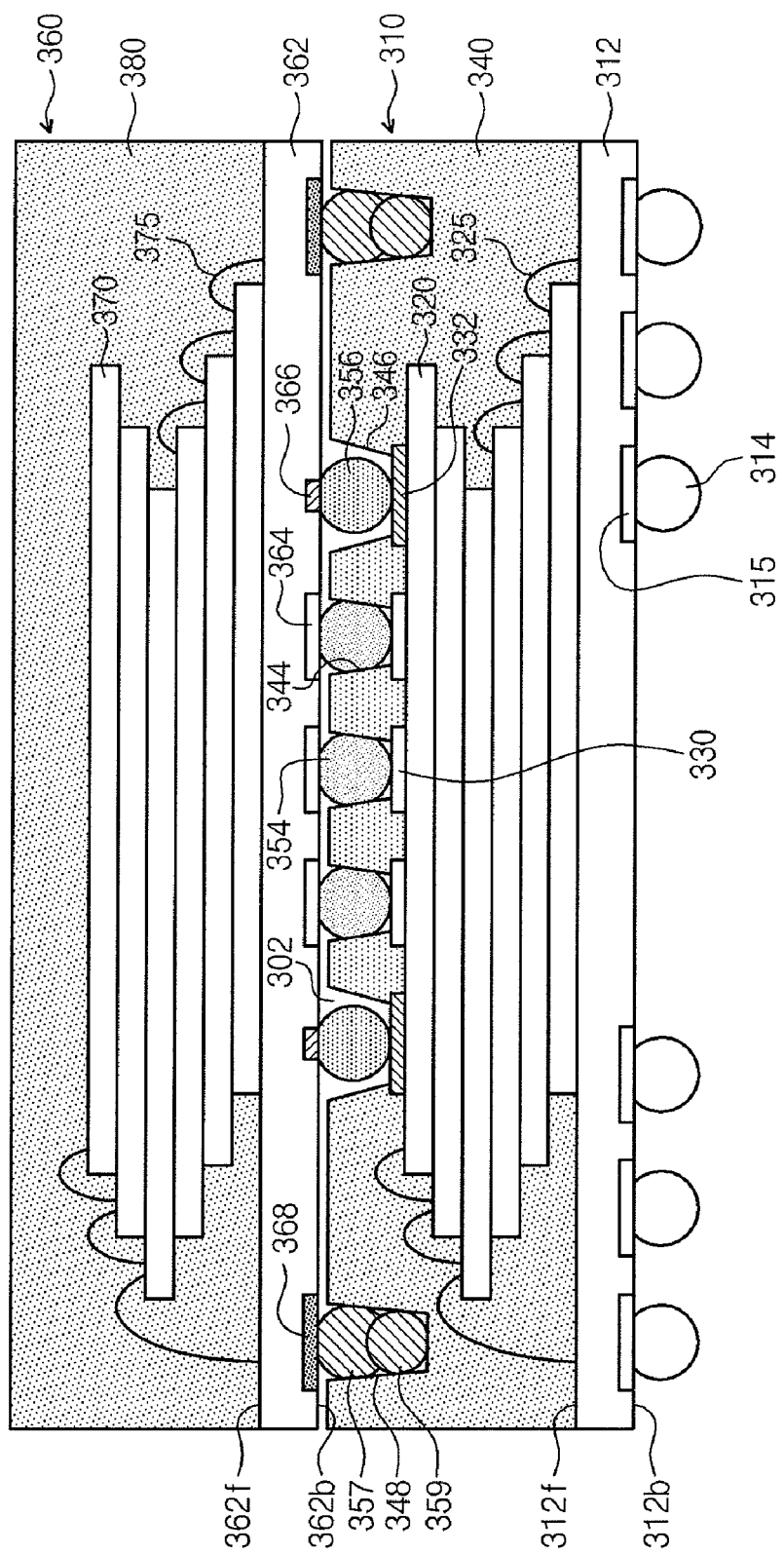
Figure 13C:
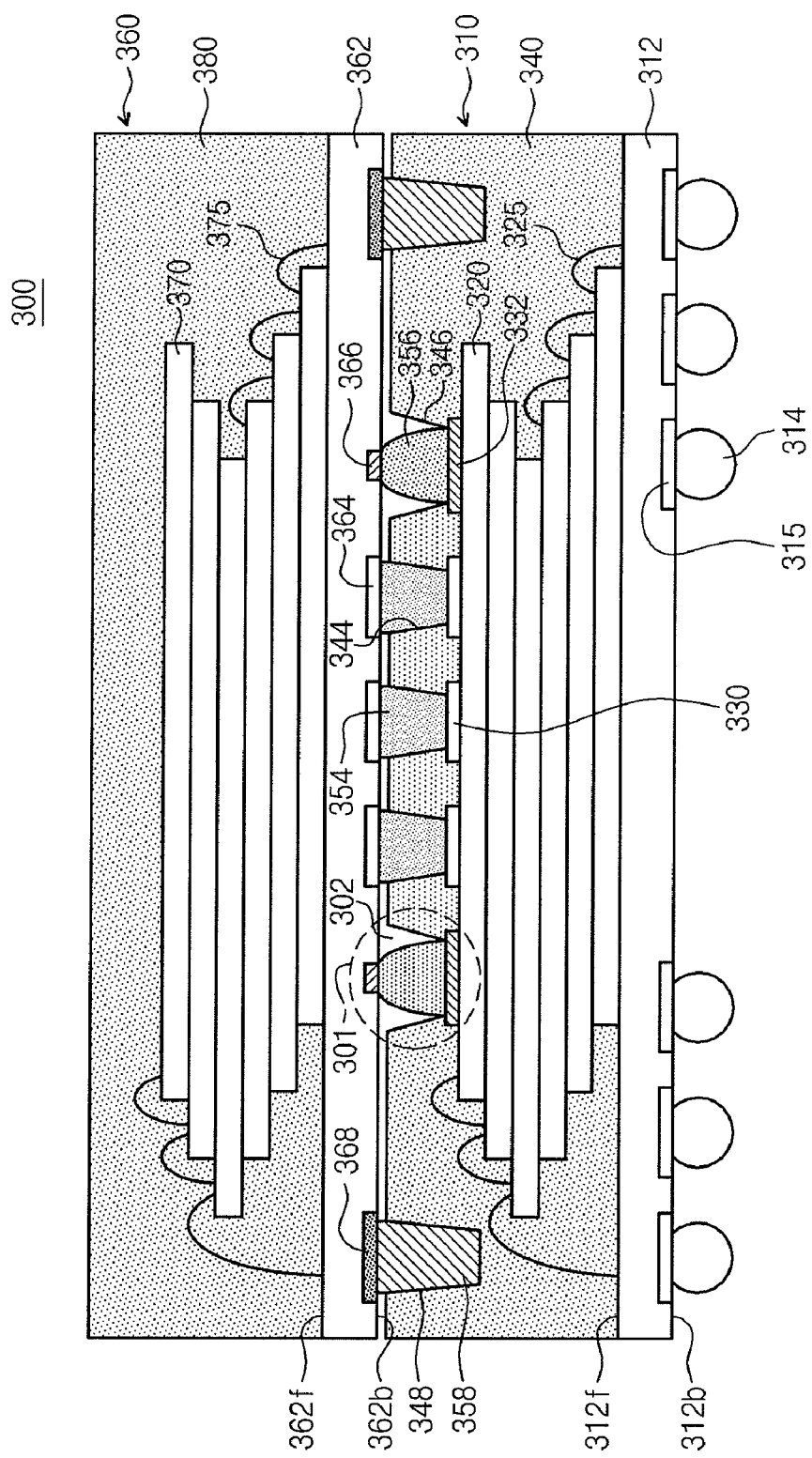

FIGS. 13A to 13C are sectional views illustrating a method for fabricating a semiconductor package according to a modified embodiment of the inventive concept.

Referring to FIG. 13A, a lower package 310 and an upper package 360 may be provided. For example, the lower package 310 and the upper package 360 may be provided using processes equal or similar to those described with reference to FIG. 11A.

For example, the providing of the lower package 310 may include forming a lower molding layer 340 molding lower semiconductor chips 320 on a top surface 312f of a lower package substrate 312 and performing a laser drilling process or etching process to remove a portion of the lower molding layer 340, thereby forming mold via holes 344, 346, and 348. Redistributions 330 may be disposed at a central portion of the uppermost lower semiconductor chip 330 of the lower semiconductor chips 320, and dummy redistributions 332 may be disposed at an edge portion. The mold via holes 344, 346, and 348 may include mold via holes 344 opening the redistributions 330, first dummy mold via holes 346 opening the dummy redistributions 332, and second dummy mold via holes 348 occupying the edge portion of the lower molding layer 340. As shown in FIG. 12B, the respective first mold via holes 346 may have a size greater than that of the respective mold via holes 344. The second mold via holes 348 may not extend up to the lower package substrate 312 as shown in FIG. 1B, or may extend up to the lower package substrate 312 as shown in FIG. 7A.

The providing of the upper package 360 may include forming ball lands 364, first dummy ball lands 366, and second dummy ball lands 368 on a bottom surface 362b of the upper package substrate 362. Solder balls 353 may be attached to the ball lands 364, first dummy solder balls 355 may be attached to the first dummy ball lands 366, and second dummy solder balls 357 may be attached to the second dummy ball lands 368. The ball lands 364 may be vertically aligned with the redistributions 330, the first dummy ball lands 366 may be vertically aligned with the dummy redistributions 332, and the second dummy ball lands 368 may be vertically aligned with the second dummy mold via holes 348. As shown in FIG. 12C, the respective first dummy ball lands 366 may have a size less than that of the respective ball lands 364. The solder balls 353 may have a volume in which the solder balls 353 are melted using a reflow process to fully fill the mold via holes 344. The first and second solder balls 355 and 357 may have the same volume as each other. For another example, a non-conductive material, e.g., a resin ball may be replaced with the second dummy solder balls 357.

When the second dummy mold via holes 348 have a size greater than a volume of the second dummy solder balls 357, a filler 359 may be provided in the second dummy mold via holes 348. The filler 359 may include, for example, a solder paste, a metal particle, or a resin. For another example, when the second dummy mold via holes 348 have a size equal or similar to a volume of the second dummy solder balls 357, the filler 359 may not be provided in the second dummy mold via holes 348.

Referring to FIG. 13B, one of the upper package 360 and the lower package 310 may be approached to the other one to couple the upper package 360 to the lower package 310, and then, the reflow process may be performed. Due to the coupling between the upper package 360 and the lower package 310, the solder balls 353 may be inserted into the mold via holes 344, the first dummy solder balls 355 may be inserted into the first dummy mold via holes 346, and the second dummy solder balls 357 may be inserted into the second dummy mold via holes 348. By performing the reflow process, the solder balls 353 may be melted to fill the mold via holes 344, the first dummy solder balls 353 may be melted to fill the first dummy mold via holes 346, and the second dummy solder balls 357 may be melted to fill the second dummy mold via holes 348. The melted solder balls 353 may fully fill the mold via holes 344. However, the melted first dummy solder balls 355 may fill portions of the first dummy mold via holes 346. When the fillers 359 are provided in the second dummy mold via holes 348, the melted second dummy solder balls 357 and the fillers 359 may fully fill the second dummy mold via holes 348.

Referring to FIG. 13C, when the above-described reflow process is finished, the solder balls 353 may be formed as electrical interconnectors 354, the first dummy solder balls 355 may be formed as first dummy interconnectors 356, and the second dummy solder balls 357 may be formed as second dummy interconnectors 358. Thus, there may be realized a POP type semiconductor package 300 including the electrical interconnectors 354 electrically connecting the upper and lower packages 310 and 360 to each other and the first and second dummy interconnectors 356 and 358 physically connecting the upper and lower packages 310 and 360 to each other. As described with reference to FIG. 12A, the first dummy interconnector 356 may have a trapezoid shape in which a crack may firstly occur due to thermal and/or mechanical stress.

The semiconductor package 300a illustrated in FIG. 12E may be fabricated using the processes equal or similar to those described with reference to FIGS. 13A to 13C. In this case, the second dummy interconnector 358 may have the trapezoid shape equal or similar to that of the first dummy interconnector 356.

(Application Example)

Figure 14A:
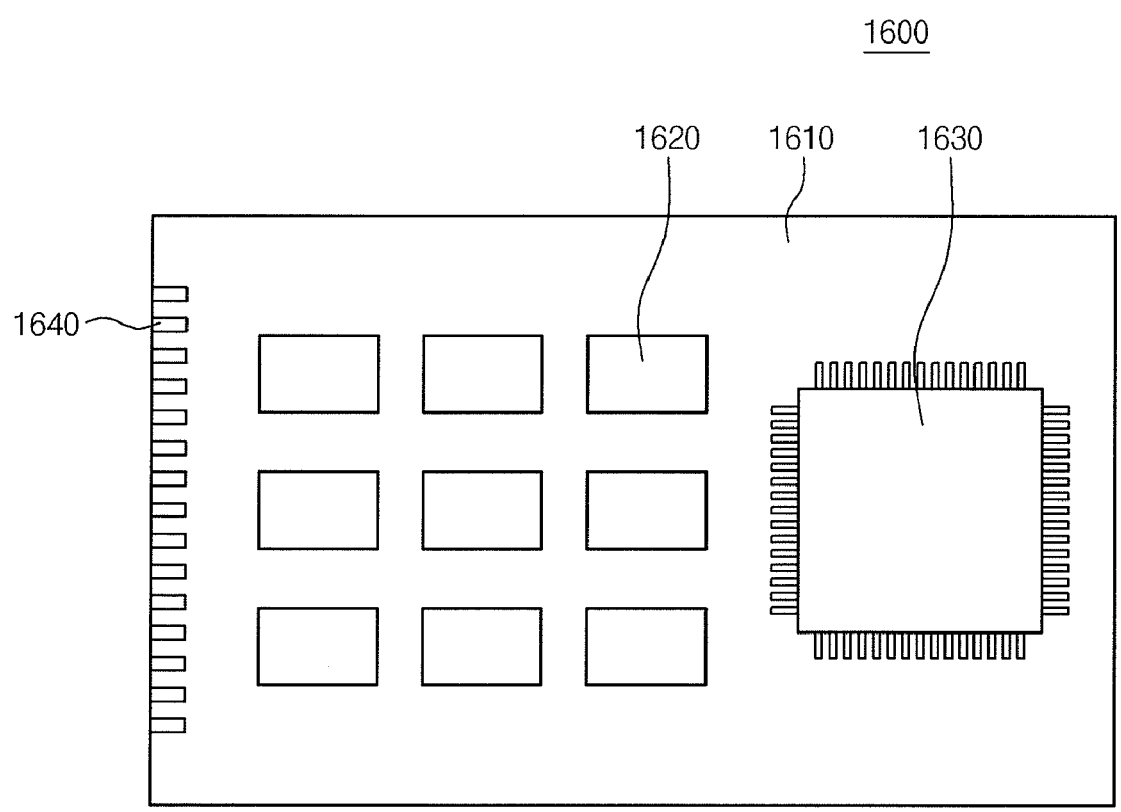
FIG. 14A is a plan view illustrating an application example of a semiconductor package according to an embodiment of the inventive concept.
Figure 14B:
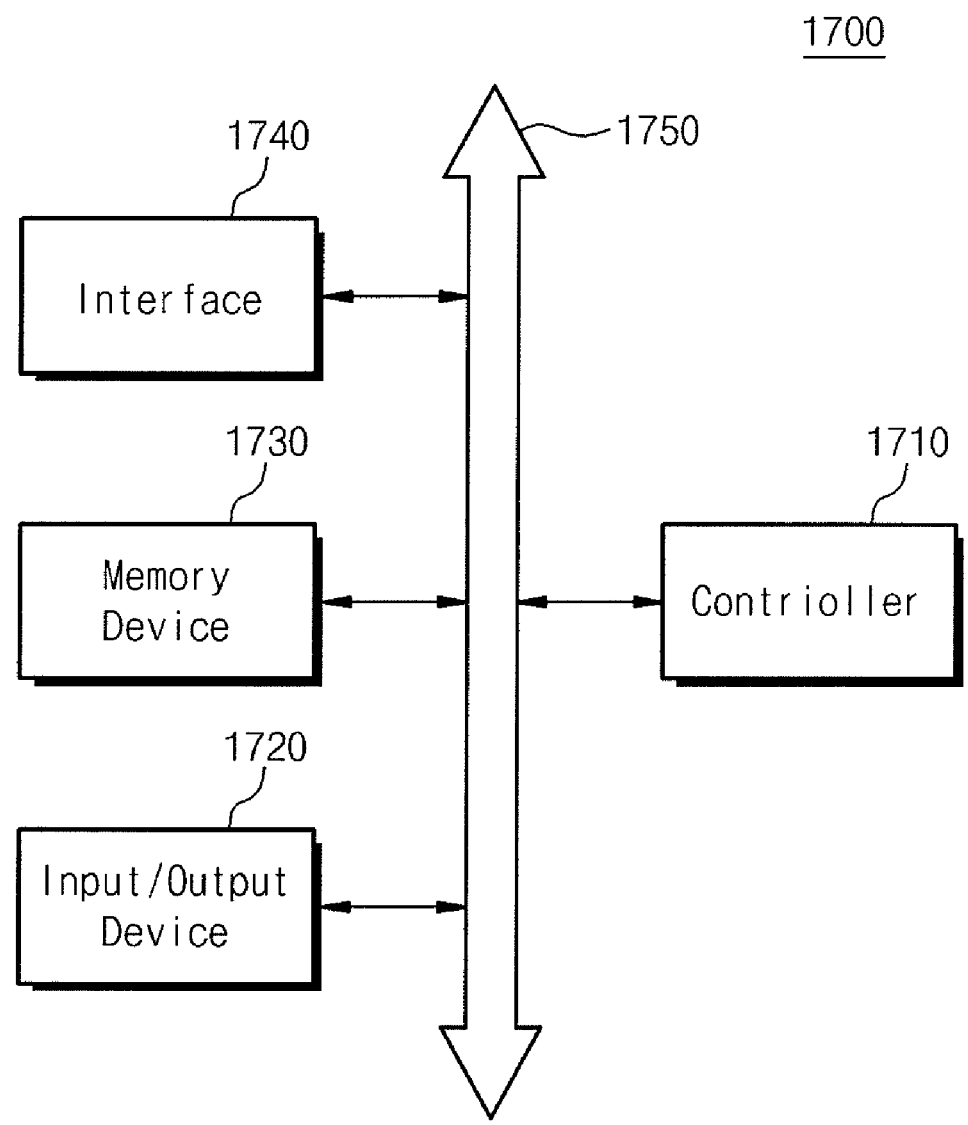
FIGS. 14B and 14C are block diagrams illustrating an application example of a semiconductor package according to an embodiment of the inventive concept.
Figure 14C:
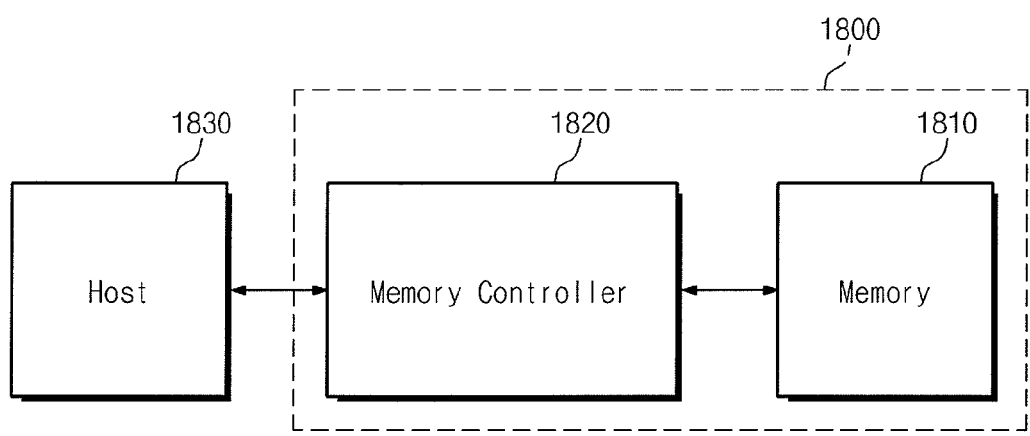

FIGS. 14A to 14C are views illustrating an application example of a semiconductor package according to the embodiments.

Referring to FIG. 14A, the above-described semiconductor packages may be applicable to a package module 1600 including various types of semiconductor devices. The package module 1600 may include a substrate 1610 including an external interconnection terminal 1640, a semiconductor chip 1620 mounted on the substrate 1610, and a quad flat packaged (QFP) semiconductor chip 1630. A package technology of the embodiments of the inventive concept may be applicable to the semiconductor chips 1620 and 1630. The package module 1600 may be connected to an external electronic system through the external interconnection terminal 1640.

Referring to FIG. 14B, the above-described semiconductor package may be applicable to an electronic system 1700. The electronic system 1700 may include a controller 1710, an input/output device 1720, and a memory device 1730. The controller 1710, the input/output device 1720, and the memory device 1730 may be coupled to each other through a bus 1750 providing a path through which data is transferred.

For example, the controller 1710 may include at least one microprocessor, digital signal processors, microcontrollers, and logic devices capable of performing similar functions thereto. The controller 1710 and the memory device 1730 may include at least one of the semiconductor packages according to the embodiments of the inventive concept. The input/output device 1720 may include at least one of a keypad, a keyboard, and a display device. The memory device 1730 may store data and/or commands executed by the controller 1710.

The memory device 1730 may include a volatile memory device and/or a nonvolatile memory device such as, for example, a flash memory. For example, the flash memory may be installed on an information processing system such as a mobile device or a desktop computer. The flash memory may constitute a solid state disk (SSD). In this case, the electronic system 1700 may stably store large-capacity data into the flash memory system.

The electronic system 1700 may further include an interface 1740 for transmitting data to a communication network or receiving date from the communication network. The interface 1740 may be a wire or wireless type. For example, the interface 1740 may include an antenna or a wire/wireless transceiver. The electronic system 1700 may further include an application chipset, a camera image processor (CIS), and an input/output device.

The electronic system 1700 may be implemented in, for example, mobile systems, personal computers, industrial computers, or systems that perform various functions. For example, examples of mobile systems may include personal digital assistants (PDA), portable computers, web tablets, mobile phones, wireless phones, laptop computers, memory cards, digital music systems, and data sending/receiving system. If the electronic system 1700 is equipment that can perform a wireless communication, the electronic system 1700 may be used in a communication interface protocol of a third-generation communication system such as, for example, Code Division Multiple Access (CDMA), Global System for Mobile Communications (GSM), North American Digital Cellular (NADC), Extended-Time Division Multiple Access (E-TDMA), and CDMA2000.

Referring to FIG. 14C, the above-described semiconductor packages may include a memory card 1800. The memory card 1800 includes a memory 1810 such as a nonvolatile memory device and a memory controller 1820. The memory device 1810 may store data or read the stored data. The memory 1810 may include at least one of the nonvolatile memory devices to which the semiconductor package technology according to the inventive concept is applied. The memory controller 1820 may read data stored in the memory 1810 or store data in the memory 1810 in response to a read/write request of a host 1830.

According to exemplary embodiments of the inventive concept, the electrical interconnector may be disposed at the central portion of the POP type semiconductor package, and the dummy interconnector may be disposed at the edge portion of the POP type semiconductor package without significantly changing a process flow. Thus, the mechanical and/or thermal solder junction reliability of the upper and lower packages constituting the POP type semiconductor package may be significantly improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor package comprising:
a lower package comprising a lower substrate, a lower semiconductor chip mounted on the lower substrate, a redistribution, and a molding layer molding the lower semiconductor chip;
an upper package comprising an upper substrate and an upper semiconductor chip mounted on the upper substrate, the upper package being stacked on the lower package;
an electrical interconnector extending from the upper substrate into the molding layer and connected to the redistribution to electrically connect the upper package and the lower package to each other; and
a dummy interconnector extending from the upper substrate into the molding layer to physically couple the upper package and the lower package to each other,
wherein the dummy interconnector comprises at least one of a first dummy interconnector extending toward the lower semiconductor chip; and a second dummy interconnector disposed further adjacent to an edge portion of the upper substrate when compared to the first dummy interconnector to extend toward the lower substrate in an outer region of the lower semiconductor chip,
wherein the redistribution comprises:
a first redistribution connected to the electrical interconnector and electrically connected to the lower substrate; and
a second redistribution connected to the first dummy interconnector and not electrically connected to the lower substrate, and wherein the molding layer comprises at least one of a mold via hole exposing the first redistribution to provide a disposition space for the electrical interconnector, a first dummy mold via hole exposing the second redistribution to provide a disposition space for the first dummy interconnector, and a second dummy mold via hole providing a disposition space of the second dummy interconnector,
wherein the first dummy mold via hole has an empty space which is not filled with the first dummy interconnector.

2. A semiconductor package comprising:
a lower package comprising a lower substrate, a lower semiconductor chip mounted on the lower substrate, a redistribution, and a molding layer molding the lower semiconductor chip;

an upper package comprising an upper substrate and an upper semiconductor chip mounted on the upper substrate, the upper package being stacked on the lower package;

an electrical interconnector extending from the upper substrate into the molding layer and connected to the redistribution to electrically connect the upper package and the lower package to each other; and a dummy interconnector extending from the upper substrate into the molding layer to physically couple the upper package and the lower package to each other, wherein the dummy interconnector comprises at least one of a first dummy interconnector extending toward the lower semiconductor chip; and a second dummy interconnector disposed further adjacent to an edge portion of the upper substrate when compared to the first dummy interconnector to extend toward the lower substrate in an outer region of the lower semiconductor chip and wherein the upper substrate comprises a ball land connected to the electrical interconnector on a center portion thereof; and the upper substrate comprises a first dummy ball land connected to the first dummy interconnector, the first dummy ball land having a size less than a size of the ball land on the edge portion thereof.

3. The semiconductor package of claim 2, wherein the first dummy interconnector has a sectional area gradually increasing from an upper side connected to the first ball land to a lower side opposite to the upper side.

4. The semiconductor package of claim 3, wherein the upper substrate further comprises a second dummy ball land connected to the second dummy interconnector and having a size equal to or less than a size of the ball land on the edge thereof.

5. The semiconductor package of claim 4, wherein the second dummy interconnector has a same sectional area from an upper portion of the upper substrate toward a lower portion of the lower substrate or a sectional area gradually changing from the upper portion of the upper substrate toward the lower portion of the lower substrate.

6. The semiconductor package of claim 1, wherein the electrical interconnector is disposed at a center portion of a bottom surface of the upper substrate, and the second dummy interconnector is disposed adjacent to the edge portion of the upper substrate when compared to the electrical interconnector.

7. The semiconductor package of claim 6, wherein the second dummy interconnector is disposed at an edge portion of the molding layer corresponding to the outer region of the lower semiconductor chip.

8. The semiconductor package of claim 2, wherein the electrical interconnector is disposed at a center portion of a bottom surface of the upper substrate, and the second dummy interconnector is disposed adjacent to the edge portion of the upper substrate when compared to the electrical interconnector.

9. The semiconductor package of claim 8, wherein the second dummy interconnector is disposed at an edge portion of the molding layer corresponding to the outer region of the lower semiconductor chip.

* * * * *